United States Patent [19]
Ono et al.

[11] Patent Number: 5,751,381
[45] Date of Patent: May 12, 1998

[54] ACTIVE MATRIX LCD DEVICE WITH IMAGE SIGNAL LINES HAVING A MULTILAYERED STRUCTURE

[75] Inventors: Kikuo Ono, Naka-machi; Kazuhiro Ogawa, Hitachi; Takashi Suzuki, Hitachi; Kouichi Anno, Hitachi; Hiroki Sakuta, Hitachi; Makoto Tsumura, Hitachi; Masaaki Kitajima, Hitachioota; Genshiro Kawachi, Hitachi, all of Japan

[73] Assignee: Hitachi, Ltd., Tokyo, Japan

[21] Appl. No.: 361,363

[22] Filed: Dec. 21, 1994

[30] Foreign Application Priority Data

Dec. 21, 1993 [JP] Japan .................. 5-321555

[51] Int. Cl.⁶ .................. G02F 1/136; G02F 1/1343; H01L 29/04; H01L 31/036
[52] U.S. Cl. .................. 349/42; 349/139; 257/59; 257/72
[58] Field of Search .................. 359/59, 57; 257/59, 257/72, 290, 291; 437/41; 349/42, 139

[56] References Cited

U.S. PATENT DOCUMENTS

| | | | |
|---|---|---|---|
| 4,723,838 | 2/1988 | Aoki et al. | 359/59 |
| 4,821,092 | 4/1989 | Noguchi | 359/59 |
| 4,954,855 | 9/1990 | Mimura et al. | 357/23.7 |
| 5,124,768 | 6/1992 | Mano et al. | 357/23.7 |
| 5,162,933 | 11/1992 | Kakuda et al. | 359/59 |
| 5,371,025 | 12/1994 | Sung | 437/41 |
| 5,467,882 | 11/1995 | Ahn | 216/23 |
| 5,493,129 | 2/1996 | Matsuzaki et al. | 257/61 |
| 5,498,573 | 3/1996 | Whetten | 257/59 |
| 5,545,576 | 8/1996 | Matsumoto et al. | 437/41 |

FOREIGN PATENT DOCUMENTS

| | | |
|---|---|---|
| 2-44318 | 2/1990 | Japan . |
| 3-72326 | 3/1991 | Japan . |
| 3-122620 | 5/1991 | Japan . |

*Primary Examiner*—William L. Sikes
*Assistant Examiner*—Toan Ton
*Attorney, Agent, or Firm*—Antonelli, Terry, Stout, & Kraus, LLP

[57] ABSTRACT

A liquid crystal display device and a manufacturing method therefor are provided where the number of processes for manufacturing TFT substrates can be decreased and a high production yield can be attained. To attain these objects, an image signal bus-line includes at least a transparent conductive film and a semiconductor layer. A pattern of the transparent conductive film extends up to a thin film transistor to form its drain electrode, and a pattern of a semiconductor layer extends up to the transistor to form its source electrode. By virtue of these arrangements, the thin film transistor substrate can be manufactured using as little as three or four photolithography processes.

17 Claims, 33 Drawing Sheets

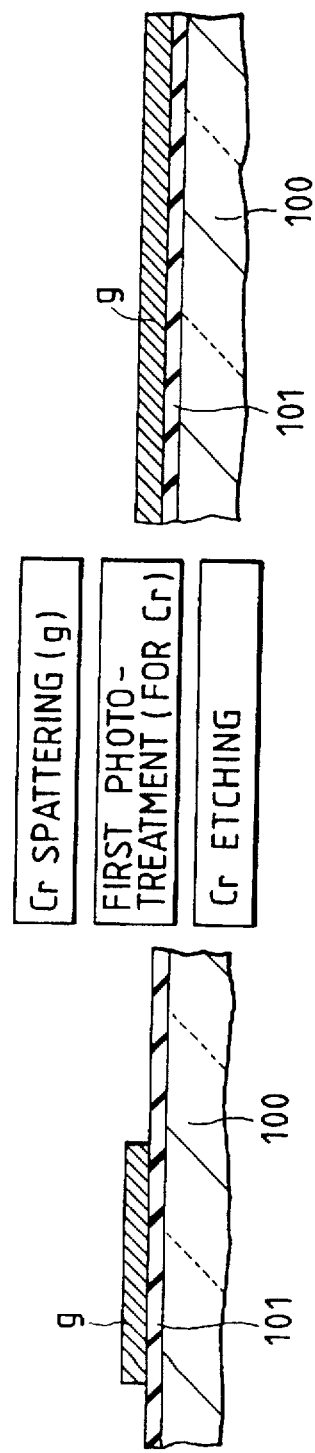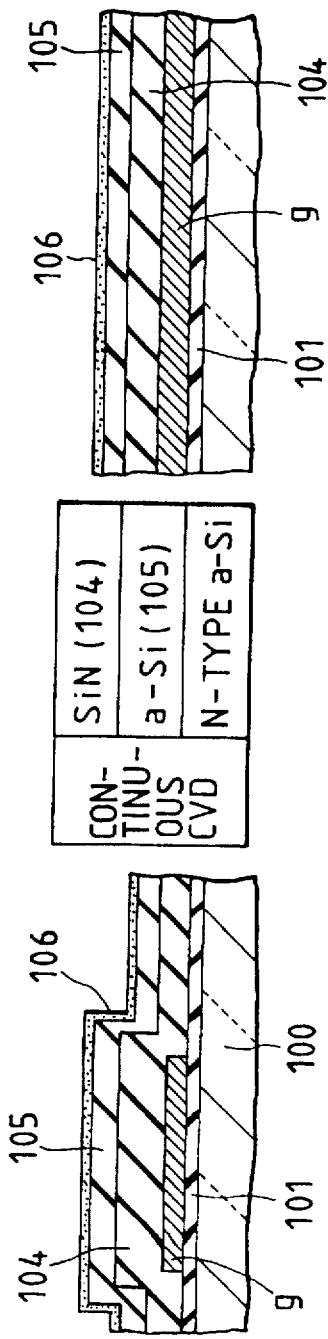
FIG. 12
FIG. 13

1

ACTIVE MATRIX LCD DEVICE WITH IMAGE SIGNAL LINES HAVING A MULTILAYERED STRUCTURE

BACKGROUND OF THE INVENTION

The present invention relates to a liquid-crystal display device of active matrix driving type utilizing thin film transistors (hereinafter referred to as "TFT") and a manufacturing method therefor.

The liquid crystal display device of active matrix type is a display device in which a switching element is provided in each of plural pixel electrodes arrayed on a display panel in matrix-shape. The liquid crystal display device of active matrix type is capable of displaying images with better contrast than a liquid-crystal display device of simple matrix type employing a time sharing driving method, and the active matrix driving method is an indispensable technique for color display.

A conventional liquid crystal display device of active matrix type comprises a first insulator substrate (TFT substrate) having on one side of the surfaces a plurality of scanning signal bus-lines spaced at a given distance extending in a first direction, a plurality of image signal bus-lines spaced at a given distance extending in a second direction intersecting with the scanning signal bus-lines, TFT's placed near the intersecting points of the scanning signal bus-lines and the image signal bus-lines, their gate electrodes being connected to the scanning bus-lines, their drain (or source) electrodes being connected to the image signal bus-lines, pixel electrodes each connected to the source (or drain) electrode of a TFT placed in each of the areas determined by the adjacent two scanning signal bus-lines and the adjacent two image signal bus-lines, a second insulator substrate (counter substrate) having counter electrodes formed on one side of the surface placed so as to face the counter electrodes to the pixel electrodes, and a liquid-crystal layer interposed between the first insulator substrate and the second insulator substrate.

A large problem to be solved in order to realize a liquid-crystal display device of active matrix type is to decrease its manufacturing cost, and more particularly to decrease the manufacturing cost of the TFT substrate. A method concerning this problem is described in Japanese Patent Application Laid-Open No. 62-32651 (1987) where the number of photo-lithography processes is decreased by forming the semiconductor layer and the gate insulating film using the same pattern at a time However, in the method described in Japanese Patent Application Laid-Open No. 62-32651 (1987), the semiconductor layer and the gate insulating film are patterned in island-shape in the same shape on the portion of the thin film transistor. Therefore, when the drain electrode or the source electrode is not formed in a normal pattern, it increases the probability of the occurrence of wiring faults where both electrodes and the gate electrode short-circuit along the side surface of island-shaped pattern.

Further, since in the intersecting point portion of the scanning signal bus-line and the image signal bus-line both signal bus-lines are separated by an island-shaped pattern of the semiconductor layer and the gate insulating film formed in the same shape, the image signal bus-line (drain bus-line) needs to be wired in a manner such that the wire climbs over a large step at the portion of the island-shaped pattern. This leads to a disadvantage in that a break in the wire is apt to occur at the step near the pattern.

On the other hand, in a liquid-crystal display device of active matrix type, in order to prevent degradation in image quality due to a parasitic capacitor between the gate and the source in a TFT, it is commonly performed to provide capacitor elements (storage capacitor $C_{stg}$) between the pixel electrode and the counter electrode, and an electric potential line other than the scanning signal bus-line, or to provide capacitor elements (storage capacitor $C_{add}$) between the pixel electrode and the scanning signal bus-line in the precedent stage. The liquid-crystal display device of active matrix type having the storage capacitor $C_{stg}$ is described in, for example, Japanese Patent Application Laid-Open No. 3-149520 (1991), and the liquid-crystal display device of active matrix type having the storage capacitor $C_{add}$ is described in, for example, Japanese Patent Application Laid-Open No. 5-204337 (1993).

The liquid-crystal display device of active matrix type having the storage capacitor $C_{stg}$ is capable of high speed scanning at driving the scanning signal bus-lines and is suitable for large screen size and high resolution, since the storage capacitor $C_{stg}$ is not connected to the scanning signal bus-line. However, the storage capacitor $C_{stg}$ requires a counter electrode and a bus-line for applying electric potential other than the scanning signal bus-line. This decreases the production yield which depends on the aperture ratio of the pixel and the cross over area of the bus-lines.

On the other hand, the liquid-crystal display device of active matrix type having the storage capacitor $C_{add}$ has an advantage in that no newly added bus-line for applying electric potential to the storage capacitor $C_{add}$ is necessary, and, therefore, the device has merit in the aperture and in the production yield.

However, since the storage capacitor $C_{add}$ is connected to the scanning signal bus-line, it is difficult to perform high speed scanning. Therefore, there is a disadvantage in that it is difficult to realize a high resolution and large screen display.

In order to decrease the burden on the TFTs or to decrease cost for forming the driving circuit of image signal bus-lines, alternating driving of the counter electrode is generally employed to lower the image signal voltage. In this driving method, it is necessary to lower the resistivity of the scanning signal bus-line and the counter electrode in a case of employing the storage capacitor $C_{add}$ since the image quality is affected by the product of the capacitance and the electrode resistivity connected to the scanning signal bus-line, the resistivity and the capacitance of the counter electrode and so on.

SUMMARY OF THE INVENTION

The first object of the present invention is to provide a liquid-crystal display device and a manufacturing method therefor where the number of processes for manufacturing TFT substrates can be deceased and high production yield can be attained.

The second object of the present invention is to provide a liquid-crystal display device of active matrix type which is improved to solve the aforementioned problems accompanying the use of capacitor elements.

Describing this in more detail, the second object of the present invention is to provide a liquid-crystal display device of active matrix driving type which is high in aperture ratio, high in production yield, large in screen size and high in resolution, and further excellent in display quality.

Other objects of the present invention will appear in the course of the description of embodiments which follows.

In order to attain the first object above, a liquid crystal display device comprises one substrate having on one side of the surfaces a plurality of scanning signal bus-lines extending in a first direction, a plurality of image signal bus-lines extending in a second direction intersecting with the scanning signal bus-lines and insulated from the scanning signal bus-lines, pixel electrodes placed in areas surrounded by the adjacent scanning signal bus-lines and the adjacent image signal bus-lines apart from both of the signal bus-lines, thin film transistors placed near the intersecting points of the scanning signal bus-lines and the image signal bus-lines, their gate electrodes being connected to the scanning bus-lines, their drain electrodes being connected to the image signal bus-lines, and their source electrodes being connected to the pixel electrodes, another substrate having common electrodes on one side of the surfaces facing against the one substrate, and a liquid-crystal layer interposed between the one substrate and the other substrate, wherein the image signal bus-line is formed of a transparent conductive film, extending up to the thin film transistor to form the drain electrode, and the pixel electrode being formed of a transparent conductive film, extending up to the thin film transistor to form the source electrode. Also, the image signal bus-line has a semiconductor layer and an insulator layer under the transparent conductive film, and the semiconductor layer and the insulator layer extending up to the thin film transistor to form an active layer and a gate insulating film, respectively.

Further, in the method of manufacturing the above liquid-crystal display device, the method of manufacturing the TFT substrate comprises the first process of forming the scanning signal bus-lines and the gate electrodes having a given pattern on the transparent substrate, the second process of continuously forming the insulating layer and the semiconductor layer on the transparent substrate, the scanning signal bus-lines and the gate electrodes, the third process of forming semiconductor regions of the thin film transistors partially placed on the scanning signal bus-lines and the gate electrodes through selectively etching the insulating layer and the semiconductor layer, the fourth process of forming a transparent conductive film on the transparent substrate, the scanning signal bus-lines and the semiconductor layers, and the fifth process of forming the image signal bus-lines, the pixel electrodes, the drain electrodes and the source electrodes.

The same transparent conductive material for forming the pixel electrodes is also used for forming source electrodes, drain electrodes and image signal bus-lines which have been formed of a different material than that for forming pixel electrodes in the past. By forming these at the same time, the number of processes can be decreased and the production yield can be increased.

And since there are a semiconductor layer and an insulator layer extending up to an active layer and a gate insulating film of the thin film transistor under the transparent conductive film forming the image signal bus-line, the step to be climbed over by the transparent conductive film along the image signal bus-line is low. Therefore, the probability of wire breakage is substantially decreased.

In order to attain the second object of the present invention, the storage capacitor $C_{add}$ is formed with a capacitor element having such a characteristic that the capacitance substantially becomes small during the period of driving a scanning signal bus-line which the storage capacitor is connected to and the capacitance substantially becomes large during the other period.

In more detail, the storage capacitor $C_{add}$ is a variable capacitor having a capacitance varying corresponding with the voltage applied between the scanning signal bus-line to which the storage capacitor is connected and the pixel electrode. That is, the storage capacitor $C_{add}$ is formed with a variable capacitor having such a characteristic that the capacitance becomes small during the period of driving a scanning signal bus-line which the storage capacitor is connected to and the capacitance substantially becomes large during the other period. Or by providing a switch between the storage capacitor $C_{add}$ and a scanning signal bus-line, the storage capacitor $C_{add}$ is cut off from the scanning signal bus-line during the period of driving the scanning signal bus-line and the storage capacitor $C_{add}$ is connected to the scanning signal bus-line during the other period.

The variable capacitor as the storage capacitor $C_{add}$ is preferably constructed with an insulating film formed on a part of a pixel electrode, a semiconductor layer formed on the insulating film, a scanning signal bus-line formed extending on the semiconductor layer, a part of the scanning signal bus-line crossing over with the pixel electrode. In this case, the semiconductor layer preferably has an i-type semiconductor layer region not actively doped with impurities and an $n^+$-type semiconductor layer region having a higher impurity concentration than the i-type semiconductor layer region formed only under the scanning signal bus-line and adjacent to the i-type semiconductor layer region.

Since the liquid-crystal display device according to the present invention is constructed in such a manner that the storage capacitor $C_{add}$ is formed with a capacitor element having such a characteristic that the capacitance substantially becomes small during the period of driving the scanning signal bus-line which the storage capacitor is connected to and the capacitance substantially becomes large during the other period, the delay in a gate pulse during the period of driving is very small and scanning can be performed at high speed. And during the other period, the capacitance of the storage capacitor $C_{add}$ is large and it is possible to remove the bad effect of the parasitic capacitance of the TFT. In other words, it can be realized to provide a liquid-crystal display device which solves the problem of adding the storage capacitor $C_{add}$ to a liquid-crystal display device of active matrix type,and the merit of the liquid-crystal display device of active matrix type is kept as it is. Therefore, according to the present invention, the delay in a gate voltage pulse expressed by the value of the product of the line capacitance and the line resistance of a scanning signal bus-line becomes small. And good writing-in characteristic can be obtained in a high resolution liquid-crystal display device having a short writing period per scanning signal bus-line or in a large screen liquid-crystal display device having a large line resistivity per scanning signal bus-line. Further, after completion of writing-in, since the capacitance of the storage capacitor $C_{add}$ increases and reaches to a desired capacitance required to hold when the scanning signal bus-line is shifted to a holding period, the voltage fluctuation depending on time and place in display is suppressed and a good display characteristic without uneven brightness or flickering can be obtained.

Further, since the capacitance of a scanning signal bus-line during the writing period becomes small, the value of the product of the capacitance to be connected to the scanning signal bus-line and the resistance of an electrode can be decreased without decreasing the resistance of the scanning signal bus-line. As the result, it is possible to employ a electro method where counter electrodes are driven with alternating voltage and image signal voltage is lowered.

Furthermore, since the compound capacitor composed of the parasitic capacitor of the TFT and the supplementary capacitor inserted has a capacitance characteristic of becoming minimum during white displaying, it is possible to keep it constant independent of the image signal voltage fluctuation (feed through voltage) at transition time from the writing period of a gate to the holding period also determined by the ratio of the liquid-crystal capacitance and the compound capacitance during white writing.

BRIEF DESCRIPTION OF THE DRAWINGS

FIG. 12 is a cross-sectional view showing a pixel portion and a gate terminal portion during a sub-process of TFT substrate manufacturing and after the sub-process in Embodiment 1.

FIG. 13 is a cross-sectional view showing a pixel portion and a gate terminal portion during a sub-process of TFT substrate manufacturing and after the sub-process in Embodiment 1.

DESCRIPTION OF THE PREFERRED EMBODIMENT

A liquid-crystal display device of active matrix type and a manufacturing method therefor will be described in detail below, referring to the embodiments.

(Embodiment 1)

<Matrix portion>

Figure 1:
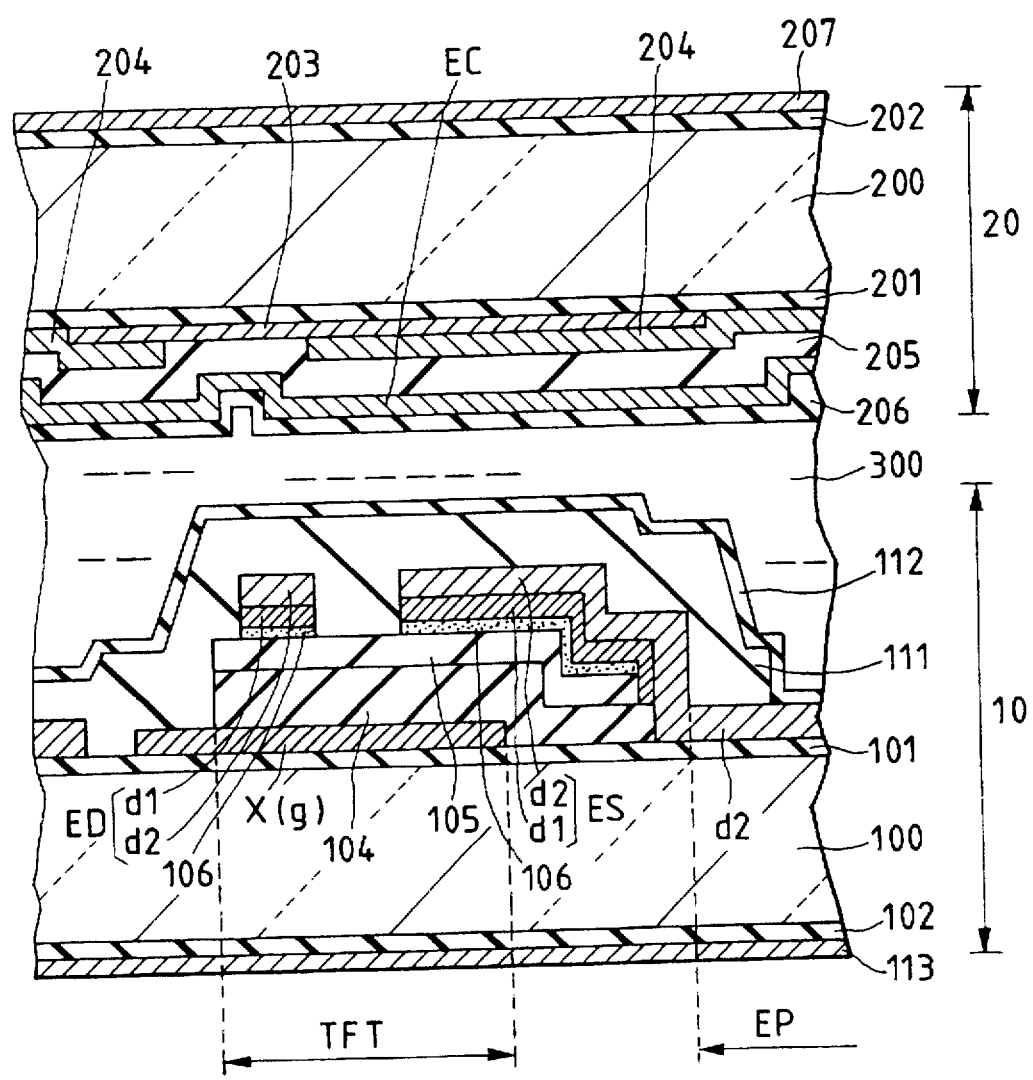
FIG. 1 is a cross-sectional view showing a thin film transistor and its vicinity in a liquid crystal display panel in Embodiment 1 in accordance with the present invention (with the view being taken on the plane of the line I—I in FIG. 2).

FIG. 1 is a cross-sectional view showing the structure of the matrix portion (display portion) of a display panel in a liquid-crystal display device of active matrix type according to the present invention. This display panel comprises a TFT substrate 10 having on one side surface of a first insulator substrate 100 made of a transparent glass plate or the like thin film transistors TFT, pixel electrodes EP, various kinds of wiring and so on, a counter substrate 20 having on one side surface of a second insulator substrate 200 made of another transparent glass plate or the like counter electrodes EC, a color filter 204, a shielding film 203, and a liquid-crystal layer 300 filled between the both substrates facing to each other.

The elector-optical state of the liquid-crystal layer 300 between the pixel electrode EP and the counter electrode EC is controlled by applying an image signal voltage between the both electrodes to change the light transferring state in this portion of the display panel and to display a given image. A back light is placed on the side of the counter substrate 20 of the liquid-crystal panel to observe the light transferred to the pixel portions of the liquid-crystal panel from the side of the TFT substrate 10.

In the figures to be explained below, the parts having the same function are identified by the same reference symbol.

<TFT substrate>

Figure 2:
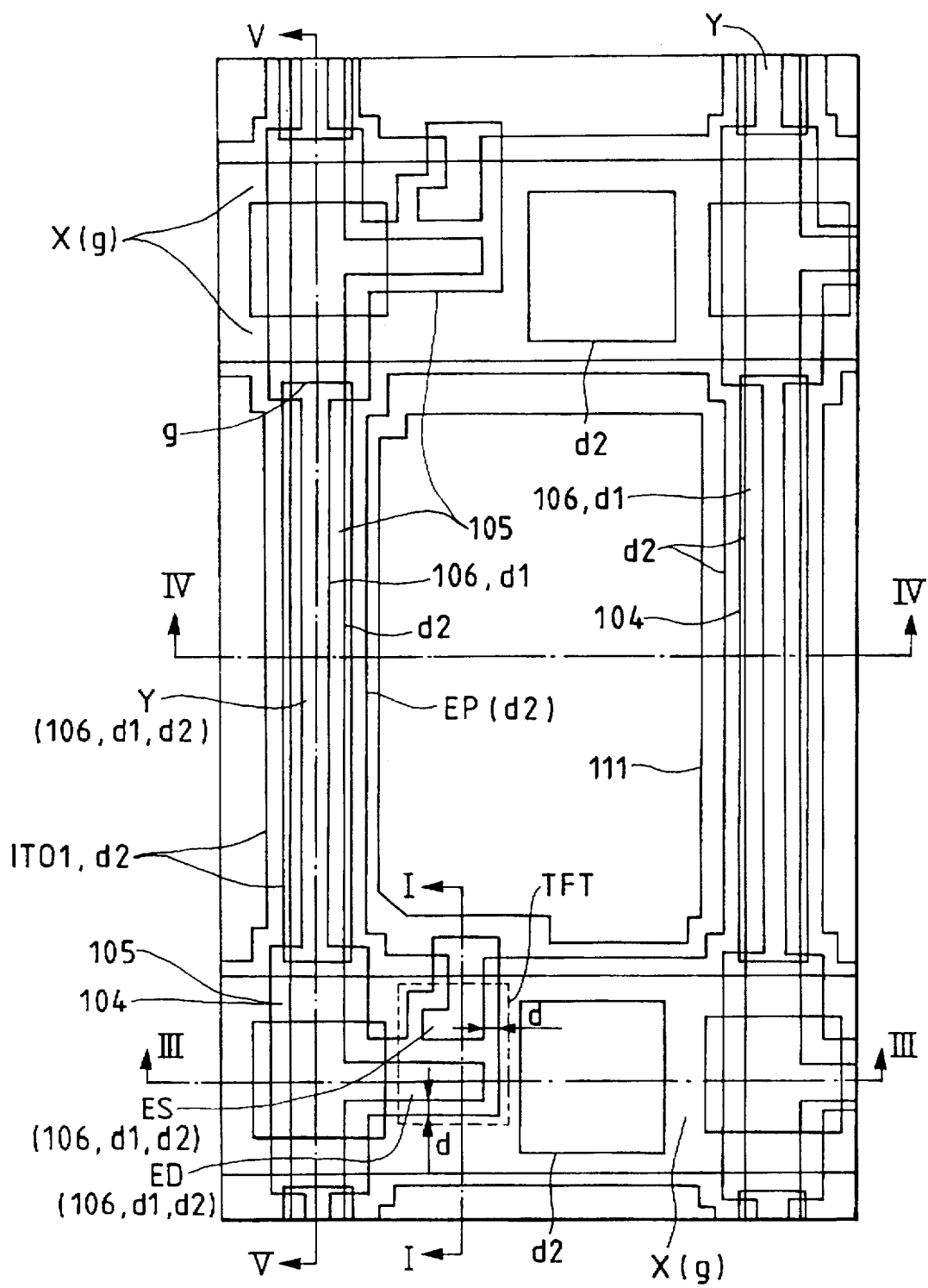
FIG. 2 is a plan view showing the patterns in the layers of a pixel and its vicinity on a TFT substrate in Embodiment 1.
Figure 3:
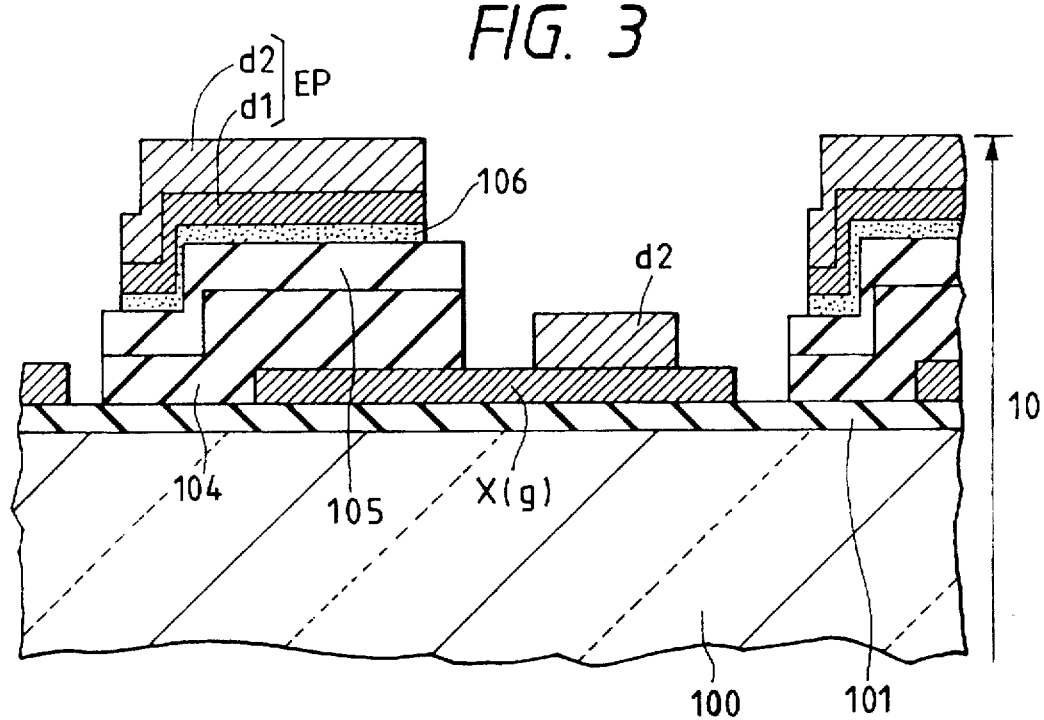
FIG. 3 is a cross-sectional view being taken on the plane of the line III—III in FIG. 2.
Figure 4:
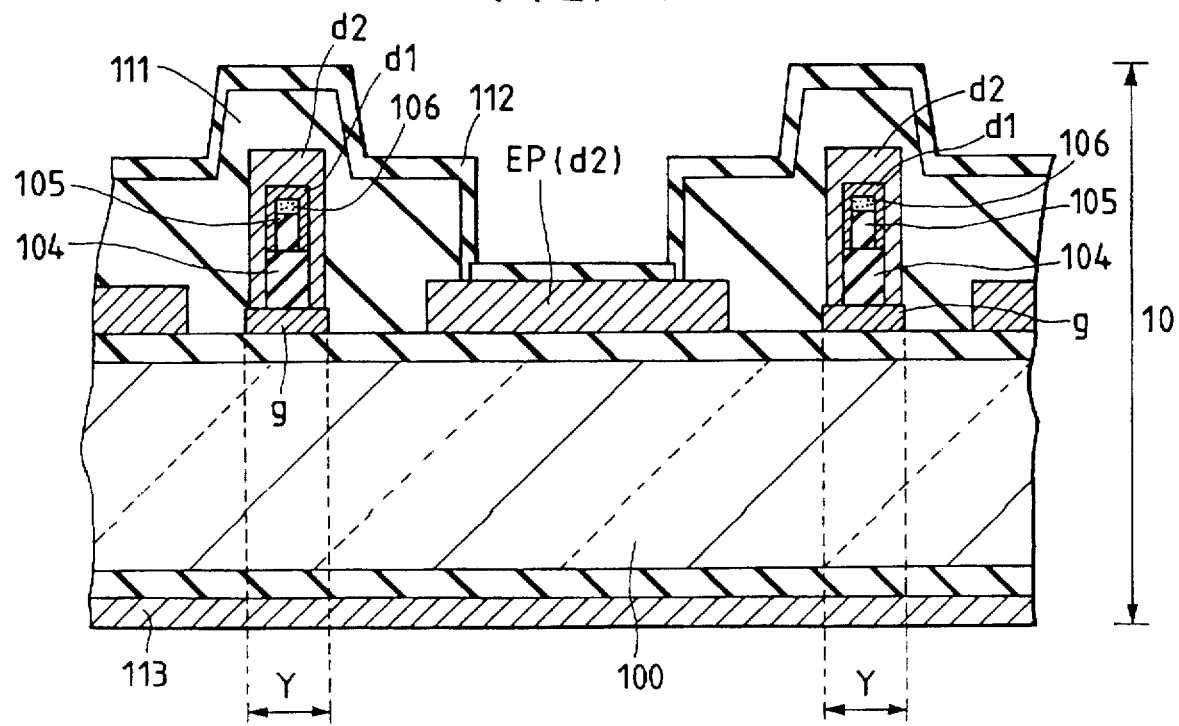
FIG. 4 is a cross-sectional view being taken on the plane of the line IV—IV in FIG. 2.
Figure 5:
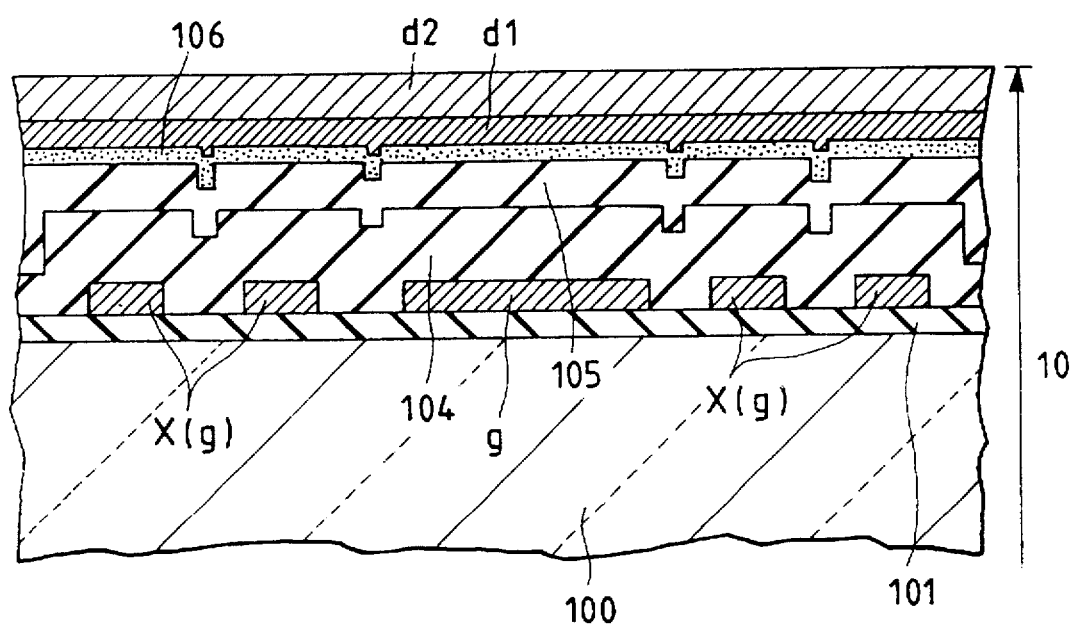
FIG. 5 is a cross-sectional view being taken on the plane of the line V—V in FIG. 2.

FIG. 2 is a plan view showing the patterns in a pixel and its vicinity forming each of the layers of a TFT substrate 10. FIG. 1 is a cross-sectional view being taken on the plane of the line I—I in FIG. 2. FIG. 3 is a cross-sectional view being taken on the plane of the line III—III in FIG. 2. FIG. 4 is a cross-sectional view being taken on the plane of the line IV—IV in FIG. 2. FIG. 5 is a cross-sectional view being taken on the plane of the line V—V in FIG. 2.

The structure of the TFT substrate 10 will be described in detail below, referring to FIG. 1 to FIG. 5. As shown in FIG. 2, on the surface of the TFT substrate there are provided a plurality of scanning signal bus-lines X in parallel to one another and a plurality of image signal bus-lines Y in parallel to one another intersecting with the scanning signal bus-lines. The area surrounded by two adjacent scanning signal bus-lines X and two adjacent image signal bus-lines Y becomes a pixel area, and a pixel electrode EP is formed nearly all over the area. A thin film transistor TFT (shown by broken line in FIG. 2) as a switching element is formed on the scanning signal bus-line corresponding to each pixel electrode. Each of the transistors TFT is arranged such that its source electrode ES is connected to the corresponding pixel electrode. The scanning voltage applied to the scanning signal bus-line X is applied to the gate electrode of the TFT composed of a part of the scanning signal bus-line to turn the TFT to its ON state. At this time, the image signal supplied to the image signal bus-line Y is input to the drain electrode ED of the TFT to be written in the pixel electrode EP through the source electrode ES.

<Thin film transistor TFT>

As shown in FIG. 1, silicon oxide films 101, 102 are provided on both surfaces of the first insulator substrate 100 through dip treatment or the like. Scanning signal bus-lines X are formed on the silicon oxide film 101, and an insulating film, a semiconductor layer and so on are formed on that surface to construct a thin film transistor as to be described later. The thin film transistor operates such that the channel resistance between the source and the drain electrodes becomes small when a bias voltage is applied to the scanning signal bus-line and the channel resistance becomes large when the bias voltage is turned to zero.

An insulating film 104 made of silicon nitride is formed on the gate electrode of the TFT, wherein this gate electrode is actually a part of the scanning signal bus-line. There is also formed on the film 104 an i-type semiconductor layer 105 made of amorphous silicon which intentionally does not include added impurity. An n+-type semiconductor layer 106 made of amorphous silicon is also formed over the layer 105, and the layer 106 does include added impurities. Further, a source electrode ES and a drain electrode ED are formed over the layer 106 to make a thin film transistor. The insulating film 104 and the i-type semiconductor layer 105 are formed in nearly the same plan pattern. The i-type semiconductor layer 105 acts as the active layer of the thin film transistor.

As for the insulating film 104, for example, a silicon nitride formed through plasma CVD is employed such as to have the thickness of 2000 to 4000 Å (approximately 3500 Å in this embodiment).

The i-type semiconductor layer 105 is formed such as to have its thickness of 200 to 2500 Å (approximately 2000 Å in this embodiment). The $n^+$-type semiconductor layer 106 is provided to form ohmic-contact with the i-type semiconductor layer 105, and is made of amorphous silicon semiconductor doped with phosphorous (P).

The names source electrode and drain electrode are determined by the polarity of bias between them by its nature. In the liquid-crystal display device according to the present invention, since the polarity changes during operation, the source electrode and the drain electrode are alternated. However, in the following description, for the purpose of simplification it is fixed that one is called the source electrode and the other is called the drain electrode.

Each of the source electrode ES and the drain electrode ED is formed on the $n^+$-type semiconductor layer 106 and has a first conductive film d1 and a second conductive film d2. The first conductive film d1 is a molybdenum silicide (MoSi) film having thickness of 10 to 80 Å (approximately 50 Å in this embodiment), and the second conductive film d2 is a transparent conductive film such as an indium-tin-oxide (hereinafter, referred to as ITO) film.

The first conductive film d1 made of MoSi is used to improve the rectifying characteristic between the $n^+$-type semiconductor layer 106 and the transparent conductive film (d2). The first conductive film d1 may be formed of a high melting point metal silicide (Ti, Ta, W) other than MoSi. In the portion of the thin film transistor (the area shown by a broken line in FIG. 2), the $n^+$-type semiconductor layer and the first conductive film d1 and the second conductive film d2 forming the source electrode ES and the drain electrode ED, respectively, have nearly the same plan pattern. Thereby, the channel length of the thin film transistor TFT (the i-type semiconductor layer area between the source electrode and the drain electrode, that is, the length of active area and a parameter to control operating current) can be controlled accurately.

<Pixel electrode>

The pixel electrode is formed of a transparent conductive film connected to the source electrode ES of the thin film transistor, and is formed in a body with the second conductive film d2 forming the source electrode. The transparent conductive film is formed of a sputtering film of ITO and has a thickness of 700 to 3000 Å (approximately 1400 Å in this embodiment).

<Gate electrode (scanning signal bus-line)>

As shown in FIG. 1 and FIG. 3, the scanning signal bus-line X is formed of a mono-layer conductive film g. As the conductive film g, for example, a chromium (Cr) film formed through sputtering is used, and is formed to have a thickness of 1000 to 2500 Å (approximately 1200 Å in this embodiment). As can be understood from FIG. 2, the scanning signal bus-line X has its central portion removed to be branched into two paths near the crossing portion with the image signal bus-line Y. In general, in the crossing portion of the scanning signal bus-line X and the image signal bus-line Y, both lines are electrically insulated from each other through an insulating film. However, when one of the two paths in this portion is short-circuited with the image signal bus-line Y by some cause, the short-circuited path is cut with a laser beam to transmit signal through the other path which is not cut. Thereby, the line fault is removed and the liquid-crystal display device can be operate normally.

<Image signal bus-line>

As shown in FIG. 2, FIG. 4 and FIG. 5, the image signal bus-line Y has such a construction that a conductive film g is formed on the transparent glass substrate 100 in an island shape (a rectangular shaped pattern formed between adjacent scanning signal bus-lines), an insulating film 104, an i-type semiconductor layer 105 and an $n^+$-type semiconductor layer 106 being laminated on the conductive film, the surfaces of the i-type semiconductor layer 105 and the $n^+$-type semiconductor layer 106 being covered with a first conductive film d1 made of MoSi, and the side surface of the insulating film 104 and the top surface and side surface of the first conductive film d1 being covered with a transparent conductive film made of ITO. Among them, the conductive film g and the transparent conductive film mainly contribute to electric conductance to permit transmitting signals.

The conductive film g forming the image signal bus-line Y is made of Cr, the conductive film g is electrically contacted to the second conductive film d2 made of ITO in the upper layer. Thereby, since the resistance of the image signal bus-line Y is a parallel connected resistance of the conductive film g and the second conductive film d2, the resistance of the image signal bus-line is decreased and consequently the transmitting speed of image signal can be increased. The conductive film g forming the image signal bus-line Y is formed at the same time as the scanning signal bus-line X and is separated from the scanning signal bus-line so the bus-lines do not electrically contact each other.

By the construction of covering the top and side surfaces of the first conductive film d1 with the transparent conductive film made of ITO, the wiring width of the image signal bus-line Y can be made narrow. Therefore, the area of the pixel electrode can be increased by a corresponding amount, the aperture ratio of the display can be increased, and a bright screen can be obtained.

As can be understood from FIG. 2, the insulating film 104, the i-type semiconductor layer 105, the $n^+$-type semiconductor layer 106 composing the thin film transistor TFT, the first conductive film d1 made of MoSi and the second conductive film made of ITO transparent conductive film each extend to the image signal bus-line Y, and these layers (films) form a pattern continuing from the thin film transistor area to the image signal bus-line Y. Since the film thickness of the first conductive film d1 made of MoSi is very thin, as described above, the insulating film 104 and the i-type semiconductor layer 105 are almost the same in plan shape (refer to FIG. 4). The ITO transparent conductive film on the image signal bus-line is formed at the same time as the ITO transparent conductive film forming the source electrode ES, the drain electrode ED and the pixel electrode EP of the thin film transistor.

FIG. 4 is a cross-sectional view of the region between the two adjacent image signal bus-lines Y. The second conductive film d2 made of ITO is formed above the first conductive film d1, the $n^+$-type semiconductor layer 106, the i-type semiconductor layer 105 and the insulating film 104, and is formed on the conductive film g on both sides in the width direction of the image signal bus-line Y. The electric resistance of the ITO transparent conductive film formed on semiconductor or silicide is smaller than that of the ITO transparent conductive film formed on glass. Large size crystals easy to subject to wet etching are formed in the ITO transparent conductive film, and thereby the resistivity of the image signal bus-line can be decreased and etching precipitate can be decreased (decrease of point defects).

In the region where the scanning signal bus-line X and the source electrode ES or the drain electrode ED are crossed over as shown in FIG. 1, since the distance d between the out-line of the i-type semiconductor layer 105 and the out-line of the source electrode ES or the drain electrode ED is large, the effect of decreasing the precipitate is large. And there is an advantage in that it is possible to decrease wiring faults by a short-circuit between the scanning signal bus-line X and the image signal bus-line Y or the source electrode ES or the drain electrode ED.

As described above, it is possible to separate and insulate the scanning signal bus-line X and the image signal bus-line Y in the crossing portion of both sufficiently and the wiring fault due to line break or short-circuit can be decreased by constructing the image signal bus-line in the form of the laminating layer containing the i-type semiconductor layer 105 and the insulating film 104. This matter will be described in detail below.

As shown in FIG. 5 of a cross-sectional view of the structure being taken on the plane of the line V—V in FIG. 2, the image signal bus-line Y has the ITO transparent conductive layer 106 (d2), the first conductive film d1 made of MoSi, the $n^+$-type semiconductor layer 106 under the first conductive film, the i-type semiconductor layer 105 and the insulating film 104, and under it the conductive film g. Therefore, the step to be climbed over by the image signal bus-line is only the conductive film g forming the scanning signal bus-line X. There are a small number of steps in the wiring direction of the image signal bus-line comparing with a case where an insulating layer and a semiconductor layer are formed only in the crossing region of the scanning signal bus-line X and the image signal bus-line Y in an island shape as described in, for example, Japanese Patent Application Laid-Open No. 62-32651 (1987). Since the probability of occurrence of wire break increases as the number of steps increases, the probability of a break of the image signal bus-line in the embodiment is small. Further, since the first conductive layer d1 made of MoSi is formed by the thermal interface reaction between the $n^+$-type semiconductor layer d0 and Mo, the adhering force between the first conductive film d1 and the upper layer and the lower layer is increased, which further decreases the probability of wire breakage.

For the same reason, the faults due to wire breakage or short-circuit in the crossing portions between the periphery of the pattern of the scanning signal bus-line X and the source electrode ES and between the periphery of the pattern of the scanning signal bus-line X the drain electrode ED decrease.

<Passivation film PSV1>

As shown in FIG. 1, FIG. 2 and FIG. 4, the surface of the TFT substrate on the side having the thin film transistor is covered with a passivation film 111 except the center portion of the pixel electrode EP and the gate terminal portion and the drain terminal portion provided and so on in the periphery of the TFT substrate, which will be described later.

The passivation film 111 is formed mainly to protect the thin film transistor TFT from moisture or the like. Therefore, materials having high transparency and good moisture-proof capability are used for the passivation film. For example, the passivation film 111 is formed in a silicon oxide film or silicon nitride film having a thickness of approximately 1 μm through plasma CVD. In general, passivation films are formed using a vacuum apparatus such as a plasma CVD apparatus. However, organic materials such as epoxy resin may be used. In this case, through-put is increased.

Figure 11:
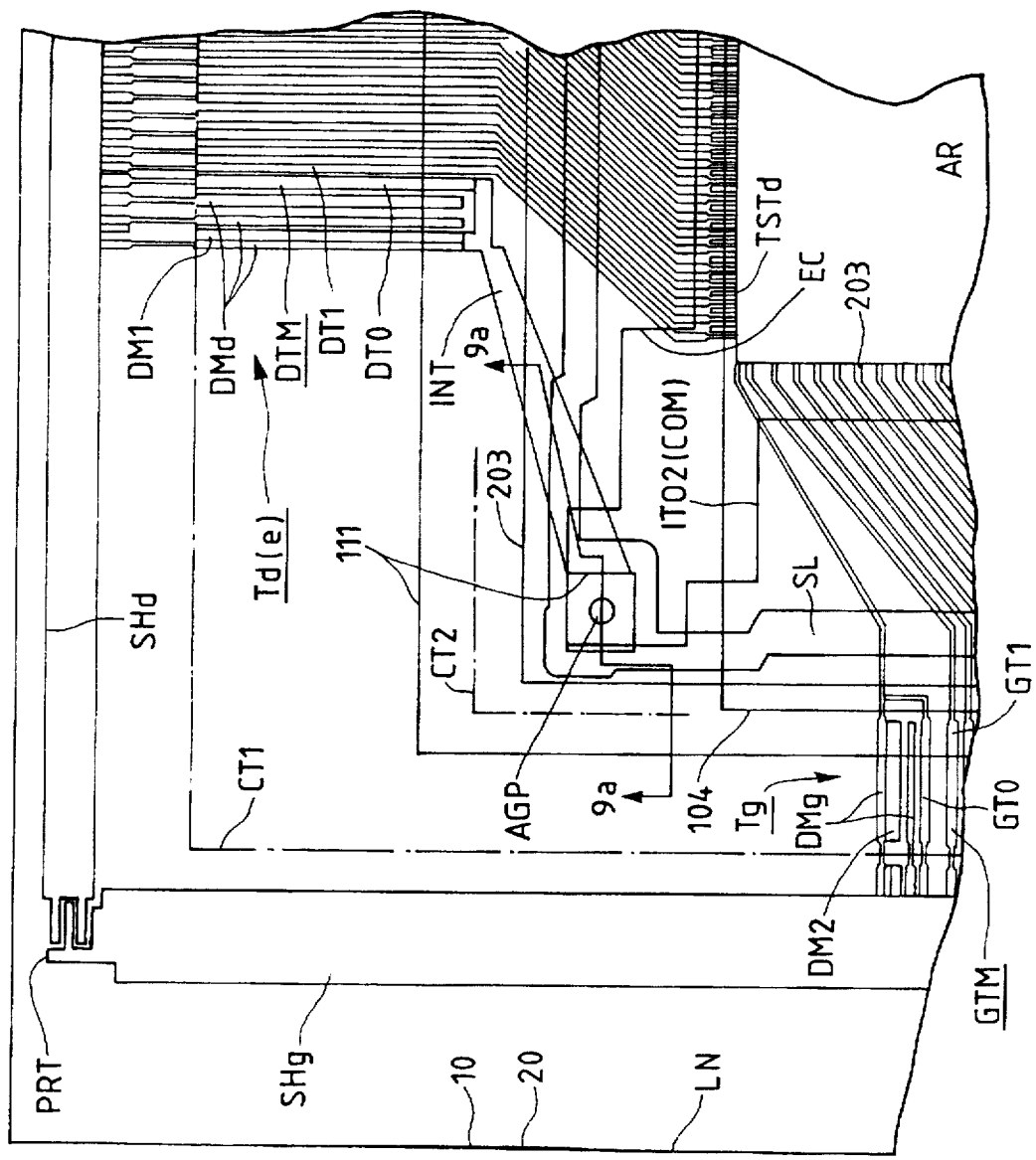
FIG. 11 is an enlarged plan view showing the corner portion of a display panel including electric connecting portions in a top and a bottom substrates.

FIG. 11 is an enlarged plan view showing the corner portion of a display panel (showing a crossing-over state of the TFT substrate 10 and the counter substrate 20). As show in the figure, the passivation film 111 is formed so as to cover the whole of the matrix portion (display portion) in the center of the display panel, and removed in the peripheral portion so as to expose a part or the whole of external connection terminals DTM, GTM for connecting to an external driving circuit. The passivation film is also removed from the portion where the counter electrode EC formed in the surface of the counter substrate 20 to be described later is connected to an extracting line INT for a connector of the external connection terminal in the TFT substrate 10 using silver paste.

<Gate terminal portion>

Figure 6:
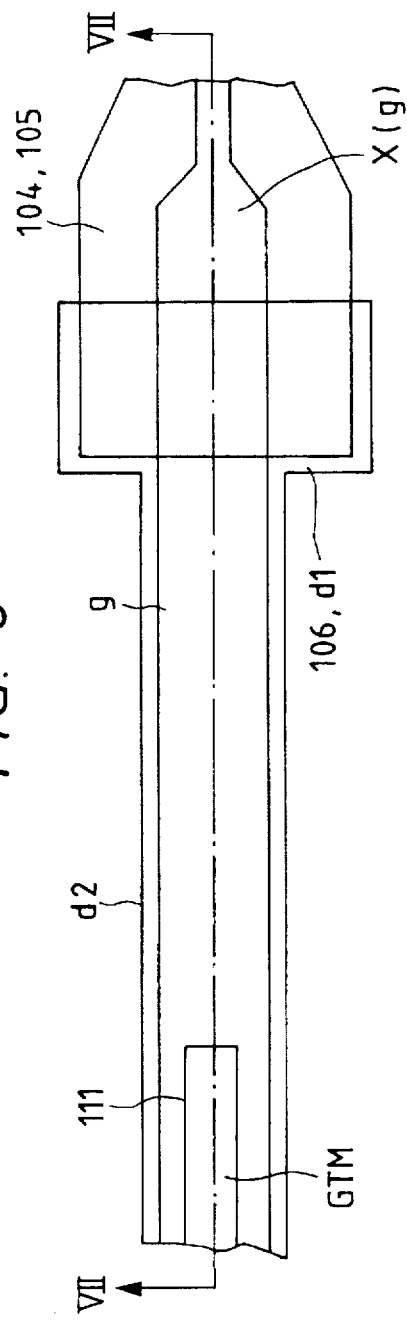
FIG. 6 is a plan view showing the vicinity of a connecting portion of a gate terminal and a GTM gate bus-line GL.
Figure 7:
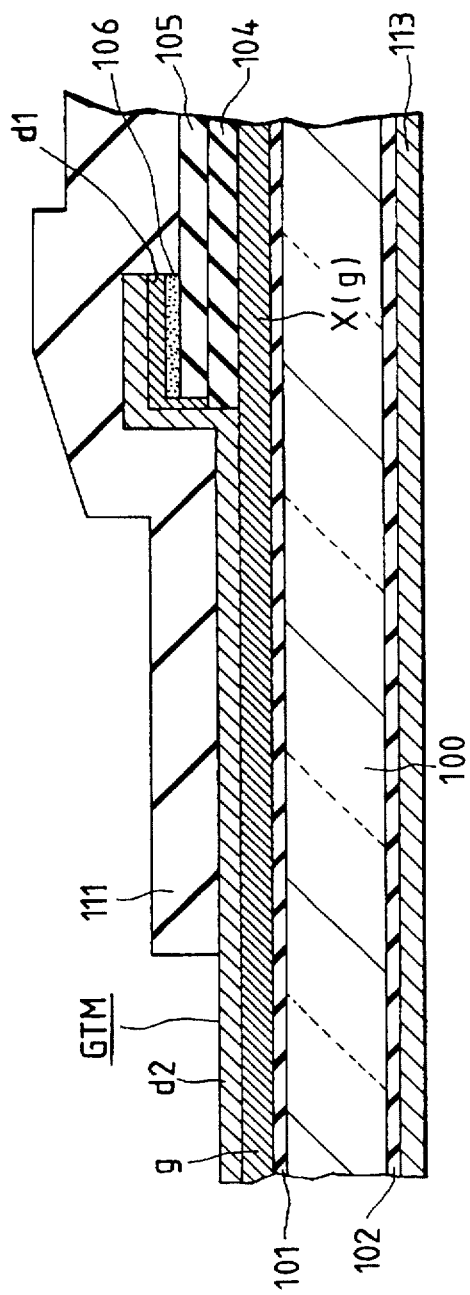
FIG. 7 is a cross-sectional view showing the vicinity of a connecting portion of a gate terminal and a GTM gate bus-line GL.

FIG. 6 is a plan view showing the area from the end portion of the scanning signal bus-line X on the TFT substrate to a connecting portion of a gate terminal GTM. FIG. 7 is a cross-sectional view being taken on the plane of the line VII—VII of FIG. 6. The figure corresponds to the bottom left portion of FIG. 11.

The gate terminal GTM is composed of laminated films of the conductive film g forming the scanning signal bus-line X and the second conductive film d2 formed with the ITO transparent. The second conductive film d2 is exposed to the external environment. The ITO transparent film protects the conductive film g made of Cr from the outer environment. The ITO transparent film of the gate terminal GTM is formed together with the ITO transparent films forming the pixel electrode EP and the image signal electrode Y at the same time.

As shown in FIG. 6 and FIG. 7, the passivation film 111 in the portion of the gate terminal GTM is removed to form a though hole. And the pattern of the second conductive film d2 is formed larger than that of the conductive film g to protect the conductive film g made of Cr against corrosion due to entering of chemicals or moisture. In this construction, the ITO transparent conductive film is only one exposed portion other than the passivation film 111. Therefore, the TFT substrate in this embodiment is resistant against corrosion and high in reliability.

Figure 10:
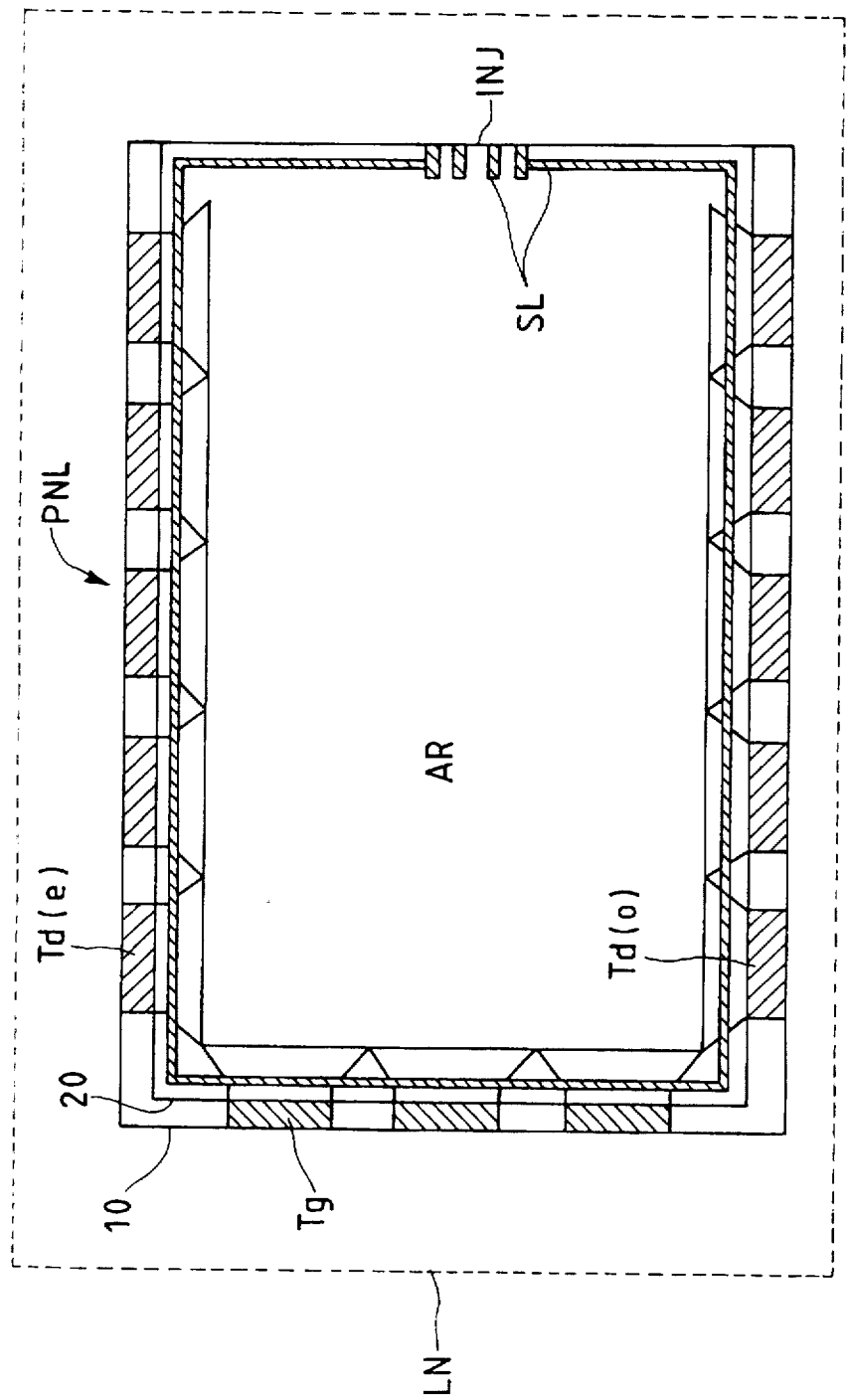
FIG. 10 is a plan view showing the structure in the periphery of a matrix of display panel.

FIG. 10 is a plan view showing the structure in the periphery of a matrix of a display panel. In the periphery of the TFT substrate 10, the plural gate terminals GTM corresponding to the scanning signal bus-lines are arranged to form a group of gate terminals Tg.

In a manufacturing process of the TFT substrate, the left end portion of the gate terminal shown in FIG. 6 and FIG. 7 is formed in crossing the cutting region CT1 (being cut after forming the TFT substrate) of the substrate as shown in FIG. 11, and the gate terminals are short-circuited with each other by a line SHg. The reason the plural scanning signal bus-lines are connected to each other during manufacturing is that the thin film transistor TFT is thus prevented from being broken by static electricity generated during rubbing of alignment film 112 to be described later and because electric power is supplied when the scanning signal bus-line is positively polarized.

<Drain terminal DTM>

Figure 8:
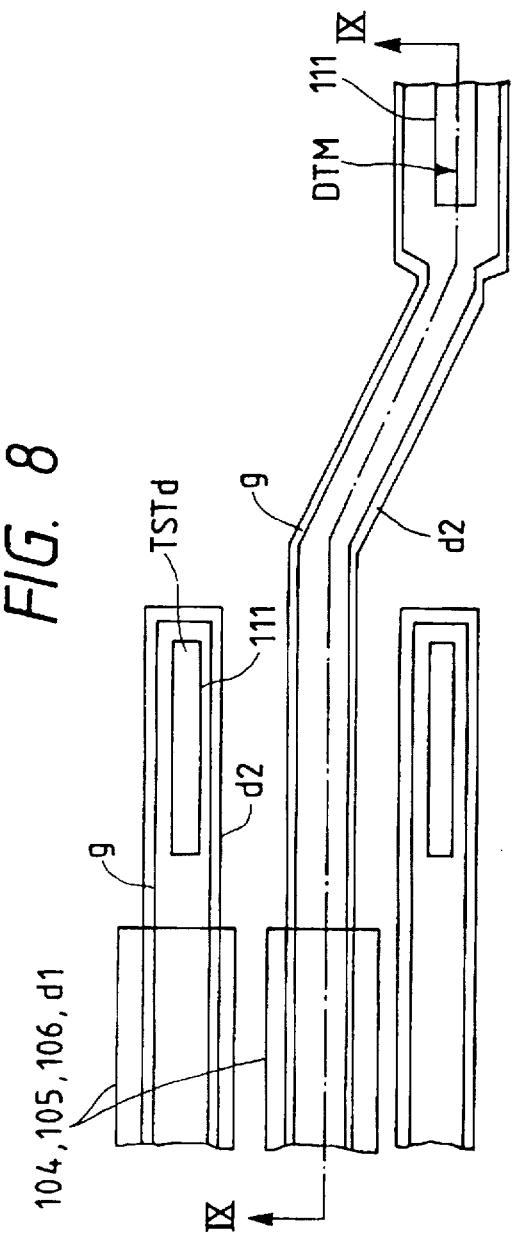
FIG. 8 is a plan view showing the vicinity of a connecting portion of a gate terminal and an image signal bus-line DL.
Figure 9:
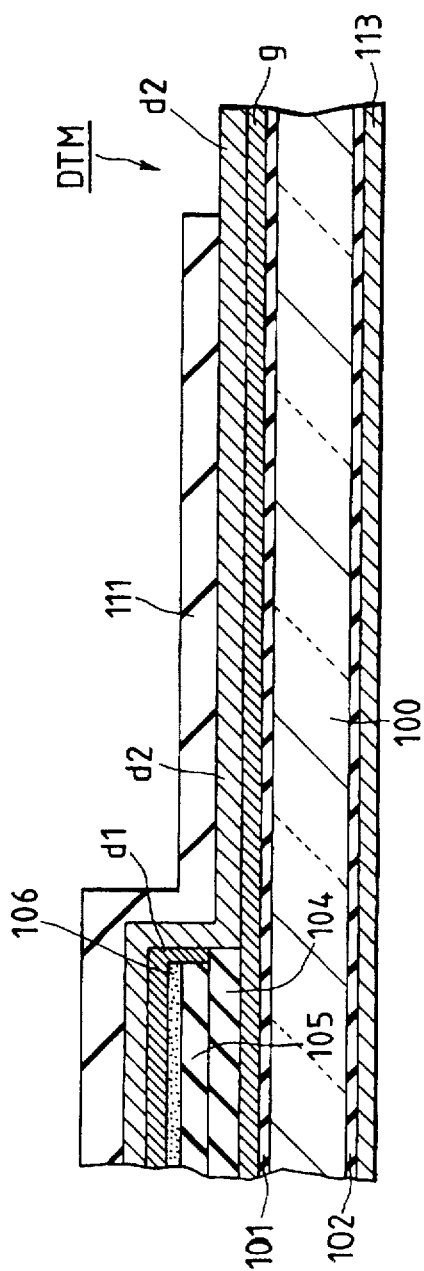
FIG. 9 is a cross-sectional view showing the vicinity of a connecting portion of a gate terminal and an image signal bus-line DL.

FIG. 8 is a plan view showing the area from the end portion of the image signal bus-line Y on the TFT substrate to a connecting portion to an external driving circuit of a drain terminal DTM. FIG. 9 is a cross-sectional view being taken on the plane of the line IX—IX of FIG. 6. The figure corresponds to the top right portion of FIG. 11.

In FIG. 8, TSTd is an inspecting terminal. Though the terminal is not connected to an external circuit, the line width in the terminal portion is formed wider than the bus-line portion so as to be capable of contacting with a probe. Similarly, the line width in the vicinity of the drain terminal DTM is formed wider than the bus-line portion so as to be capable of connecting ti an external circuit.

On one end of the image signal bus-line Y extending from one side of the TFT substrate 10 to the other side across the TFT substrate, the drain terminal is formed, and in the other end the inspection terminal is formed. In the one side and the other side of the TFT substrate 10, a plurality of the inspection terminals TSTd and a plurality of the external connection terminals DTM are arranged in a stagger-shape. The inspection terminal TSTd terminates within the edge portion of the TFT substrate 10. On the other hand, the drain terminals DTM form a group of drain terminals Td(e), and are extended beyond the cut line CT1 of the TFT substrate 10. Similar to the gate terminal GTM, all the drain terminals DTM are connected to each other by a line SHd during manufacturing to prevent the thin film transistor from being broken by static electricity.

For the same reason as in the case of the gate terminal GTM, the drain terminal DTM is composed of two layers of the conductive film g made of Cr and the second conductive film d2 formed with the ITO transparent film. The passivation film 111 in the portion of the drain terminal is removed to connect to an external circuit and formed in a though-hole-shape.

As shown in FIG. 9, in the extracting line from the matrix portion to the drain terminal DTM, the passivation film 111 is formed on the second conductive film d2. The passivation film 111 is formed up to the middle portion of a seal pattern SL (not shown) placed above. This construction protects the conductive film g made of electrically corrosible Cr with the passivation film 111 or the seal pattern SL.

<Counter substrate>

The construction of the counter substrate 20 will be described below.

As shown in FIG. 1, silicon oxide films 201, 202 are provided on both surfaces of the second insulator substrate 200 through dip treatment or the like. A shielding film 203, a color filter 204 having three colors of red, green and blue, a passivation film 205, a counter electrode EC and a alignment film 206 are successively laminated on the silicon oxide film 201 on the side of the liquid-crystal layer 300.

\<Shielding film BM\>

The shielding film 203 is provided on the counter substrate 200 so that the light from the back light is not irradiated on the i-type semiconductor layer 105. The shielding film 203 is formed of a material having high shielding capability, for example, aluminum film or chromium film or the like. In this embodiment, as the shielding film, a chromium film having a thickness of approximately 1300 Å is formed through a sputtering method.

Therefore, among the i-type semiconductor layer 105 of the thin film transistor TFT, at least the channel area between the source electrode ES and the drain electrode ED is shielded by the shielding film 203 formed on the counter substrate 20 and the scanning signal bus-line having a larger size than the thin film transistor formed on the TFT substrate, and the channel area is not irradiated with the external light entering from the display panel or the light from the back light.

The shielding film 203 is formed in a lattice-shape around each of the pixels (the so-called black matrix). The effective display area per pixel is partitioned with this lattice. Therefore, the out-line of the each pixel is made clear and the contrast is improved. As described above, the shielding film has two functions, that is, a shielding function for the i-type semiconductor layer 105 and a black matrix function.

The shielding film 203 is also formed in the periphery of the display panel in a frame-shape, and the pattern is continuously formed to the pattern in the pixel area. The shielding film 203 in the periphery is to prevent leaking light such as reflected light due to mounting from entering to the matrix portion when the display panel is mounted in a personal computer or the like.

\<Color filter\>

The color filter 204 is formed in each portion of pixels in a stripe-shape within cycles of red, green and blue. The color filter 204 is formed a little larger than the size of the pixel electrode to cover the whole pixel electrode EP on the TFT substrate 10 facing to the color filter. On the other hand, the shielding film 203 is formed up to the inner side of the pixel electrode a little so as to cross over the peripheries of the color filter 204 and the pixel electrode EP.

The color filter 204 is formed in the following manner. Firstly, a dyed base such as acrylic resin film is formed on the surface of a transparent glass substrate 200. Then the dyed base is dyed with red dye and fixing-treated to form a red filter. Next, through the similar processes, a green filter and a blue filter are formed.

\<Passivation film\>

The passivation film 205 is formed to prevent the dye in the color filter 204 from seeping into the liquid-crystal layer 300. The passivation film 205 is formed with a transparent resin material such as acrylate resin, epoxy resin.

\<Counter electrode\>

The counter electrode EC is formed all over the display area of the counter substrate 20 uniformly using the transparent conductive film made of ITO. The optical state of the liquid-crystal layer 300 is controlled by the voltage (electric field) applied between the counter electrode EC and the pixel electrode EP formed on the TFT substrate 10. Common voltage $V_{com}$ is applied to the counter electrode EC. In the embodiment, the common voltage $V_{com}$ is set to a direct current voltage in an intermediate voltage between the maximum driving voltage $V_{dmax}$ and the minimum driving voltage $V_{dmin}$ applied to the image signal bus-line Y. In a case where the power source voltage of an integrated circuit used in an image signal driving circuit is decreased to approximately one-half, an alternating current voltage is applied as the common voltage $V_{com}$. FIG. 11 shows a plan shape of the counter electrode EC in the corner of the display panel.

\<Manufacturing method of TFT substrate\>

Figure 16:
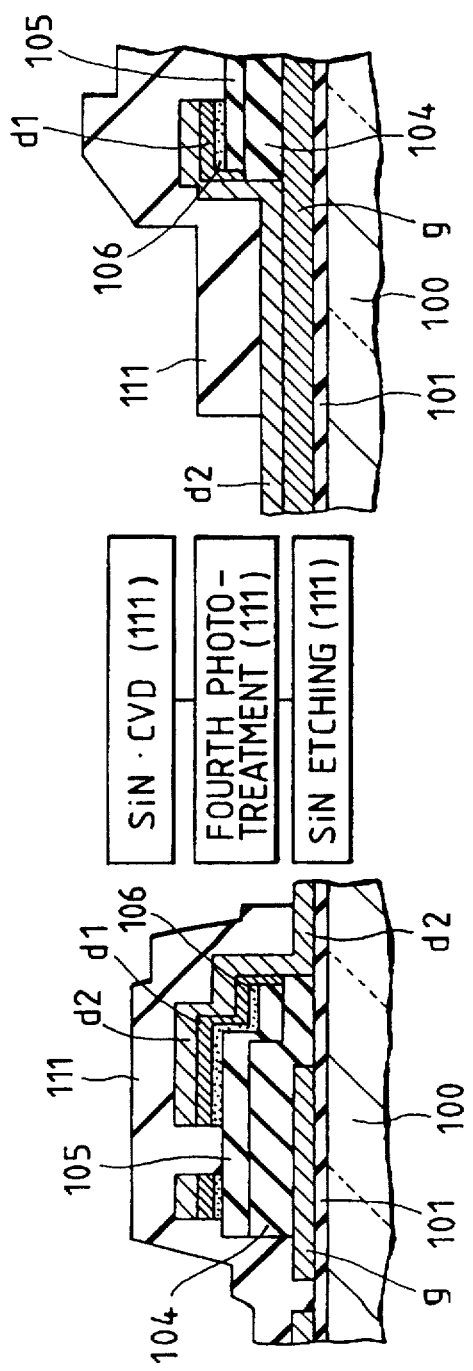
FIG. 16 is a cross-sectional view showing a pixel portion and a gate terminal portion during a sub-process of TFT substrate manufacturing and after the sub-process is in Embodiment 1.
Figure 17:
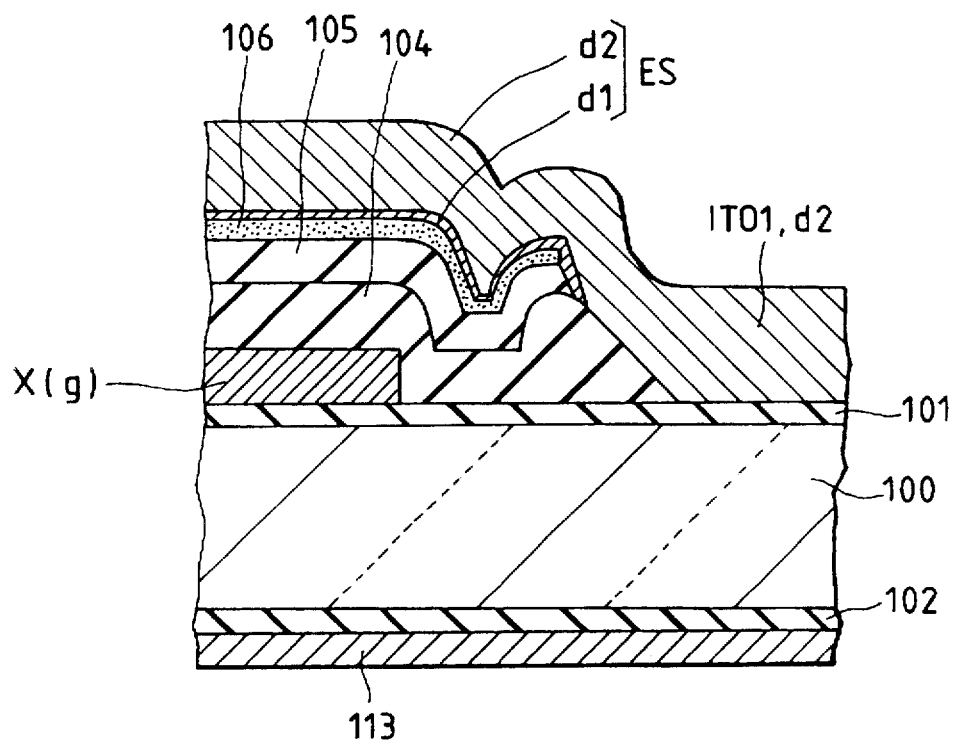
FIG. 17 is a cross-sectional view showing the vicinity of the connecting portion of a thin film transistor and a pixel electrode in a TFT substrate manufactured through the manufacturing process shown in FIG. 12 to FIG. 16.

The manufacturing method of the TFT substrate 10 of the liquid-crystal display device described above will be described below, referring to FIG. 12 to FIG. 16. Each of FIG. 12 to FIG. 16 corresponds to each of the manufacturing processes which progresses from FIG. 12 to FIG. 16. In these figures, the flow of a sub-process composing each of the processes is indicated in the middle of the figure, and the cross-sectional shape of the pixel portion in each process (corresponding to FIG. 1) is shown in the left hand side, while the cross-sectional shape of the vicinity of the gate terminal portion in each process (corresponding to FIG. 7) is shown in the right hand side. FIG. 17 is a cross-sectional view showing the vicinity of the connecting portion of a thin film transistor and a pixel electrode in a TFT substrate manufactured through such processes. The processes in FIG. 12, FIG. 14, FIG. 15 and FIG. 16 correspond to photo-treatment processes. Here, the photo-treatment process means a series of work from application of photoresist to development through selective exposure using a photo-mask. It can be understood from these figures that the TFT substrate 10 is processed through four times of photo-treatment processes in this embodiment. The process will be described below.

By preparing a first insulator substrate 100 made of a transparent glass plate having silicon oxide films 101, 102 on the both surfaces, a Cr film is wholly formed on one of the surfaces. A mask having a given pattern is formed on the Cr film through photo-treatment (first photo-treatment), then the Cr film is selectively etched to form a conductive film g having the given pattern (FIG. 12).

Next, on the conductive film g, a silicon nitride (SiN) film, an i-type amorphous silicon (a-Si) film, and an $n^+$-type amorphous silicon ($n^+$ a-Si) film are continuously formed using, for example, a plasma CVD apparatus (FIG. 13).

After forming a mask through photo-treatment (second photo-treatment), the three layers of the $n^+$-type amorphous silicon film ($n^+$-type amorphous semiconductor layer 106), the i-type amorphous silicon layer (i-type semiconductor layer 105) and the silicon nitride film (insulating film 104) are continuously removed by etching using $SF_6$ gas with the remaining thin film transistor area, the image signal bus-line area and the gate terminal and the drain terminal areas.

Figure 14:
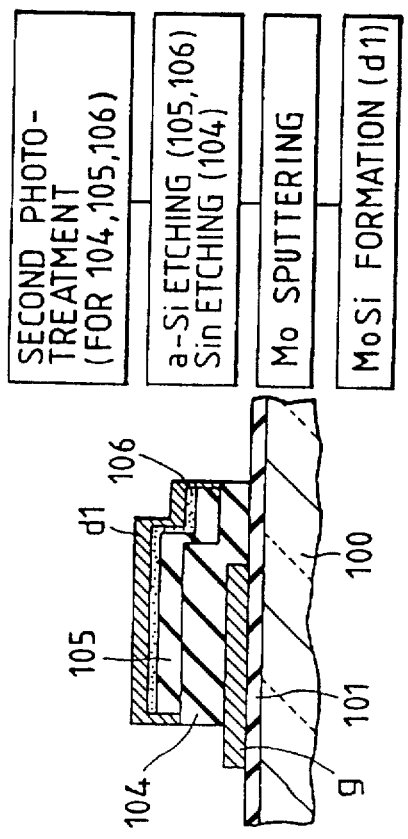
FIG. 14 is a cross-sectional view showing a pixel portion and a gate terminal portion during a sub-process of TFT substrate manufacturing and after the sub-process in Embodiment 1.

Next, an Mo film is formed on it with, for example, a sputtering treatment. Using, for example, heat treatment in a nitrogen gas environment, an MoSi layer (first conductive film d1) formed by heat reaction is formed on the side surfaces of the $n^+$-type amorphous silicon film (106) and the i-type amorphous silicon layer (105). Then the non-reacted Mo film is selectively removed by etching. At this point, it does not need to form a special mask for photo-treatment. The heat treatment above is not always required, and a preferable MoSi layer may be formed through sputtering the Mo film in a state of heating the substrate (FIG. 14).

In a case of forming the first conductive film d1, other high melting point metals (Ti, Ta, W) other than Mo may be used. Since the scanning signal bus-line X in the lower layer is exposed on the surface at the time of forming the first conductive film d1, a different material from the material composing the scanning signal bus-line is used for forming the first conductive film.

Since the MoSi used as the first conductive film d1 is a silicide layer formed by the reaction of Mo, $n^+$-type amorphous silicon and i-type amorphous silicon, a photoresist is not necessary to use in forming the MoSi layer, which decreases number of processes.

As described above, the manufacturing method of this embodiment is characterized by continuously etching the three layers of CVD films, the $n^+$-type amorphous silicon film, the i-type amorphous silicon layer and the silicon nitride film, using etching using $SF_6$ gas having a main component of fluorine (F). When the etching speed ratio for i-type amorphous silicon by $SF_6$ is set to 1, the etching speed ratio for $n^+$-type amorphous silicon is approximately 4, and for silicon nitride is approximately 8, that is, the etching speeds increase in order of i-type amorphous silicon, $n^+$-type amorphous silicon and silicon nitride. Therefore, after completion of etching the $n^+$-type amorphous silicon layer, at the start of etching the i-type amorphous silicon layer, the $n^+$-type amorphous silicon layer is etched in the side and the end portion of the i-type amorphous silicon layer is formed in a taper-shape (inclining shape) having an angle of approximately 70° to 75° as the result. And after completion of etching the i-type amorphous silicon layer, at the start of etching the silicon nitride film the $n^+$-type amorphous silicon layer and the i-type amorphous silicon layer placed above are etched in the side in that order and the end portion of the i-type amorphous silicon layer (105) is formed in a taper-shape having an angle of approximately 50° and the end portion of the silicon nitride film is formed in a taper-shape having an angle of approximately 20° as the result. By forming the structure in such a taper-shape, in forming the source electrode ES on the taper-shaped portion in the following process, the probability of line break is substantially decreased when compared to a case of a steep-shaped step. Though the taper angle in the $n^+$-type amorphous silicon layer is nearly 90° but the film thickness is as thin as 300 Å and the corner of the film is rounded during forming the MoSi layer, the probability of line break is very small. Therefore, the plan patterns of the $n^+$-type amorphous silicon layer, the i-type amorphous silicon layer and silicon nitride film are not strictly the same, and the cross-section becomes a normal taper-shape. The pattern of the $n^+$-type amorphous silicon layer is the smallest, the pattern of the i-type amorphous silicon layer is the next smallest and the pattern of the silicon nitride film is largest.

As described above, by forming a four layer structure in order from the lower layer side of the silicon nitride film, the i-type amorphous silicon layer, the $n^+$-type amorphous silicon layer and the first conductive film d1, it is possible to form a taper-shape effective for preventing line break. For example, in a case of absence of the $n^+$-type amorphous silicon layer, the angle of the taper in the i-type amorphous silicon layer becomes as large as 90°.

Figure 15:
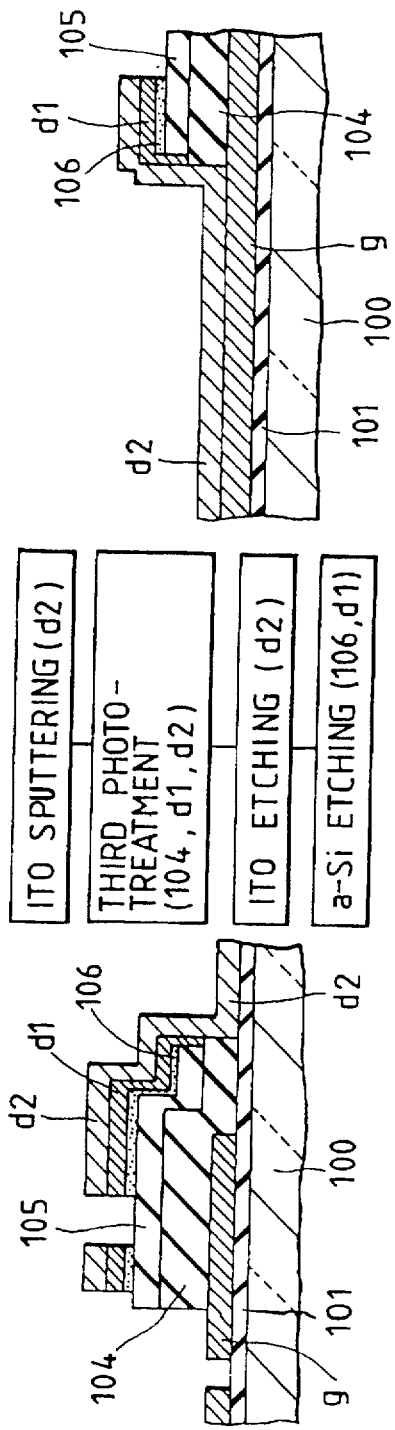
FIG. 15 is a cross-sectional view showing a pixel portion and a gate terminal portion during a sub-process of TFT substrate manufacturing and after the sub-process in Embodiment 1.

After forming the MoSi film, the second conductive film d2 made of ITO is formed through, for example, a sputtering method. After forming a photo-mask by photo-treatment (third photo-treatment), the ITO is selectively etched to remain an ITO pattern for the pixel electrode EP, the source electrode ES, the-drain electrode ED, the image signal bus-line Y, the portion of the gate terminal GTM and the portion of the drain terminal DTM. Then by etching the $n^+$-type amorphous silicon layer using the remaining ITO pattern as the mask, the first conductive film d1 and the $n^+$-type amorphous silicon layer formed of MoSi between the source electrode ES and the drain electrode ED are selectively removed (FIG. 15).

As described above, after patterning the second conductive film d2 the first conductive film d1 and the $n^+$-type amorphous silicon layer are removed using the photoresist mask used for the patterning as it is or using the second conductive film d2 as a mask. That is, the $n^+$-type amorphous silicon layer and the first conductive film d1 remaining on the i-type amorphous silicon layer except the second conductive pattern d2 are removed with self-alignment. At this time, since the $n^+$-type amorphous silicon layer is etched so that the thickness of the layer is totally removed, the i-type amorphous silicon layer is also etched a little. The etched depth can be controlled by etching time.

Electric conductivity of the ITO film is lower when it is formed on a semiconductor film than when it is formed on a glass substrate. And an ITO film formed on a semiconductor film is constructed with large crystals which are easy to etch. Therefore, by forming an ITO film on a semiconductor film, resistance of an image signal bus-line can be lowered and the etching remainder can be decreased (decrease in point defects).

In the region where the scanning signal bus-line X and the source electrode ES or the drain electrode ED are crossed over as shown in FIG. 1, since the distance d between the out-line of the i-type semiconductor layer 105 and the out-line of the source electrode ES or the drain electrode ED is large, the effect of decreasing the precipitate is large. And there is an advantage in that it is possible to decrease wiring faults by short-circuit between the scanning signal bus-line X and the image signal bus-line Y.

Next, a silicon nitride film is formed using, for example, a plasma CVD apparatus. After forming a mask by photo-treatment (fourth photo-treatment), the silicon nitride film is etched, and a passivation film 111 is formed on the area except the central portion of the pixel electrode, the gate terminal portion and the drain terminal portion. Not only silicon nitride formed through CVD but insulating organic materials may be used as the passivation film (FIG. 16).

In the manufacturing method in the embodiment, as described above, after successively forming an $n^+$-type amorphous silicon layer, the i-type amorphous silicon layer and the silicon nitride layer through, for example, a CVD method, the image signal bus-line Y is formed using the same photoresist pattern. And MoSi of the first conductive film d1 is formed through an interface reaction not using photo-treatment.

On the other hand, after forming the laminated layers of the $n^+$-type amorphous silicon layer and the i-type amorphous silicon layer, and the silicon nitride layer in different processes individually, line break faults in the image signal bus-line have been classified. The result is that line breakage due to the steps in the cross portion with the scanning signal bus-line is 10%, line breakage due to resist remainder in forming a laminating layer of the $n^+$-type amorphous silicon layer and the i-type amorphous silicon layer is 30%, line breakage due to resist remainder in forming the silicon nitride layer is 40%, and line breakage due to resist faults in the image signal bus-line Y is 20%. The reason why the faults in forming the silicon nitride layer are larger than the faults in forming the $n^+$-type amorphous silicon layer or the i-type amorphous silicon layer is because the process for forming the silicon nitride layer is a later process and consequently the foreign substance in the former processes is accumulated.

According to the embodiment, the number of phototreatment processes for forming a TFT substrate can be decreased to four times, as well as the $n^+$-type semiconductor layer 106, the i-type semiconductor layer 105 end the insulating layer 104 are formed in a single photo-etching process. Therefore, foreign substances in the former processes are not accumulated and the fault ratio can be substantially decreased as the result.

(Embodiment 2)

The second embodiment according to the present invention will be described, referring to FIG. 18.

Figure 18:
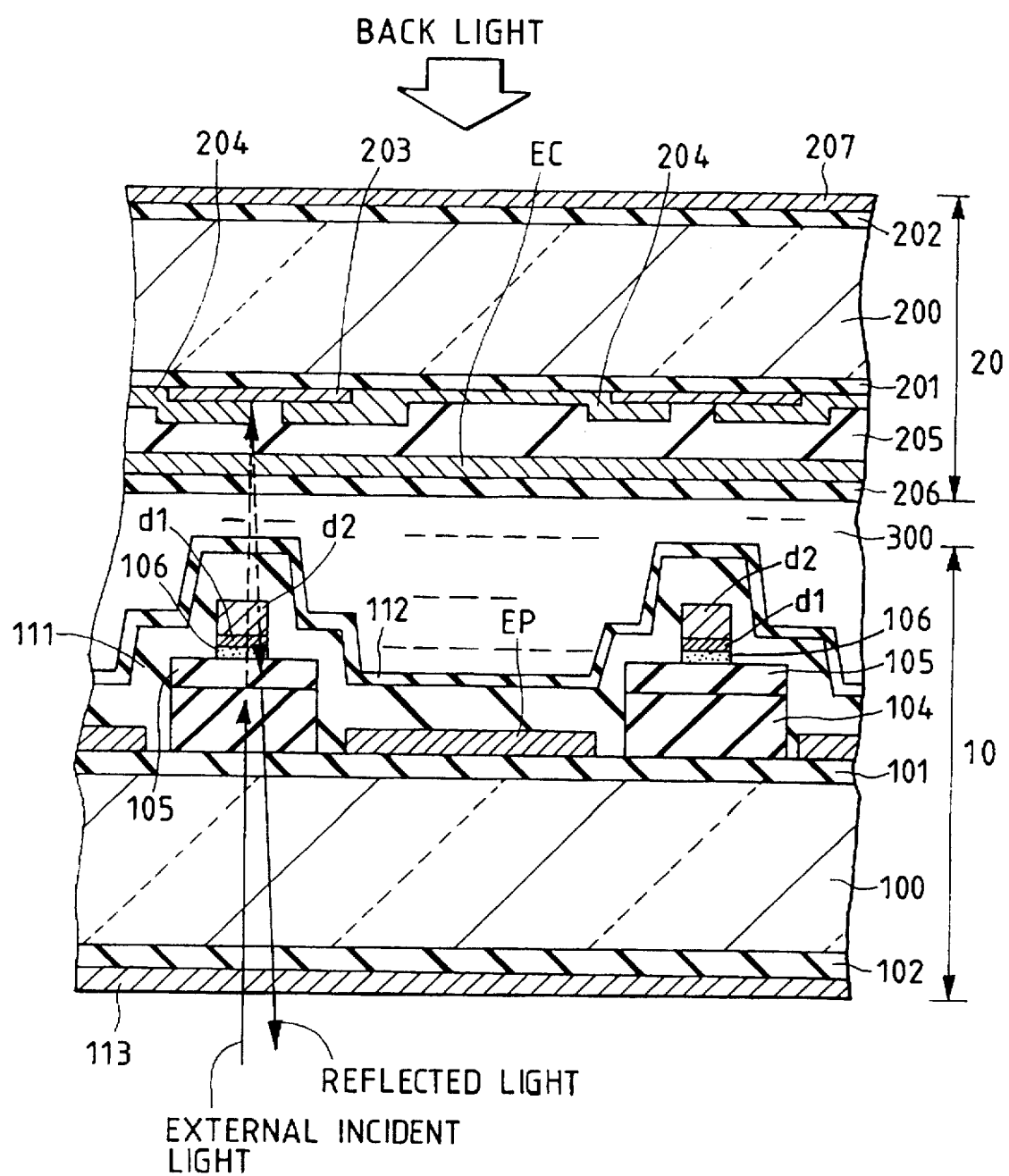
FIG. 18 is a cross-sectional view showing image signal bus-lines adjacent to each other and a pixel electrode portion between them on a TFT substrate in Embodiment 2.

FIG. 18 is a cross-sectional view showing two image signal bus-lines Y adjacent to each other and an area therebetween, and corresponds to FIG. 4 in Embodiment 1.

The different point in this embodiment from Embodiment 1 is that the conductive film g made of Cr is not provided under the image signal bus-line Y, the image signal bus-line Y being constructed by forming an insulating film 104 made of silicon nitride and an i-type semiconductor layer 105 directly on a silicon oxide 101 formed on a transparent glass substrate 100 in nearly the same pattern, further successively laminating on it an $n^+$-type semiconductor layer 106, a first conductive film d1 made of metal silicide (MoSi in this embodiment) and a second conductive film d2 made of ITO transparent conductive film. The first conductive film d1 is a metal silicide formed on the $n^+$-type semiconductor layer 106, and very thin, approximately 50 Å in thickness and high in transparency.

In the liquid-crystal display device according to the present invention, as shown in FIG. 18, light from the back light is irradiated from the side of the counter substrate 20, being controlled by the liquid-crystal layer 300, passing through the pixel electrode EP and the transparent glass substrate 100, reaching to an observer on the side of the TFT substrate. The observer observes the contrast of the light passed through each of the pixels as an image.

In a case where the display device according to the present invention is placed in, for example, a room, the light in the room is incident (external incident light) on the display device from the side of TFT substrate 10. When the external incident light is reflected inside the display panel and the reflected light mixed with the display light reaches the observer, the contrast is decreased and the quality of display is degraded in some cases.

Since the back light passing through the area formed with the pixel electrodes on the TFT substrate is stronger than the reflected light of the incident light from the various portions in the display device on the observer side, this reflected light is hardly recognized.

On the other hand, in the area other than the pixel electrodes, for example, in the portion of the image signal bus-line where the reflected light of the incident light is strong, there occurs a problem that the contrast is decreased, the light source of the external incident light is projected on the screen or the quality of the image is degraded. Such degradation in image quality becomes clear particularly when the screen displays black. This embodiment has a structure where the image signal bus-line is effective for decreasing the reflected light of the external incident light. This will be described below in detail.

A decrease of reflected light from the image signal bus-line is attained by the following structural feature of the liquid-crystal display device in the embodiment:

(1) No metal is used in the image signal bus-line which is a reflecting object of light. (2) The image signal bus-line includes the semiconductor layer (i-type semiconductor layer 105, $n^+$-type semiconductor layer 106) and the second conductive layer d2 made of a transparent conductive film.

Approximately 5% of the external incident light entering into the display panel from the observer's side is firstly absorbed with the insulating film 104. Then the light passing through the gate insulating film is absorbed 30 to 40% with the i-type semiconductor layer 105 and the $n^+$-type semiconductor layer 106. Further the light passes through the first conductive layer d1 made of metal silicide and the second conductive layer d2 made of ITO transparent conductive film, and is absorbed approximately 10% with the passivation film 111 and the passivation film 205 on the counter substrate 20. Furthermore, the light incident on the shielding film 203 made of Cr is reflected approximately 70%, and again absorbed 10% with the passivation films 111, 205, approximately 30% with the $n^+$-type semiconductor layer 106 and the i-type semiconductor layer 105, approximately 5% with the insulating film 104. The reflecting ratios of visible light for the i-type semiconductor layer and the $n^+$-type semiconductor layer are very small comparing to those for metals such as Cr, Al. As the result, the external incident light entering to the display panel is absorbed approximately more than 75% within the display panel (absorption rate more than 75%), the light reflected toward the observer's side is less than 25%.

On the other hand, in a case where a metal (for example, Cr, Mo, Al, Ti, Ta, TaN) layer is formed in the under layer of the image signal bus-line (the side of the transparent glass substrate) through a sputtering method or the like, the reflection ratio of the image signal bus-line portion becomes more than 70%.

In the embodiment, the TFT substrate of the liquid-crystal display device is manufactured through four times of photo-treatment processes the same as in Embodiment 1.

As described above, in this embodiment having the construction described in (1) and (2) above, the reflection ratio in the image signal bus-line portion can be substantially decreased. As a result, an excellent image quality can be attained such that the contrast is improved, and images of external objects or light sources are not projected in the screen.

Since image signal voltage is applied to the image signal bus-line, an electric field is produced between the image signal bus-line and the counter electrode EC formed on the counter substrate 20. The light transmittance of the liquid-crystal layer existing in this portion is accordingly changed, but this change in light transmittance of the liquid-crystal layer does not affect the observer since the shielding film 203 to shield the back light is formed in the portion facing to the image signal bus-line on the counter substrate.

(Embodiment 3)

Figure 19:
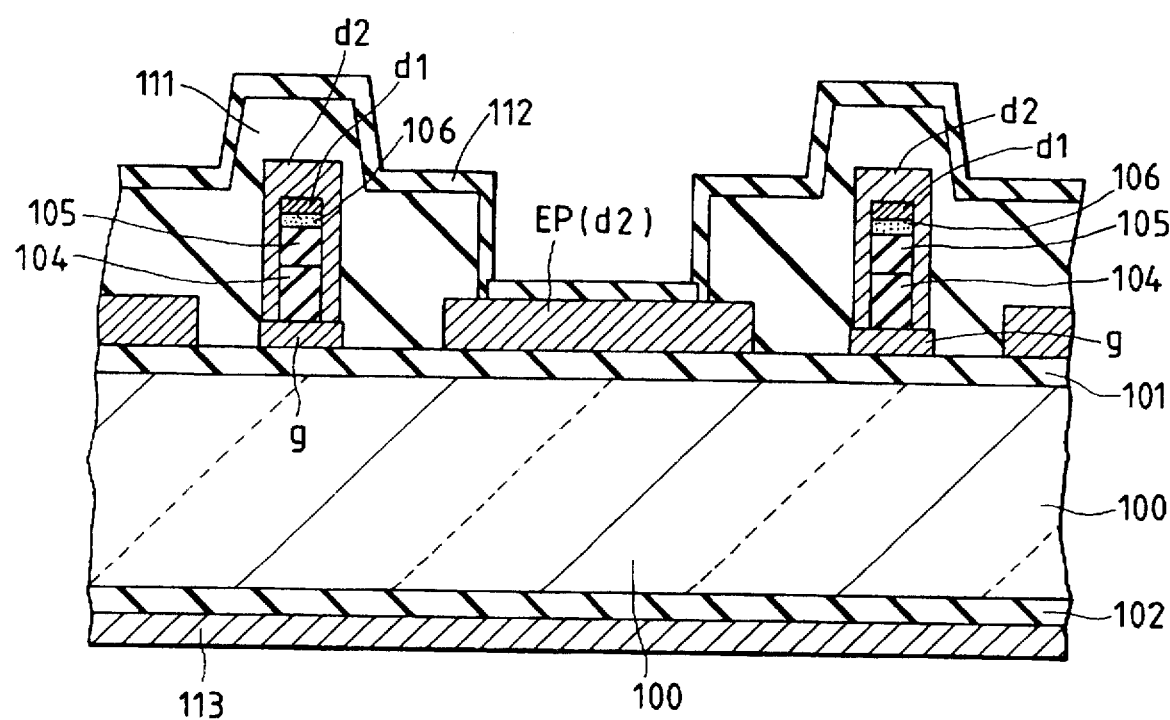
FIG. 19 is a cross-sectional view showing image signal bus-lines adjacent to each other and a pixel electrode portion between them on a TFT substrate in Embodiment 3.
Figure 20:
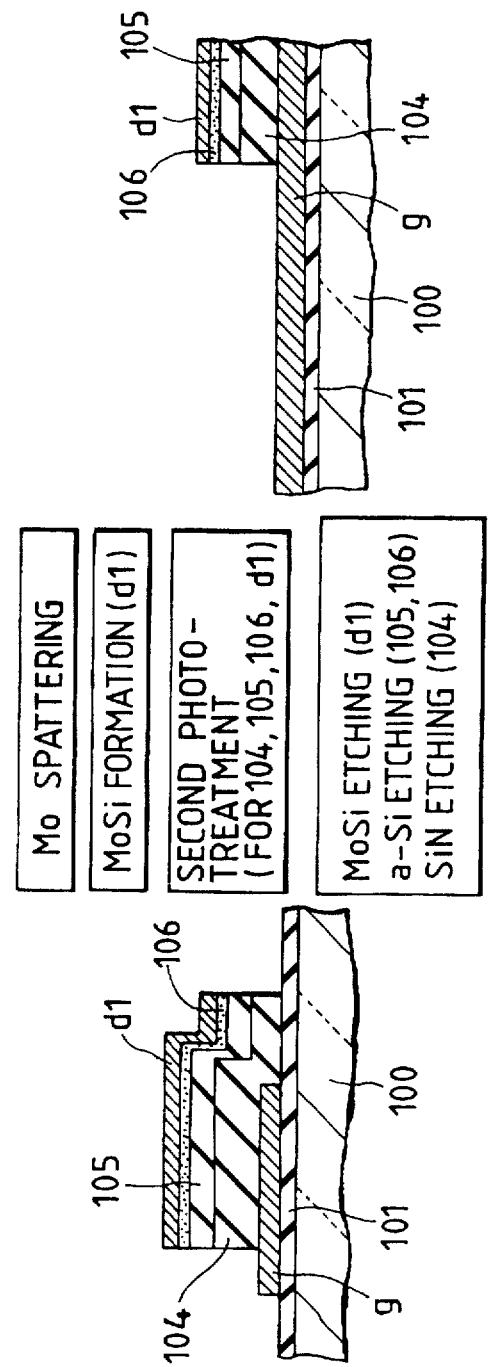
FIG. 20 is a cross-sectional view showing a pixel portion and a gate terminal portion during a sub-process of TFT substrate manufacturing and after the sub-process in Embodiment 3.

The third embodiment according to the present invention will be described, referring to FIG. 19 and FIG. 20. FIG. 19 is a cross-sectional view showing two image signal bus-lines Y adjacent to each other and an area therebetween, and corresponds to FIG. 4 in Embodiment 1. FIG. 20 is a view showing one process among the manufacturing processes for the liquid-crystal display device according to the present invention and a cross-sectional view showing a thin film transistor TFT and a gate terminal GTM portion. This figure corresponds to FIG. 14 in Embodiment 1.

In Embodiment 1, the first conductive layer d1 made of MoSi film is formed on the upper portion of the $n^+$-type semiconductor layer 106 and the side surface of the i-type semiconductor layer 105 (FIG. 4, FIG. 14). In this embodiment, the first conductive layer d1 is formed only on the upper portion of the $n^+$-type semiconductor layer 106 and not formed on the side surface of the i-type semiconductor layer 105.

In this embodiment, after successively forming an insulating film 104 made of silicon nitride, an i-type semiconductor layer 105 and an $n^+$-type semiconductor layer 106 are successively formed through a CVD method the same as in Embodiment 1, and a molybdenum (Mo) film is formed with sputtering method. Then by heat-reacting the $n^+$-type semiconductor layer and the Mo film through heat treatment in a nitrogen gas environment, a MoSi layer as the first conductive layer d1 is formed. And non-react Mo film is selectively removed. The heat treatment may be omitted as described in Embodiment 1, and the MoSi film to form the first conductive layer d1 having the same performance can be formed by heating the substrate during sputtering treatment.

Next, the first conductive layer d1 made of MoSi, the n$^+$-type semiconductor layer 106, the i-type semiconductor layer 105 and the insulating film 104 are formed in a given pattern using a second photoresist pattern. The above four layers are formed by a single etching. It is of course possible that the first conductive layer d1, the n$^+$-type semiconductor layer 106, the i-type semiconductor layer 105 are etched using an etching material, and the insulating film 104 is etched using another etching material continuously.

In the manufacturing method in this embodiment, the process for removing non-react Mo film by etching after forming the MoSi film is before the process for forming the i-type semiconductor layer 105 and the insulating film 104. On the other hand, in Embodiment 1, the process for removing non-react Mo film is performed after the process for forming the i-type semiconductor layer 105 and the insulating film 104 (at this time, a part of the scanning signal bus-line is exposed). Therefore, the conductive film g composing the scanning signal bus-line X is required to be selected from the materials which are not dissolved by the etching material for Mo (Cr in this embodiment). However, in this embodiment, when the non-react Mo is removed by a mixed acid, the scanning signal bus-line X is covered by the i-type semiconductor layer 105 and the insulating film 104 formed of silicon nitride which are not etched by the etching material for Mo in principle. Therefore, the scanning signal bus-line can be made of the same material as the metal forming silicide of the first conductive layer d1. Since the resistivity of Mo is approximately one half as small as that of Cr, by using Mo, the resistance of the scanning signal bus-line can be decreased to one-half, and transmitting speed of the scanning signal can be increased. Therefore, an improved image display can be realized in a liquid-crystal display device having a larger screen than conventional units.

The inventors have classified the causes of point faults which are causes of failure of liquid-crystal display devices. As a result, it is clarified that in a case where the surface to be applied with the photoresist is metal, there are few point faults since the remaining resist after photo-treatment process is small; and in a case where the surface to be applied with the photoresist is semiconductor, there are many point faults. In general, metallic surfaces are more hydrophobic than semiconductor surfaces. Therefore, it can be considered that the remainder on a metallic surface is easily removed in a washing process for resist removing.

In this embodiment, the TFT substrate of the liquid-crystal display device is manufactured through four times of photo-treatment processes the same as in the aforementioned embodiments.

In this embodiment, before forming the n$^+$-type semiconductor layer 106, the first conductive layer d1 made of MoSi layer is formed and photoresist is applied on it to be processed. The MoSi layer has hydrophobic properties as good as metals and better than semiconductors. Therefore, point faults can be decreased.

(Embodiment 4)

Figure 21:
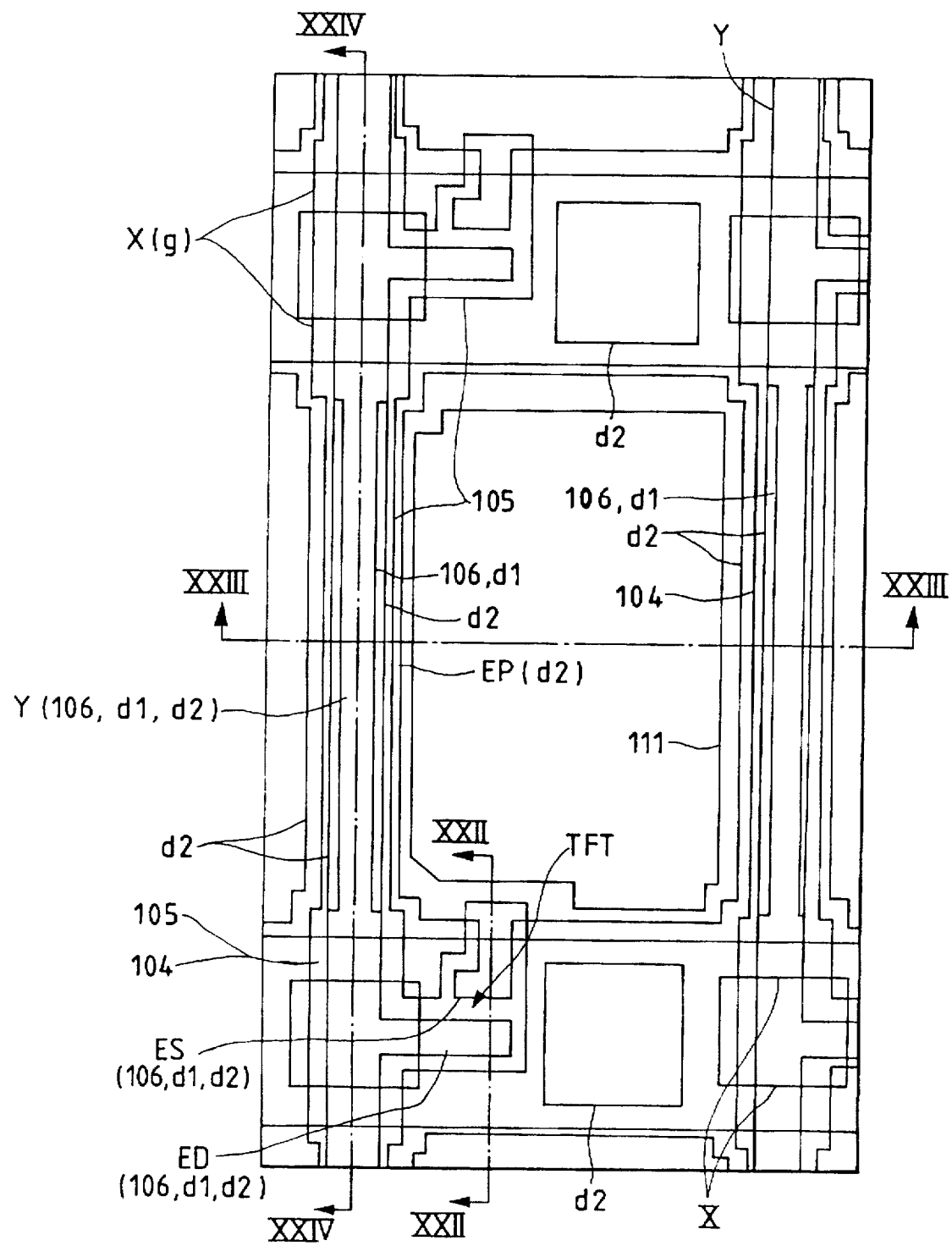
FIG. 21 is a plan view showing the patterns in the layers of a pixel and its vicinity on a TFT substrate in Embodiment 4.
Figure 22:
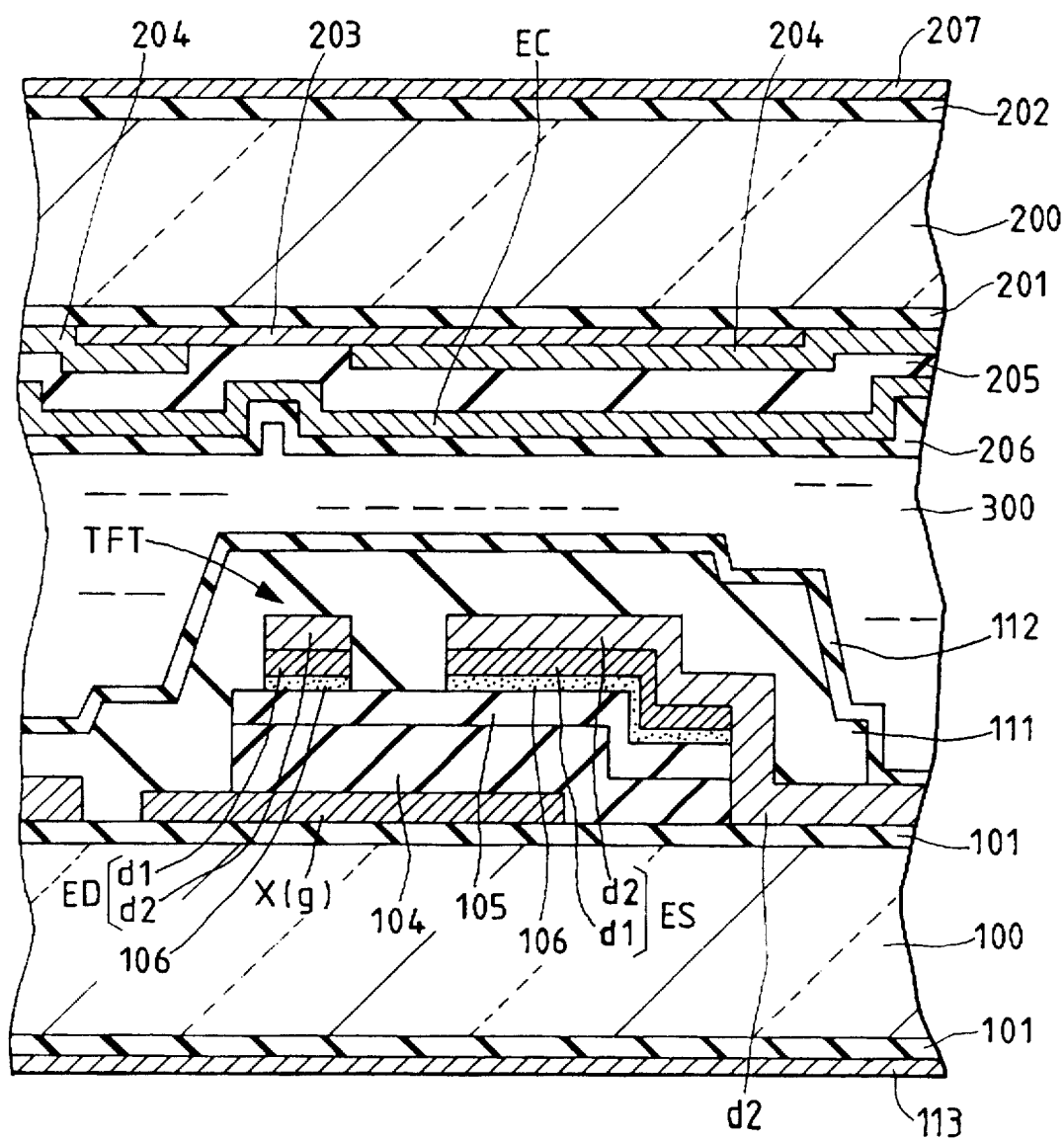
FIG. 22 is a cross-sectional view being taken on the plane of the line XXII—XXII in FIG. 21.
Figure 23:
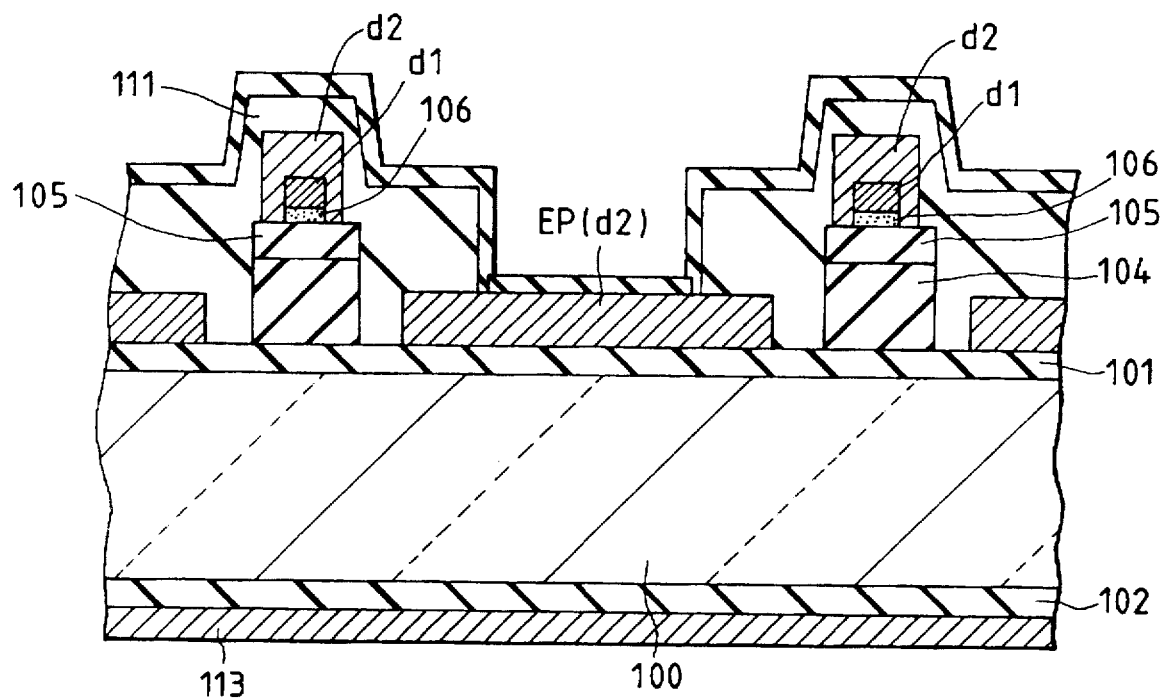
FIG. 23 is a cross-sectional view being taken on the plane of the line XXIII—XXIII in FIG. 21.
Figure 24:
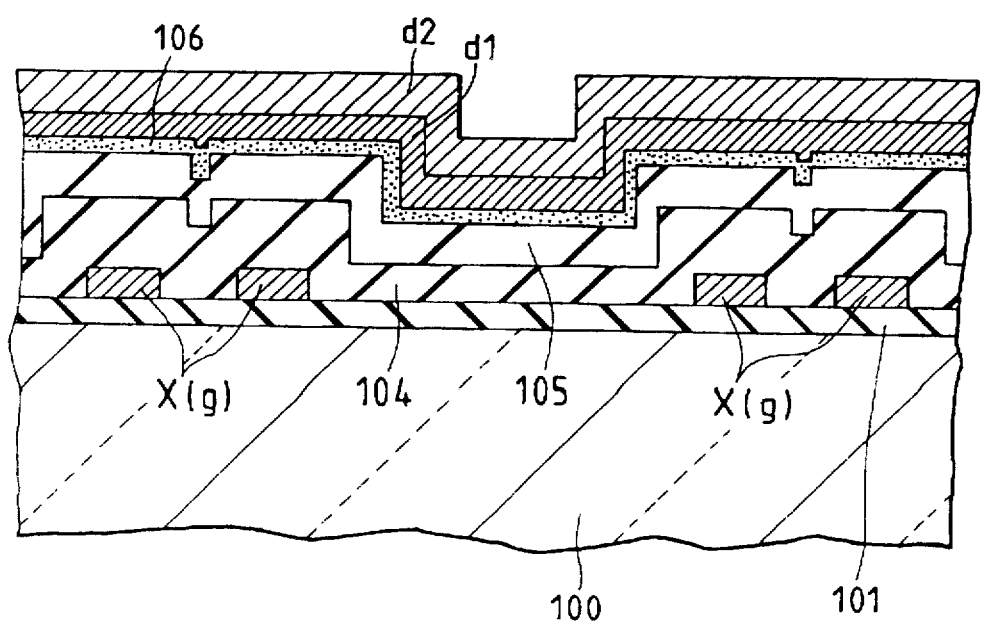
FIG. 24 is a cross-sectional view being taken on the plane of the line XXIV—XXIV in FIG. 21.

The fourth embodiment according to the present invention will be described, referring to FIG. 21 to FIG. 24. FIG. 21 is a plan view showing a pixel on a TFT substrate in a liquid-crystal display device in this embodiment. FIG. 22 is a cross-sectional view being taken on the plane of the line XXII—XXII in FIG. 21. FIG. 23 is a cross-sectional view being taken on the plane of the line XXIII—XXIII in FIG. 21. FIG. 24 is a cross-sectional view being taken on the plane of the line XXIV—XXIV in FIG. 21. In the following, the same description in Embodiments 1 to 3 will be omitted.

FIG. 22 is a cross-sectional view showing the portion of a thin film transistor TFT. A source electrode ES and a drain electrode ED are composed of the first conductive film d1 contacting to the n$^+$-type semiconductor layer 106 (n$^+$-type amorphous silicon layer) and the second conductive film d2 formed on it.

An Mo film formed through, for example, sputtering is used for the first conductive film d1. The Mo film is used for the purpose of improved adhesive property with the n$^+$-type semiconductor layer 106. As for the first conductive film d1, a high melting point metal (Ti, Ta, W) film other than Mo film may be used and high melting point silicide (MoSi$_2$, TiSi$_2$, TaSi$_2$, WSi$_2$) film may be also used.

In this embodiment, it is preferable that the scanning signal bus-line X and the first conductive film d1 are formed with different materials from each other. This is because during processing the first conductive film there is a possibility that the scanning signal bus-line may be etched at the same time. Even when the scanning signal bus-line and the first conductive film are formed with different materials from each other, it is necessary that during processing of the first conductive film that the scanning signal bus-line is not affected, such as being etched at the same time.

In this embodiment, the first conductive film d1 is processed using the same photoresist pattern as the n$^+$-type semiconductor layer 106, the i-type semiconductor layer 105 (i-type amorphous silicon layer) and the insulating film 104 (silicon nitride). Therefore, the number of photo-treatment processes can be decreased by 2 compared to the manufacturing method where processing is performed using three photoresist patterns, for the i-type semiconductor layer 105, for the insulating film 104 and for the drain electrode ED.

The source electrode ES, the drain electrode ED and the image signal bus-line Y are constructed by forming laminated layers of the first conductive film d1 on the top layer and the second conductive film d2 made of ITO transparent conductive film, and providing the n$^+$-type semiconductor layer 106 at the bottom.

After patterning the first conductive film d1 and the second conductive film d2 using a single resist pattern, the n$^+$-type semiconductor layer 106 is removed using the resist or the first conductive film d1 and the second conductive film d2 after removing the resist as a mask. That is, the n$^+$-type semiconductor layer 106 remaining on the i-type semiconductor layer 105 is removed by self-alignment except the portions in the pattern of the first conductive film d1 and the second conductive film d2. Since at this time the n$^+$-type semiconductor layer 106 is etched such that all the thickness is removed, the i-type semiconductor layer 105 is also etched at its surface a little. The etching depth is controlled by etching time.

In the image signal bus-line Y, the first conductive film d1 (MoSi) and the second conductive film d2 (ITO transparent film) composing the source electrode ES and the drain electrode ED and the first conductive film d1 and the second conductive film d2 in the same layer, the n$^+$-type semiconductor layer 106 and the i-type semiconductor layer 105 have the function of conductance. The insulating film 104 in the lower portion of the image signal bus-line has almost the same pattern as the laminated film in the upper portion.

In this embodiment, the same as in the above embodiment, the ITO transparent conductive film used in the second conductive film d2 is used as a material for not only the pixel electrode EP but also the source electrode ES, the drain electrode ED, and the image signal bus-line.

One of the structural features of the embodiment is, as shown in FIG. 22 and FIG. 23, that in the image signal bus-line Y the second conductive film d2 covers not only the top but also the side surface of the first conductive film d1; and in the source electrode ES and a part of the drain electrode ED the second conductive film d2 does not cover the side surface of the first conductive film d1, and the first conductive film d1 and the second conductive film d2 are of the same pattern. Thereby, the length of the TFT (parameter for controlling operating current) can be accurately controlled. Further, since the width of the image signal bus-line Y can be set to be narrow, the aperture ratio of the display device can be increased and the brightness of the screen can be increased. It is no problem in a large screen liquid-crystal display device having large pixels that the first conductive film d1 and the second conductive film d2 have nearly the same pattern.

Since the above feature can prevent the line fault due to the structure of not completely covering the gate electrode with an insulating film as shown in FIG. 22, it is necessary to increase the real distance between the drain electrode ED placed in the position crossing with the scanning signal bus-line X and the i-type semiconductor layer 105, the insulating film 104.

Another structural feature of the embodiment will be described, referring to FIG. 21, FIG. 23 and FIG. 24. As shown in FIG. 21, the i-type semiconductor layer 105 and the insulating film 104 are formed in the lower layer portion of the image signal bus-line Y, the drain electrode ED and the source electrode ES in a pattern connecting to one another, and especially are formed in such a manner as to connect to the adjacent scanning signal bus-line X and along the image signal bus-line Y. The i-type semiconductor layer 105 and the insulating film 104 are not formed so that the pattern passes across the image signal bus-line in the width direction, and the out-line of the pattern is formed as to pass across the scanning signal bus-line X as shown in FIG. 21.

The effect of these structural features will be described in detail below. FIG. 23 is a cross-sectional view showing the adjacent two image signal bus-lines and the area therebetween. The second conductive film d2 (ITO transparent conductive film) composing the image signal bus-line Y is formed on the laminated film of the first conductive film d1 made of MoSi and the n$^+$-type semiconductor layer 106 in the middle portion in the width direction of the image signal bus-line Y, and is formed on the i-type semiconductor layer 105 on both sides. The electric resistivity of ITO transparent conductive film formed on a semiconductor layer is lower than that formed on a glass substrate. And the ITO transparent conductive film formed on a semiconductor layer has large crystal grains which are easy to wet-etch. Therefore, by the structure of the image signal bus-line described above, it can be realized to lower the resistance of the image signal bus-line and to decrease the etching remainder (thereby decreasing point faults).

In the area where the scanning signal bus-line X crosses over the source electrode ES and the drain electrode ED, the distance between the out-line of the i-type semiconductor layer 105 and the out-lines of the source electrode ES and the drain electrode ED is large.

Therefore, the amount of the remainder produced during processing can be decreased, and occurrence of the line fault due to short-circuiting between the scanning signal bus-line X and the image signal bus-line Y can be decreased.

As shown in the cross-sectional structural view of FIG. 24, the image signal bus-line includes the second conductive film d2 (ITO transparent conductive film) and the first conductive film d1 (Cr), and the n$^+$-type semiconductor layer 106, the i-type semiconductor layer 105 and the insulating film 104 are formed in its lower portion. Therefore, the step to be climbed over by the image signal bus-line Y is only the scanning signal bus-line X. Thereby, the number of the steps to be climbed over by the image signal bus-line Y is small compared to that in a case where the i-type semiconductor layer 105 is formed in an island-shape only in the crossing portion of the scanning signal bus-line X and the image signal bus-line Y, and consequently the probability of occurrence of line breakage in the image signal bus-line is decreased. Since the n$^+$-type semiconductor layer 106 and the first conductive film d1 made of high melting point metal (Cr in the embodiment) form silicide, the adhesive force between them is increased and the probability of the occurrence of line breakage is decrease In this embodiment, as in Embodiment 2, the image signal bus-line Y does not have a Cr film and has a structure containing the semiconductor layers (i-type semiconductor layer 106 and n$^+$-type semiconductor layer 106) and the second conductive film d2 formed of the ITO transparent conductive film, and the reflection ratio in the image signal bus-line portion is substantially decreased. As the result, excellent image quality can be attained such that the contrast is improved, and images of external objects or light sources are not projected in the screen.

The manufacturing method of the TFT substrate 10 of the liquid-crystal display device described above will be described below, referring to FIG. 25 to FIG. 27. In these figures, the flows of sub-processes composing each of the processes are indicated in the middle of the figure, and the cross-sectional shape of the pixel portion in each of the processes (corresponding to FIG. 22) is shown in the left hand side, and the cross-sectional shape of the vicinity of the gate terminal portion GTM in each of processes is shown in the right hand side. Each of these figures is classified corresponding to each of the photo-treatments, and the cross-sectional view of each process shows the state with the photoresist removed after completion of the photo-treatment process. Since the process for forming the scanning signal bus-line X (FIG. 12) and the process for forming the passivation film 111 (FIG. 16) are the same as in Embodiment 1, these are omitted here.

Figure 25:
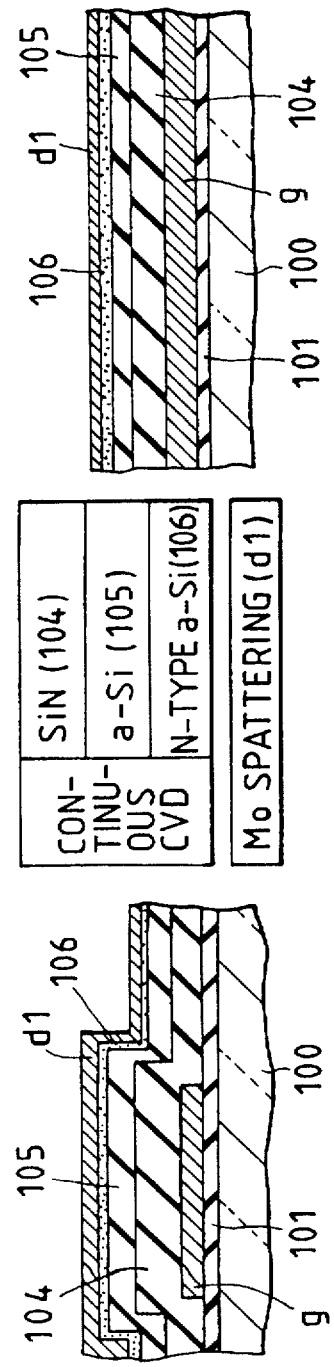
FIG. 25 is a cross-sectional view showing a pixel portion and a gate terminal portion during a sub-process of TFT substrate manufacturing and after the sub-process in Embodiment 4.

After forming the scanning signal bus-line by processing the Cr film (FIG. 12), the silicon nitride film (104) is formed using a plasma CVD apparatus, and further the i-type amorphous silicon film (105), the n$^+$-type amorphous silicon film (106) are formed using the same apparatus. These steps of film forming are performed by using the same apparatus and different reaction cambers successively. Then the first conductive film d1 made of Mo is formed through, for example, sputtering (FIG. 25).

After forming a mask by photo-treatment (second photo-treatment), the Mo film is etched with a mixed acid liquid. At this time, the Mo film is side-etched in the lateral direction from the edge portion of the resist similar to the tapering process of a silicon layer in dry etching which will be described later.

Then, the n$^+$-type amorphous silicon film and the i-type amorphous silicon film are etched. Further, the silicon nitride film is also etched. Of course, it is possible to continuously etch the n$^+$-type amorphous silicon film, the i-type amorphous silicon film and the silicon nitride film.

Figure 26:
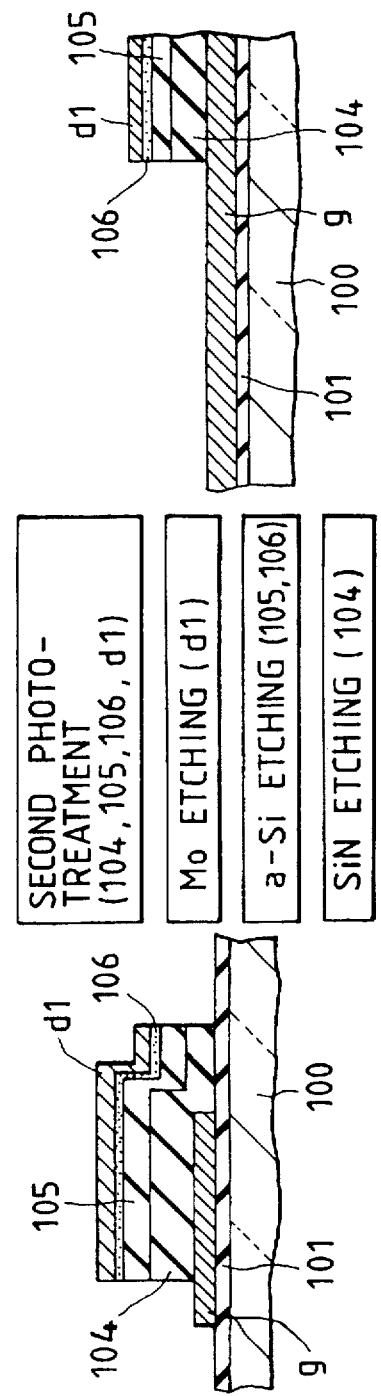
FIG. 26 is a cross-sectional view showing a pixel portion and a gate terminal portion during a sub-process of TFT substrate manufacturing and after the sub-process in Embodiment 4.

During this time, the Mo film is side-etched by 3 μm from the edge of the plan pattern of the photoresist, the i-type amorphous silicon film 105 is side-etched approximately by 1.5 μm, and the edge portion is formed in a normal taper-shape. As described above, the manufacturing process of this embodiment is characterized by continuously etching the Mo film or the three layer laminated film (silicon nitride film, n⁺-type amorphous silicon film and the i-type amorphous silicon film) (FIG. 26).

Next, the second conductive film d2 made of an ITO transparent conductive film is formed by sputtering.

After forming a mask by photo-treatment (third photo-treatment), the second conductive film d2 is selectively etched. Then, the Mo film is etched using the second conductive film d2 as a mask.

Figure 27:
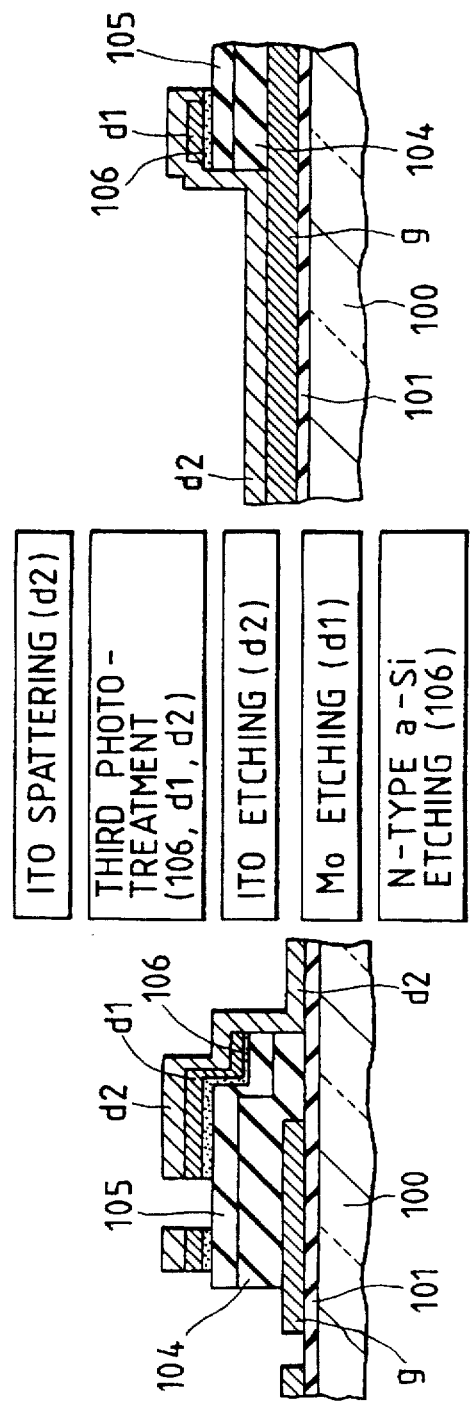
FIG. 27 is a cross-sectional view showing a pixel portion and a gate terminal portion during a sub-process of TFT substrate manufacturing and after the sub-process in Embodiment 4.

Next, by etching the n⁺-type amorphous silicon film, the n⁺-type amorphous silicon film between the source electrode ES and the drain electrode ED is selectively removed. In the same process, the uppermost layers of the gate terminal GTM, the drain terminal DTM, the pixel electrode EP and the image signal bus-line Y are formed (FIG. 27).

The processes following these are the same as in Embodiment 1.

In this embodiment, the TFT substrate of the liquid-crystal display device is manufactured through four times of photo-treatment processes the same as in the aforementioned embodiments, such that the number of processes can be decreased.

According to the embodiment, it is possible to provide a liquid-crystal display device and a manufacturing method therefor which is high in production yield, and low in production cost.

(Embodiment 5)

Figure 28:
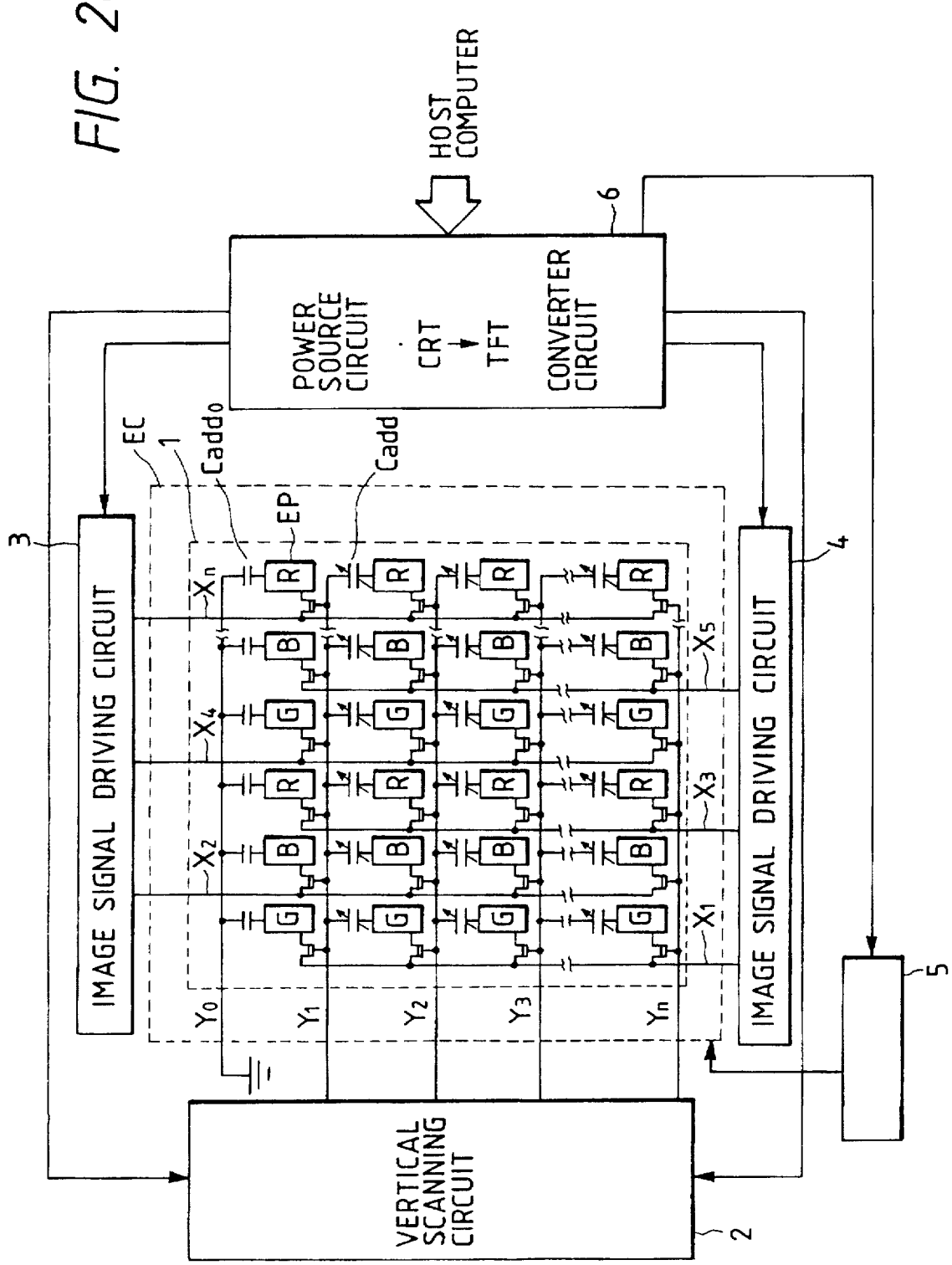
FIG. 28 is a schematic circuit diagram of a color liquid-crystal display device of active matrix type in Embodiment 5.

FIG. 28 is a schematic circuit diagram of a color liquid-crystal display device of active matrix type in this embodiment.

In FIG. 28, an active matrix array 1 comprises a plurality of scanning signal bus-lines $Y_1, Y_2, \ldots, Y_n$ spaced at a given distance extending in a first direction (shown as a lateral direction in the figure), an electrode $Y_0$ for storage capacitors $C_{add}$ arranged in the precedent row to the scanning signal bus-line $Y_1$ spaced a certain distance from and parallel to the scanning signal bus-line $Y_1$, a plurality of image signal bus-lines $x_1, x_2, \ldots, X_n$ spaced at a given distance extending in a second direction (shown as a vertical direction in the figure) intersecting with the scanning signal bus-lines $Y_1, Y_2, \ldots$, thin film transistors TFT placed near the intersecting points of the scanning signal bus-lines and the image signal bus-lines having the gate electrodes connected to the scanning bus-lines and having the drain electrodes connected to the image signal bus-lines, a pixel electrode connected to the source electrode of the thin film transistor placed in each of the areas determined by the adjacent two scanning signal bus-lines and the adjacent two image signal bus-lines, storage capacitors $C_{add}$ composed of variable capacitor elements connected between each of the pixel electrodes and a scanning signal bus-line in the precedent row to a scanning signal bus-line to which said pixel electrodes are connected through the thin film transistors, and storage capacitors $C_{add0}$ composed of fixed capacitor elements connected between the pixel electrodes EP placed between the electrode $Y_0$ for the storage capacitors $C_{add}$ and the scanning signal bus-line $Y_1$ and the electrode $Y_0$ for the storage capacitors $C_{add}$. The letter EC denotes counter electrodes which are arranged facing the pixel electrodes in the matrix array 1 through a liquid-crystal layer. The numeral 2 is a vertical scanning circuit for driving the scanning signal bus-lines $Y_1, Y_2, \ldots, Y_n$. The numerals 3 and 4 are image signal driving circuits placed at both sides of the matrix array 1 in the second direction for driving the image signal bus-lines $X_1, X_2, \ldots, X_n$. The numeral 5 is a counter electrode voltage control circuit to apply a given voltage to the counter electrodes EC. The numeral 6 is a circuit to generate driving signals for various circuits using signals from a host computer. The letters R, G, B attached to the pixel electrodes indicate the colors, red, green, blue, of the pixel electrodes.

Figure 29:
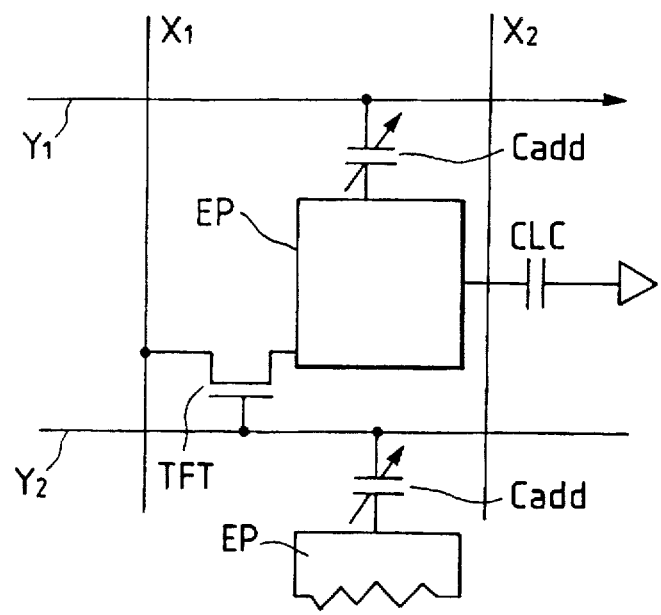
FIG. 29 is a schematic enlarged circuit diagram showing a part of FIG. 28.

The operation of the active matrix array 1 in FIG. 28 will now be described, referring to an enlarged view in FIG. 29. The capacitance of the storage capacitor $C_{add}$ becomes small during the period when the scanning signal bus-line $Y_1$ to which the storage capacitor is connected is selectively driven, and becomes large during other periods, for example, when the scanning signal bus-line $Y_2$ is selectively driven. During the period when the scanning signal bus-line $Y_1$ is selectively driven, the thin film transistor TFT for writing-in to the storage capacitor $C_{add}$ is in a holding period when there is no effect of parasitic capacitance. Therefore, it is no problem that the capacitance of the storage capacitor is small. On the contrary, by decreasing the capacitance connecting to the scanning signal bus-line, there is an effect to make the scanning speed fast by lessening the delay n the scanning signal voltage pulse. Next, during the period when the scanning signal bus-line $Y_2$ is selectively driven, since the capacity of the storage capacitor becomes large, the effect of the parasitic capacitance is decreased. As described above, if a liquid-crystal display device of active matrix type is added the storage capacitors $C_{add}$, it creates a disadvantage accompanying to the storage capacitor in that the delay in a scanning signal voltage pulse is too large to apply to a large sized or high resolution screen display device. However, it is possible to eliminate this disadvantage by constructing the storage capacitors using variable capacitance elements having characteristics such that the capacitance of the storage capacitor $C_{add}$ becomes small during the period when the scanning signal bus-line is selectively driven, and becomes large during other periods.

The capacitance of the storage capacitor $C_{add0}$ connected to the electrode $Y_0$ for storage capacitor $C_{add}$ may be nearly the same value of the maximum capacitance of the storage capacitor $C_{add}$, since the electrode $Y_0$ is not scanned and is kept at a constant voltage, for example ground voltage, lower than the voltage of the pixel electrode EP. Thereby, the effect of the parasitic capacitance on the thin film transistor connected to the scanning signal bus-line $Y_1$ can be decreased.

In order to decrease the burden on the TFT or decrease cost of an image signal bus-line driver, it is generally employed to drive the counter electrode with alternating current and lower the image signal voltage. Since the quality of image in this method is affected with the value of the product of the capacity and the resistance of an electrode connected to the scanning signal bus-line, and the resistance and capacitance of the counter electrode, it has been considered that the resistances of the scanning signal bus-line and the counter electrode must be lowered when the storage capacitor $C_{add}$ is employed. However, according to the present invention, since the capacitance of the capacitor $C_{add}$ decreases during the period of driving the scanning signal electrode, the product of the capacitance and the electrode resistance connected to the scanning signal bus-line becomes small and, therefore, it can be realized to decrease the image signal voltage without lowering the resistance of the scanning signal bus-line.

Figure 31:
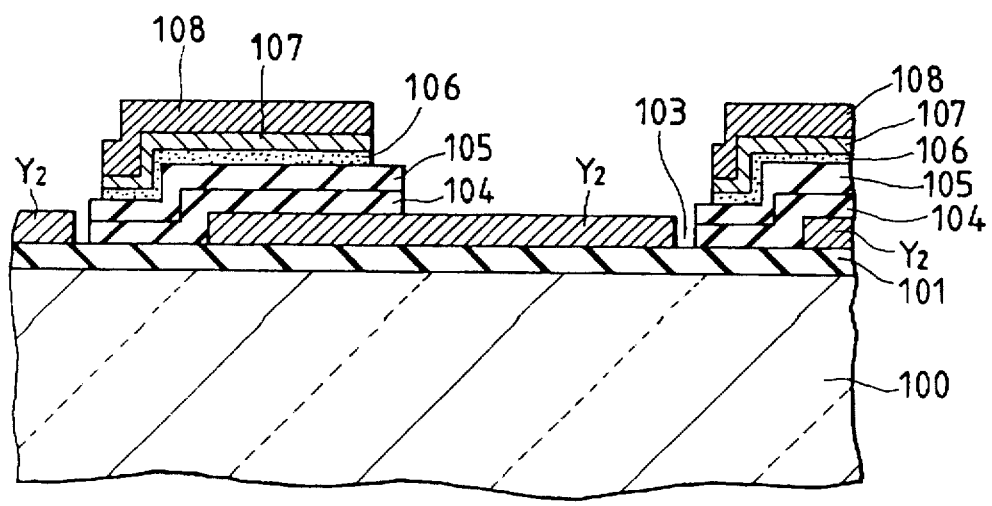
FIG. 31 is a cross-sectional view being taken on the plane of the line XXXI—XXXI in FIG. 30.
Figure 30:
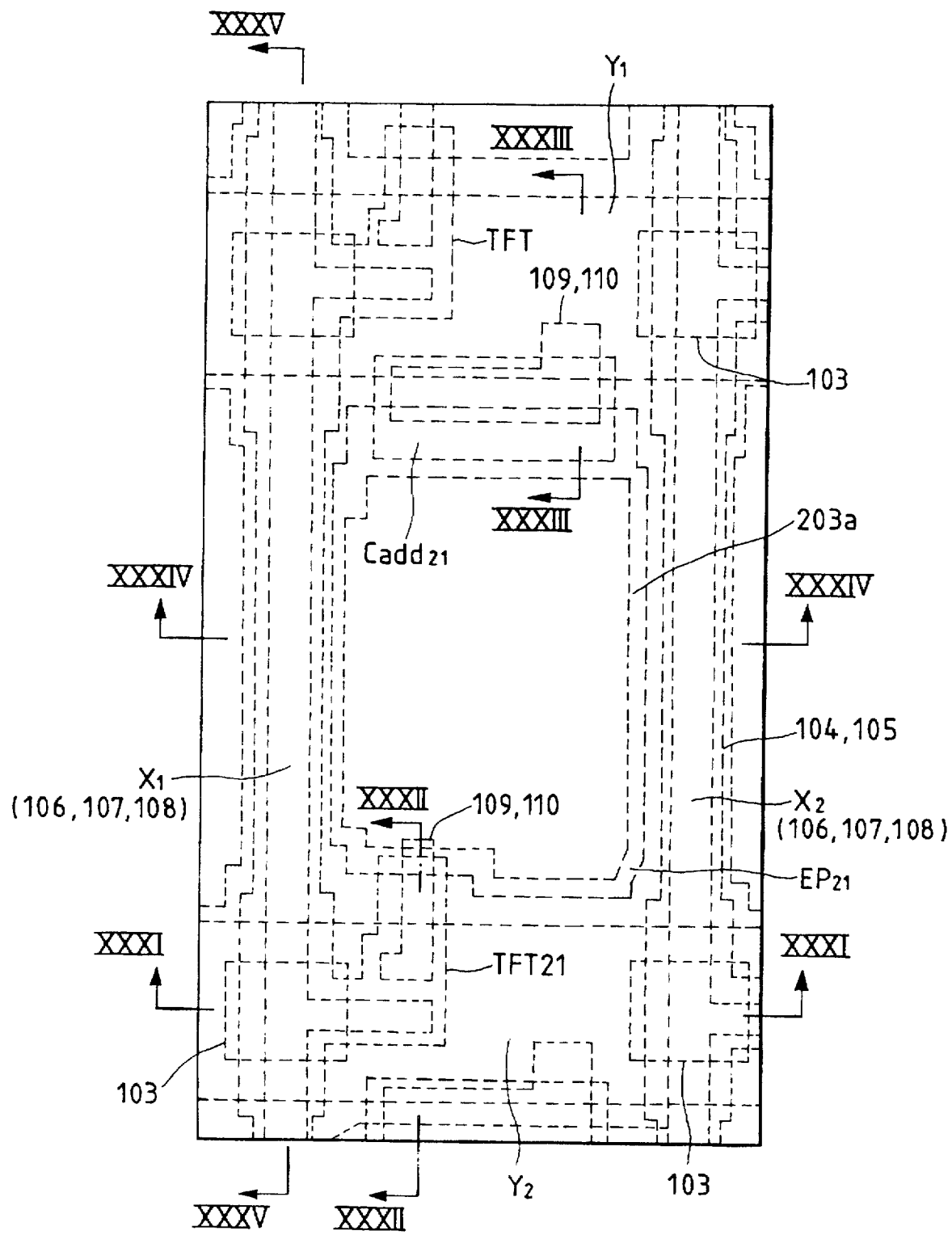
FIG. 30 is a schematic plan view showing an embodiment of an active matrix array used in a liquid-crystal display device in accordance with the present invention.
Figure 32:
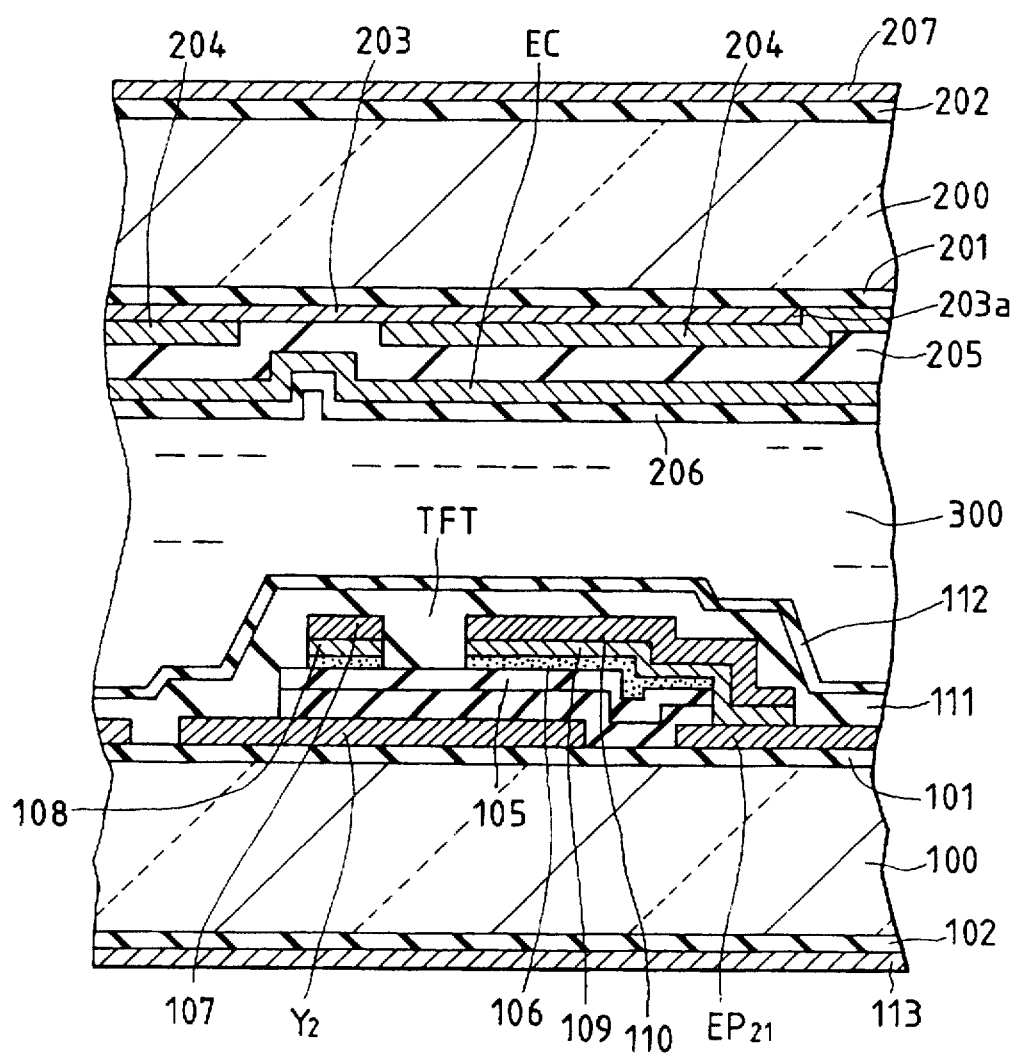
FIG. 32 is a cross-sectional view being taken on the plane of the line XXXII—XXXII in FIG. 30.
Figure 33:
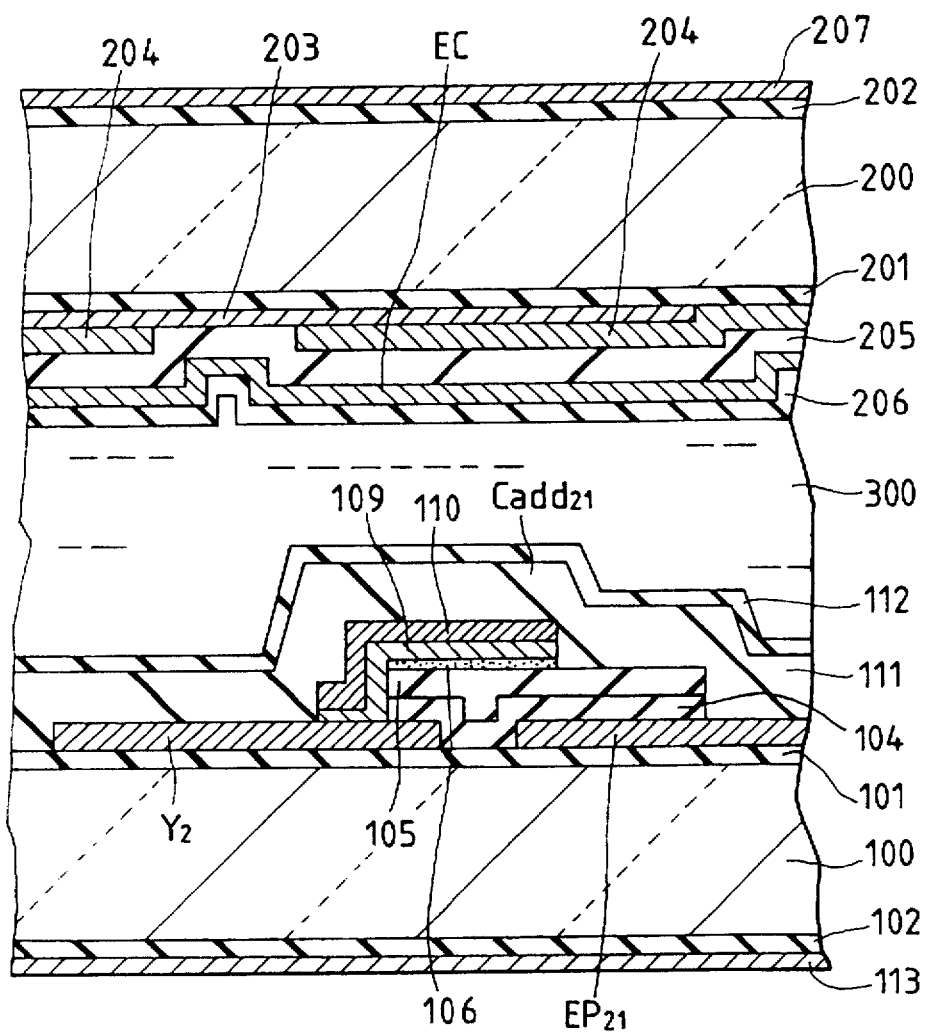
FIG. 33 is a cross-sectional view being taken on the plane of the line XXXIII—XXXIII in FIG. 30.
Figure 34:
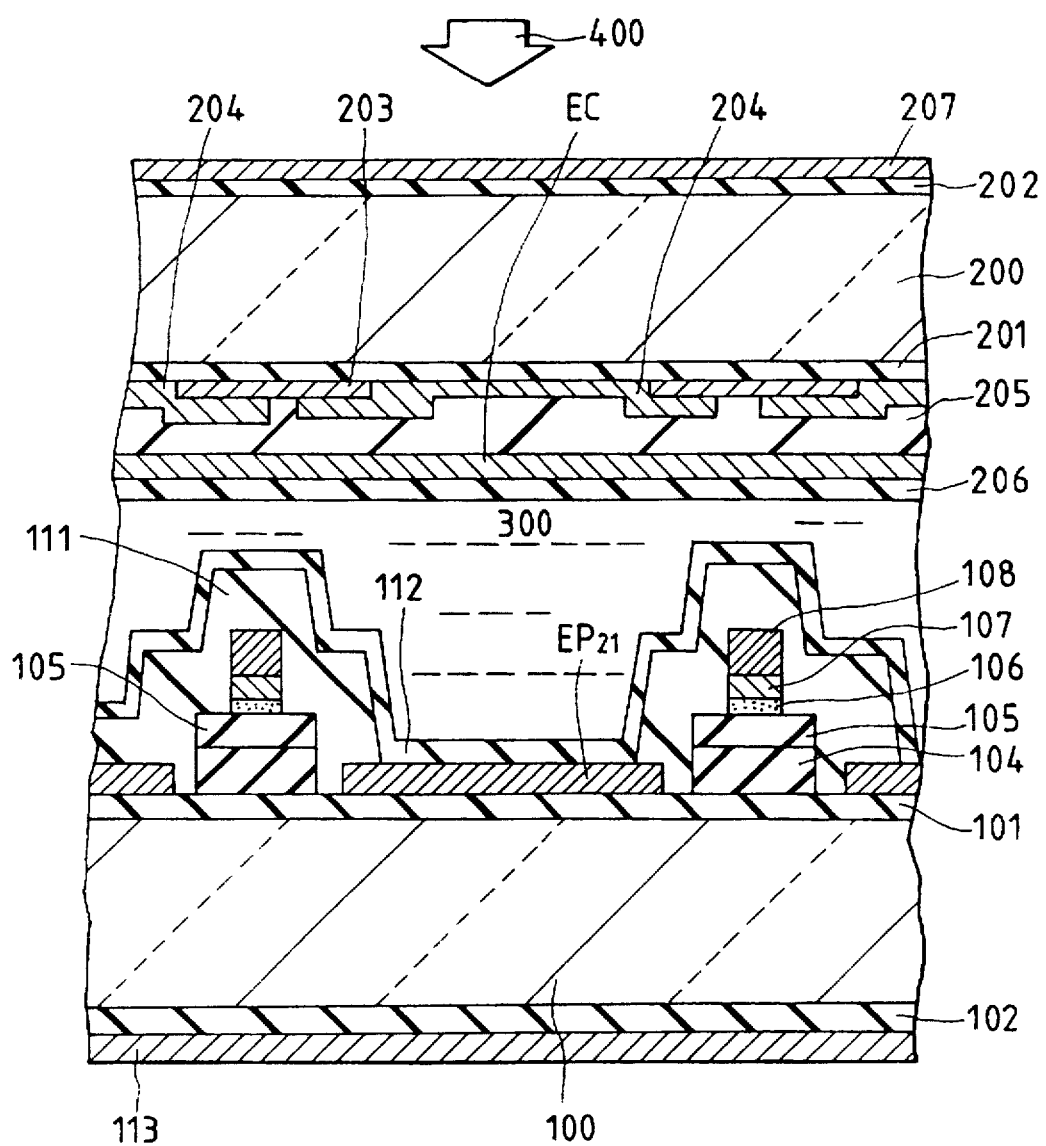
FIG. 34 is a cross-sectional view being taken on the plane of the line XXXIV—XXXIV in FIG. 30.
Figure 35:
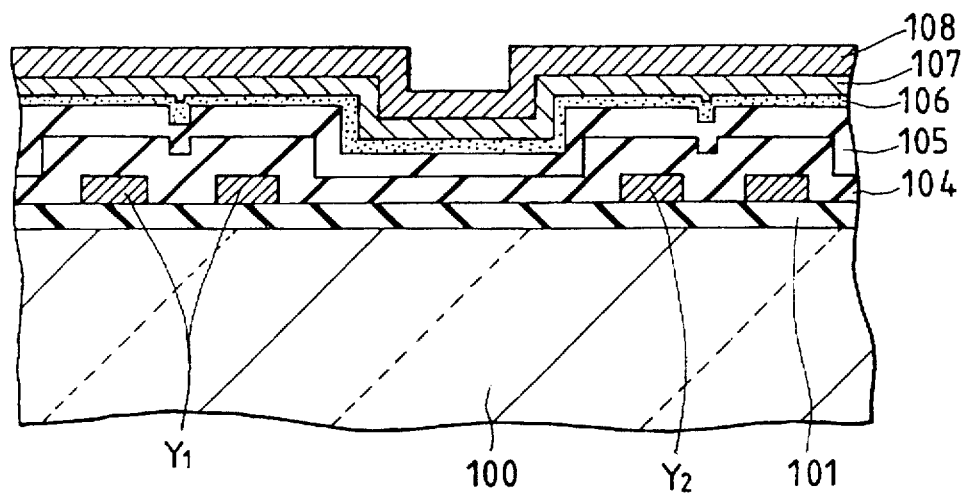
FIG. 35 is a cross-sectional view being taken on the plane of the line XXXV—XXXV in FIG. 30.

FIG. 30 is a plan view showing the structure of a pixel in an active matrix array and its vicinity. FIG. 31 is a cross-sectional view being taken on the plane of the line XXXI—XXXI in FIG. 30. FIG. 32 is a cross-sectional view being taken on the plane of the line XXXII—XXXII in FIG. 30. FIG. 33 is a cross-sectional view being taken on the plane of the line XXXIII—XXXIII in FIG. 30. FIG. 34 is a cross-sectional view being taken on the plane of the line XXXIV—XXXIV in FIG. 30. FIG. 35 is a cross-sectional view being taken on the plane of the line XXXV—XXXV in FIG. 30.

In FIG. 30 to FIG. 35, the symbols $Y_1$ and $Y_2$ are scanning signal bus-lines made of a metal selected from the group consisting of aluminum, chromium, tantalum and molybdenum placed on a silicon oxide film 101 extending in one direction spaced a given distance in the vertical direction from the one direction and having an opening 103 in the portion to be crossed over with image signal bus-lines $X_1$ and $X_2$. The symbol EP21 is a pixel electrode composed of ITO transparent conductive film formed in the area surrounded by the scanning signal bus-lines $Y_1$ and $Y_2$ and the image signal bus-lines $X_1$ and $X_2$. The numeral 104 is an insulating film made of, for example, silicon nitride formed on the silicon oxide film 101 and a part of the insulating film extends to the scanning signal bus-line $Y_1$ and $Y_2$ at the pixel electrode EP21. The numeral 105 is an i-type semiconductor layer made of amorphous silicon not actively doped with impurity formed on the insulating film 104 having nearly the same pattern as the insulating film 104. The numeral 106 is an $n^+$-type semiconductor layer made of amorphous silicon doped with, for example, phosphorus formed on the selected surface of the i-type semiconductor layer 105. The laminated body of the insulating film 104, the i-type semiconductor layer 105, and the $n^+$-type semiconductor layer has a portion extending in the direction crossing at a right angle with the scanning signal bus-lines $Y_1$, $Y_2$ in the place where the image signal bus-lines $X_1$, $X_2$ are located, that is, between the adjacent pixel electrodes and a portion extending from the scanning signal bus-lines $Y_1$, $Y_2$ to the pixel electrode EP21 apart form others in an island-shape. The numerals 107 and 108 are chromium films and aluminum films having nearly the same pattern laminated on the $n^+$-type semiconductor layer 106 extending between the adjacent pixel electrodes in the direction crossing at a right angle with the scanning signal bus-lines $Y_1$, $Y_2$ and a part of them extending to the scanning signal bus-lines $Y_1$, $Y_2$, which form the image signal bus-lines $X_1$, $X_2$. The numerals 109 and 110 are laminated chromium films and aluminum films extending from the $n^+$-type semiconductor layer 106 in an island-shape formed by extending from the scanning signal bus-lines $Y_1$, $Y_2$ to the pixel electrode EP21 onto the pixel electrode EP21 or onto the scanning signal bus-lines $Y_2$, which form an electrode for one of storage capacitors $C_{add21}$ and a source electrode of the thin film transistor $TFT_{21}$. The numeral 111 is a passivation film to cover the exposed portion from silicon oxide film 101 to the aluminum films 108, 110 formed on a first insulator substrate 100, and is formed with, for example, silicon oxide film or silicon nitride having good transparency and which is moisture-proof. The numeral 112 is a first alignment film formed on the passivation film 111. The numeral 113 is a first polarizer formed on the other silicon oxide film 102 of the insulator substrate 100. With these parts, a thin film transistor array for a liquid-crystal display device is constructed.

As shown in FIG. 30, FIG. 31 and FIG. 32, the thin film transistor TFT near the crossing portion of the scanning signal bus-line and the image signal bus-line is composed of the scanning signal electrode as the gate electrode, the insulating film 104 as the gate oxide film, the i-type semiconductor layer 105 as the channel region, the $n^+$-type semiconductor layer 106 as the source/drain region, the chromium film 107 and the aluminum film 108 on the $n^+$-type semiconductor layer 106 as the drain electrode, and the chromium film 109 and the aluminum film 110 on the $n^+$-type semiconductor layer 106 as the source electrode.

As shown in FIG. 30 and FIG. 33, the storage capacitor $C_{add}$ is composed of the pixel electrode EP21, the i-type semiconductor layer 105 is formed in an island-shape through insulating film 104 on the pixel electrode EP21, the $n^+$-type semiconductor layer 106 is formed on the i-type semiconductor layer 105 so that a part is crossed over with the pixel electrode EP21, and the chromium film 109 and the aluminum film 110 are connected to the $n^+$-type semiconductor layer 106 and the scanning signal bus-line. That is, the capacitor is composed of the i-type semiconductor layer 105 and the insulating film 104 as dielectric material, the $n^+$-type semiconductor layer 106 as one of electrode, and the pixel electrode EP21 as the other electrode. When the $n^+$-type semiconductor layer 106 has a positive voltage relative to the pixel electrode EP21, the capacitor has a capacitance determined by the cross over area of the $n^+$-type semiconductor layer 106 and the pixel electrode EP21 and the thickness and the dielectric constant of the i-type semiconductor layer 105 and the insulating film 104. On the contrary, when the pixel electrode EP21 has a positive voltage relative to the $n^+$-type semiconductor layer 106, a channel is formed along the pixel electrode EP21 near the surface in the side of the insulating film 104 of the i-type semiconductor layer 105, and this acts as one electrode instead of the $n^+$-type semiconductor layer 106. As a result, a capacitor having the insulating film 104 as dielectric material is formed. The capacitance of the capacitor substantially increases since the thickness of the dielectric material is decreased and the cross over area is increased. The changing range of the capacitance can be freely determined by decreasing the cross over area of the $n^+$-type semiconductor layer 106 and the pixel electrode EP21 and increasing the cross over area of the i-type semiconductor layer 105 and the pixel electrode EP21.

Figure 36:
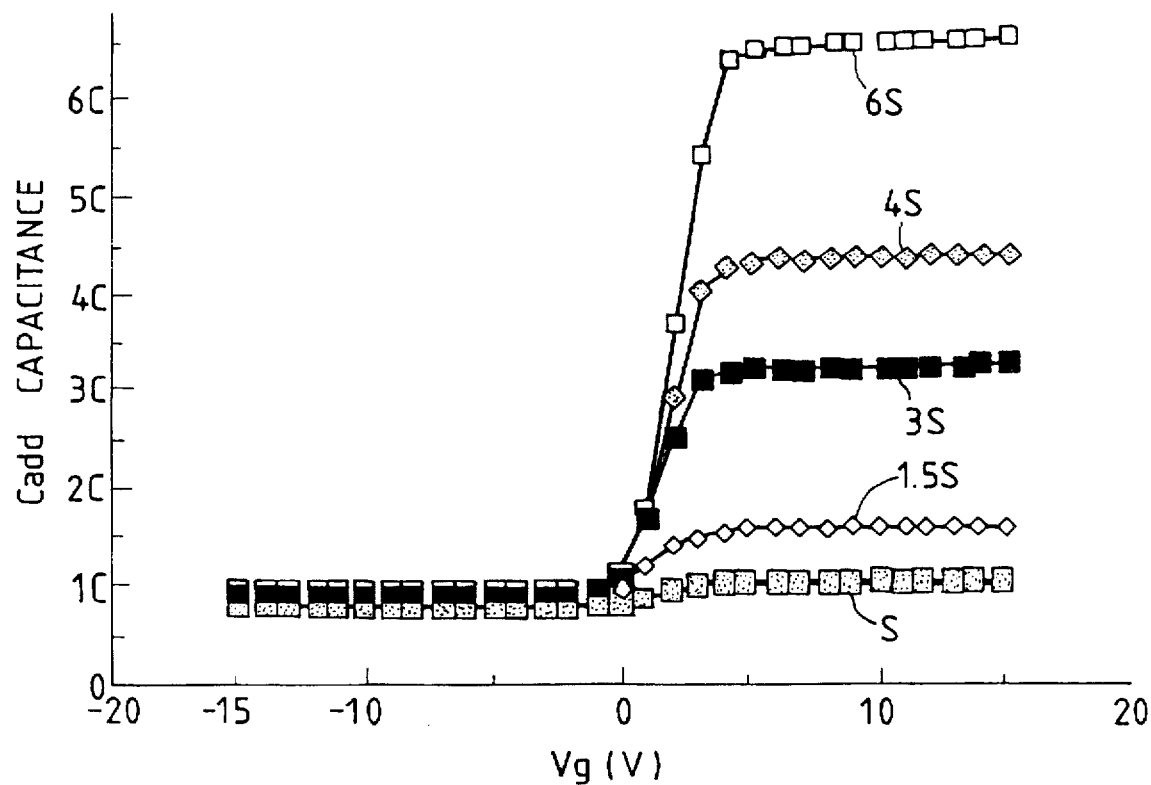
FIG. 36 is a graph showing the relationship between applied voltage and capacitance of a storage capacitor used in the present invention.

FIG. 36 shows the relationship between the voltage $V_g$, which is the voltage between the n-type semiconductor layer 106 and the pixel electrode EP21 and the capacitance of the storage capacitor $C_{add}$. In particular, FIG. 36 shows this relationship in cases of the cross over area of the i-type semiconductor layer 105 and the pixel electrode EP21 of 1.5S, 3S, 4S and 6S, where S is the cross over area of the $n^+$-type semiconductor layer 106 and the pixel electrode EP21. It can be understood from the figure that when the pixel electrode EP21 has a positive voltage relative to the i-type semiconductor layer 105, the capacitance increases as the cross over area of the i-type semiconductor layer 105 and the pixel electrode EP21 increases. Therefore, the cross over area of the i-type semiconductor layer 105 and the pixel electrode EP21 may be determined considering the magnitude of the effect of the parasitic capacitance of the thin film transistor and the aperture ratio of the pixel.

By constructing the storage capacitor $C_{add}$ in such a way, it can be realized to attain such a capacitance characteristic that the capacitance is stable and not changed by external light. That is, the storage capacitor $C_{add}$ is in a large capacitance state and the channel is formed in the i-type semiconductor layer 105 to act as one electrode while the storage capacitor $C_{add}$ is holding written-in information. Even if external light impinges on the liquid-crystal panel and reaches the i-type semiconductor layer 105 by repeating reflection, photo-conductive current induced by light does not occur since the i-type semiconductor layer 105 does not perform as a dielectric substance in the capacitor. Therefore, there is no fluctuation in voltage during a holding period of the storage capacitor $C_{add}$ due to charge leakage, and a stable displaying characteristic can be attained.

The TFT substrate for a liquid-crystal display device shown in FIG. 30 to FIG. 35 is manufactured through the following process.

(1) preparing a first insulator substrate 100 made of a transparent glass plate formed with silicon oxide films 101, 102 on the both surfaces.

(2) selectively forming the scanning signal bus-lines $Y_1, \ldots, Y_n$, and the electrode $Y_0$ for the storage capacitor $C_{add}$ on one of the silicon oxide films 101 on the first insulator substrate 100. As for the method, one is formed at a time by selective sputtering using a mask, while another is selectively etched after forming a metallic film on the whole surface of the silicon oxide film 101.

(3) forming pixel electrodes EP in the selected portions on the silicon oxide film 101. At this time, as for the method, the same as forming the scanning signal bus-lines $Y_1, \ldots, Y_n$, and the electrode $Y_0$ for the storage capacitor $C_{add}$, there are two methods. One is by selective sputtering, and the other is by selectively etching after forming a metallic film.

(4) forming the insulating film 104 and the i-type semiconductor layer 105 in the selected portions on the silicon oxide 101, the scanning signal bus-lines $Y_1, \ldots, Y_n$, and the electrode $Y_0$ for storage capacitor $C_{add}$ and the pixel electrodes EP. At this time, there are two methods. One is by selective sputtering, and the other is by selectively etching after forming a metallic film. However,the latter is preferable since positioning is accurate and number of processes is few.

(5) forming the n$^+$-type semiconductor layer 106 in the selected portions on the i-type semiconductor layer 105. At this time, the n$^+$-type semiconductor layer 106 and the i-type semiconductor layer 105 may be formed simultaneously. However, the pattern is different from that for the i-type semiconductor layer 105. Additional etching is required and, therefore, the number of processes is the same.

(6) forming chromium films 107, 109 and aluminum films 108, 110 in the selected portions on the n$^+$-type semiconductor layer 106, the scanning signal bus-lines $Y_1, \ldots, Y_n$, and the electrode $Y_0$ for storage capacitor $C_{add}$, the pixel electrodes EP and the insulating film 104. At this time, there are two methods. One is forming chromium films and aluminum films simultaneously by selective sputtering. The other is selectively etching both after forming chromium films and aluminum films. However, the latter is preferable since positioning is accurate and the number of processes is few.

With the above method, the TFT substrate for a liquid-crystal display device can be realized. According to the manufacturing method, the TFT substrate can be manufactured using five masks: a mask for patterning the scanning signal bus-lines $Y_1, \ldots, Y_n$, and the electrode $Y_0$ for storage capacitor $C_{add}$, a mask for patterning the pixel electrodes EP, a mask for patterning the insulating film 104 and the i-type semiconductor layer 105, a mask for patterning the n$^+$-type semiconductor layer 106, and a mask for patterning the chromium films and the aluminum films. That is,the TFT substrate can be manufactured through five photo-treatment processes.

Figure 37:
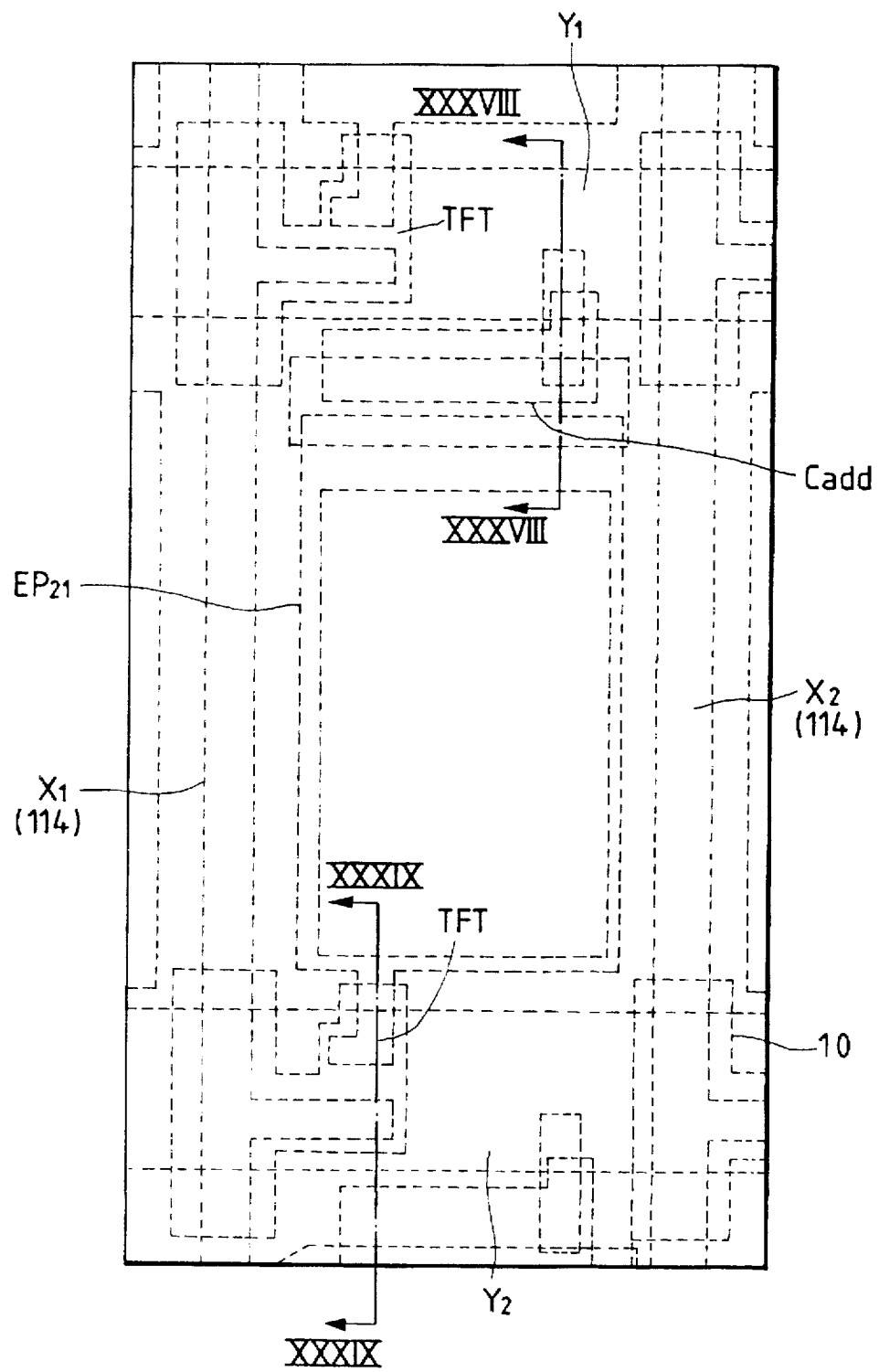
FIG. 37 is a schematic plan view showing another embodiment of an active matrix array used in a liquid-crystal display device in accordance with the present invention.
Figure 38:
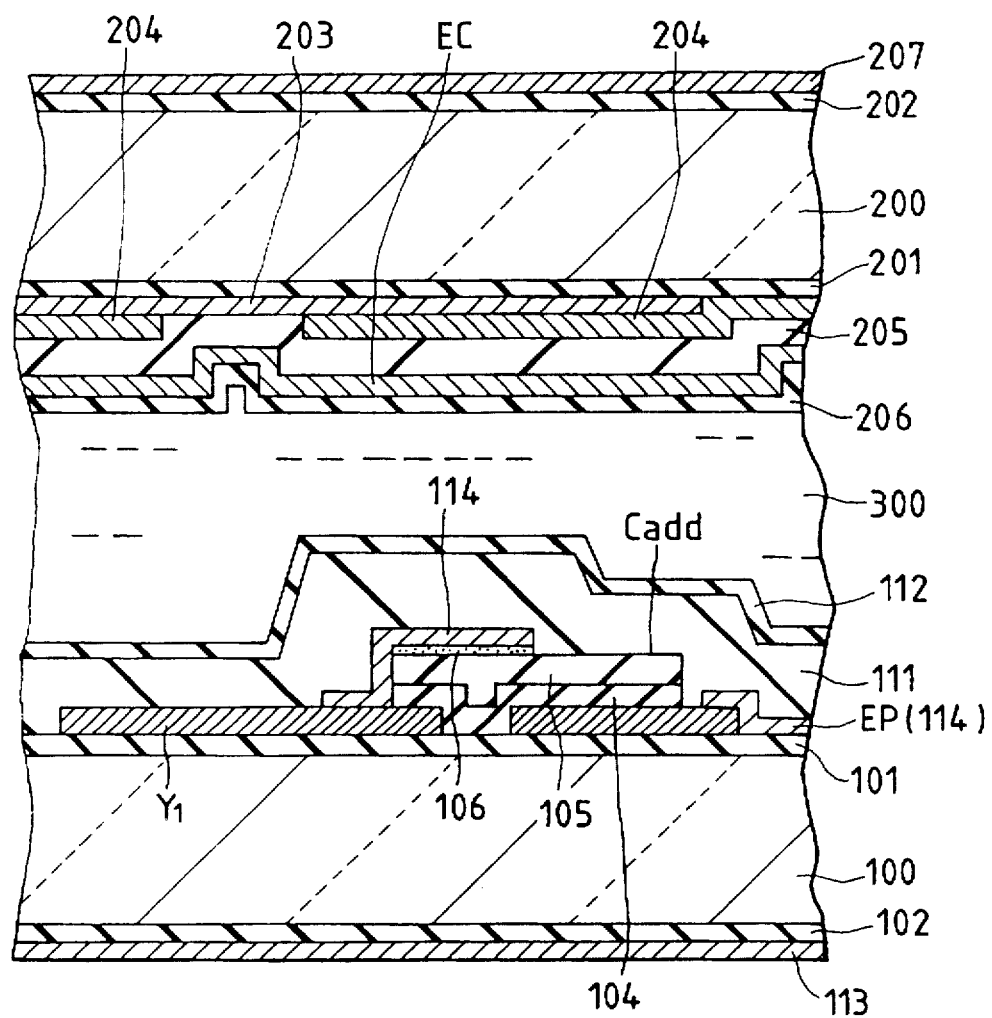
FIG. 38 is a cross-sectional view being taken on the plane of the line XXXVIII—XXXVIII in FIG. 37.
Figure 39:
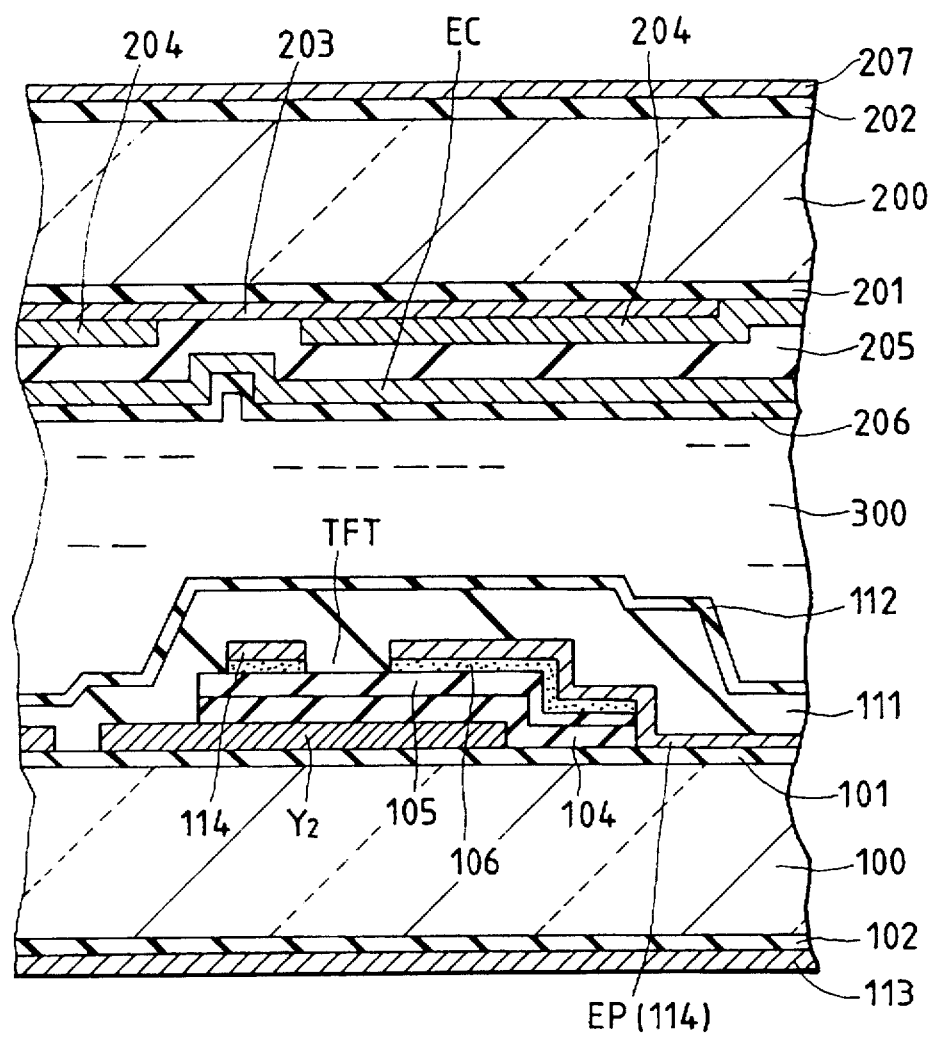
FIG.39 is a cross-sectional view being taken on the plane of the line XXXIX—XXXIX in FIG. 37.

FIG. 37 is a schematic plan view showing another embodiment of an active matrix array used in a liquid-crystal display device. FIG. 38 is a cross-sectional view being taken on the plane of the line XXXVIII—XXXVIII in FIG. 37. FIG. 39 is a cross-sectional view being taken on the plane of the line XXXIX—XXXIX in FIG. 37. The different points from the TFT substrate for a liquid-crystal display device shown in FIG. 30 to FIG. 35 are that there is no opening 103 at cross-over portions of the scanning signal bus-lines $Y_1, \ldots, Y_n$ and the electrode $Y_0$ for storage capacitor $C_{add}$ and the image signal bus-lines $X_1, \ldots, X_n$, the insulating film 104 and the i-type semiconductor layer 105 is formed not wholly under the image signal bus-lines $X_1, \ldots, X_n$, the source electrodes and the drain electrodes of the thin film transistors are formed with transparent conductive films. With this construction, there is an advantage in that the number of manufacturing processes can be decreased the same as in Embodiments 1 to 4. That is, the TFT substrate for the liquid-crystal display device shown in FIG. 37 to FIG. 39 is manufactured through the following process.

(1) preparing a first insulator substrate 100 made of a transparent glass plate formed with silicon oxide films 101, 102 on both surfaces.

(2) selectively forming the scanning signal bus-lines $Y_1, \ldots, Y_n$, and the electrode $Y_0$ for the storage capacitor $C_{add}$ on one of the silicon oxide films 101 on the first insulator substrate 100. As for the methods, one is by selective sputtering using a mask, and another is selectively etching after forming a metallic film on the whole surface of the silicon oxide film 101.

(3) forming the insulating film 104 and the i-type semiconductor layer 105 in the selected portions on the silicon oxide 101, the scanning signal bus-lines $Y_1, \ldots, Y_n$, and the electrode $Y_0$ for storage capacitor $C_{add}$, the pixel electrodes EP. At this time, there are two methods. One is by selective sputtering, and the other is by selectively etching after forming a metallic film. However the latter is preferable since positioning is accurate and the number of processes is few.

(4) forming the n$^{30}$-type semiconductor layer 106 in the selected portions on the i-type semiconductor layer 105. At this time, the n$^+$-type semiconductor layer 106 and the i-type semiconductor layer 105 may be formed simultaneously. However, the pattern is different from that for the i-type semiconductor layer 105. Additional etching is required and, therefore, the number of processes is the same.

(5) forming the pixel electrode EP, the image signal bus-lines $X_1, \ldots, X_n$, the source electrodes and the drain electrodes of the thin film transistors, the electrodes of the storage capacitors $C_{add}$ in the selected portions on the n$^+$-type semiconductor layer 106, the scanning signal bus-lines $Y_1, \ldots, Y_n$, and the electrode $Y_0$ for storage capacitor $C_{add}$, and the pixel electrodes EP and the insulating film 104 using transparent conductive film 114. At this time, there are two methods. One is forming transparent conductive film having a given pattern by selective sputtering, while the other is etching after forming the transparent conductive film.

With the above method, the TFT substrate for a liquid-crystal display device shown in FIG. 37 to FIG. 40 can be realized. According to the manufacturing method, the TFT substrate can be manufactured using four masks: a mask for patterning the scanning signal bus-lines $Y_1, \ldots, Y_n$ and the electrode $Y_0$ for storage capacitor $C_{add}$, a mask for patterning the insulating film 104 and the i-type semiconductor layer 105, a mask for patterning the n$^+$-type semiconductor layer 106, a mask for patterning the pixel electrodes EP, the image signal bus-lines $X_1, \ldots, X_n$, the source electrodes and the drain electrodes of the thin film transistors, and the electrode of the storage capacitors $C_{add}$. That is, the TFT substrate can be manufactured through four photo-treatment processes.

(Embodiment 6)

Figure 40:
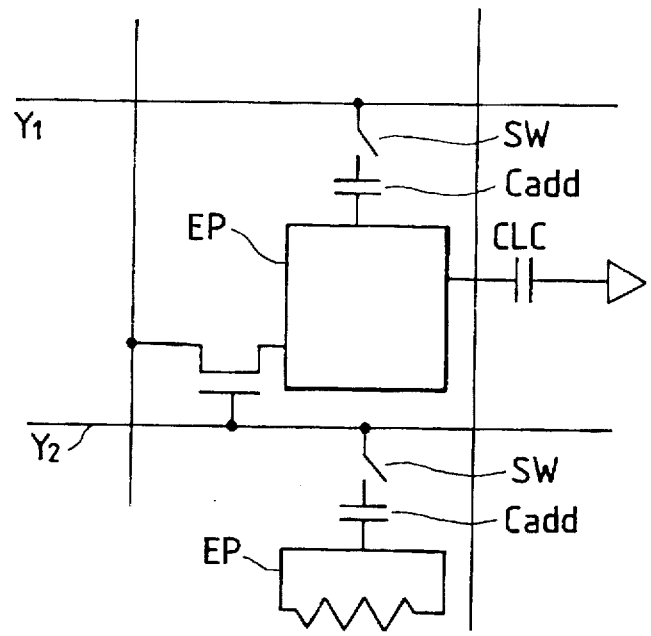
FIG. 40 is a schematic circuit diagram showing Embodiment 6 of an color liquid-crystal display device of active matrix type in accordance with the present invention.

FIG. 40 is a schematic circuit diagram showing a further embodiment of a liquid-crystal display device of active matrix type. The different points from the embodiment shown in FIG. 28 and FIG. 29 are that a switch SW is interposed between the storage capacitor $C_{add}$ and the scanning signal bus-line $Y_1$ to which the storage capacitor is connected, and the storage capacitor $C_{add}$ is a fixed capacitance element. The switch SW is operated such that the switch SW is in OFF state during the period of selectively driving the scanning signal bus-line $Y_1$ to which the storage capacitor is connected, and is in On state during another period, for example, while the scanning signal bus-line $Y_2$ is selectively driven. Thereby, during the period of driving the selected scanning signal bus-line, the storage capacitor $C_{add}$ is cut off from the scanning signal bus-line $Y_1$ and the capacitance becomes zero, and during the other period the storage capacitor $C_{add}$ is connected to the scanning signal bus-line. Therefore, when the scanning signal bus-line is scanned, the delay in a scanning signal voltage pulse due to the storage capacitor $C_{add}$, and the effect of parasitic capacitance on the thin film transistor can be removed. This effect, particularly, the effect that the capacitance becomes nearly zero during the period of driving the selected scanning signal bus-line, is large compared to the embodiment shown in FIG. 28 and FIG. 30.

In this embodiment, the liquid-crystal panel is not wholly shown. It will be understood by those skilled in the art that when the panel is constructed in such a construction shown in FIG. 28, the storage capacitor $C_{add}$ to be connected to the electrode for storage capacitor $C_{add}$ is directly connected not through the switch, or when the storage capacitor is connected through the switch, the switch does not performed ON/OFF control.

In this embodiment, since the storage capacitor is the fixed capacitance element, there is no need to use semiconductor as the dielectric material, and insulating material can be used. Therefore, occurrence of photo-conductive current due to incidence of external light is eliminated, and a stable display characteristic can be realized.

(Embodiment 7)

Figure 41:
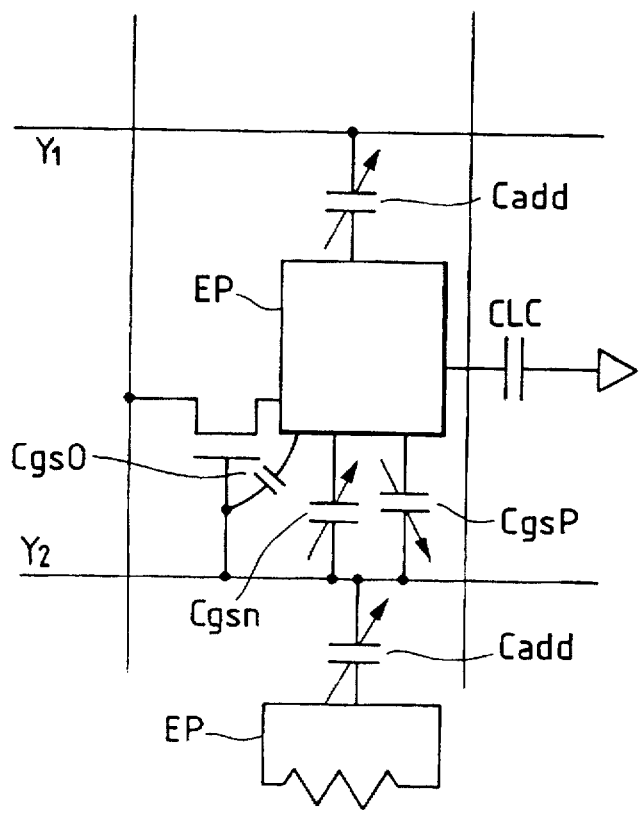
FIG. 41 is a schematic circuit diagram showing Embodiment 7 of an color liquid-crystal display device of active matrix type in accordance with the present invention.
Figure 42:
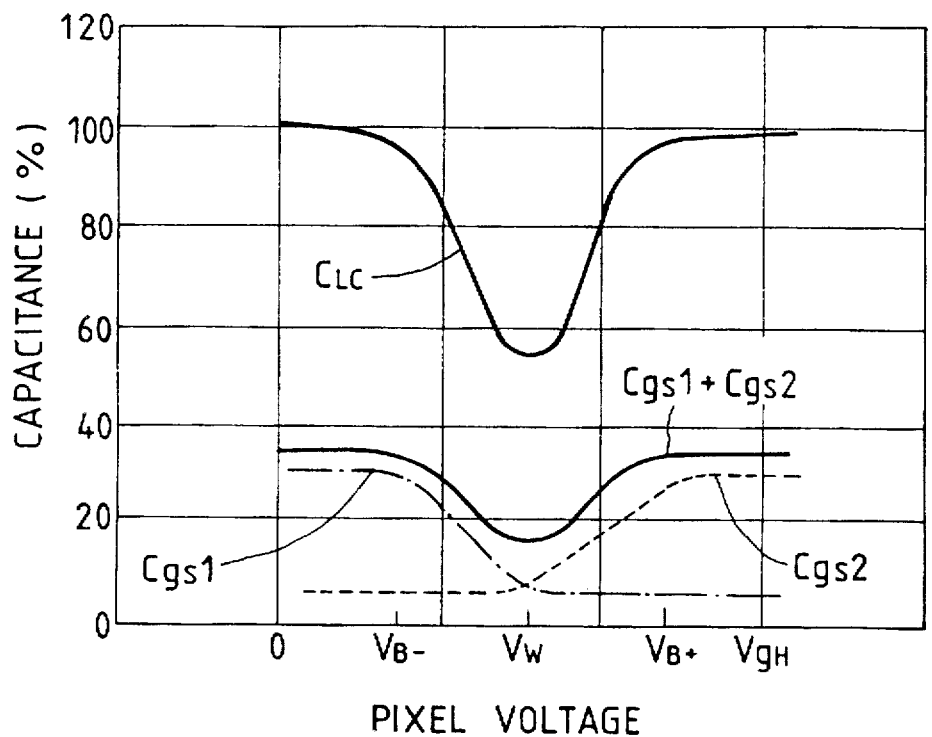
FIG. 42 is a graph showing the composite capacitance characteristic of p-type variable capacitor and n-type variable capacitor.

FIG. 41 is a schematic circuit diagram showing another embodiment of a liquid-crystal display device of active matrix type in accordance with the present invention. The different point from the embodiment shown in FIG. 28 and FIG. 29 is that variable capacitance elements $C_{gsp}$ and $C_{gsn}$ are connected in inverse-parallel relationship between the pixel electrode EP and the scanning signal bus-line $Y_2$ to which the pixel electrode EP is connected through the thin film transistor. The variable capacitance elements $C_{gsp}$ and $C_{gsn}$ have a structure where a channel region is formed with i-type semiconductor, a source region and a drain region are formed with an n-type semiconductor, and and both are constructed in the same manner. The difference is in the bias state due to the inverse-parallel connection in the operating state. One variable capacitance element $C_{gsp}$ is called a P-type variable capacitance element, and the other variable capacitance element $C_{gsn}$ is called an N-type variable capacitance element. By connecting the P-type variable capacitance element $C_{gsp}$ and the N-type variable capacitance element $C_{gsp}$ in parallel, the combined characteristic $(C_{gsp}+C_{gsn})$ shown in FIG. 42 is obtained. The characteristic can be made the same as the characteristic of the liquid-crystal capacitance $C_{LC}$. Thereby, the following effect can be obtained. That is, voltage drop in the pixel electrode (field through voltage) due to operation of gate voltage $V_g$ is changed by the voltage difference of the writing voltage $V_{EP}$ to the pixel electrode EP and the voltage of the counter electrode EC which is normally constant. Therefore, direct current flows in the liquid-crystal of pixel when the voltage of pixel electrode changes due to image information. Thereby, there occurs a residual image which is a phenomenon that the former image is not eliminated after rewriting. The residual image is caused by the facts that the field through voltage is determined by the following equation using the ratio of the parasitic capacity $C_{gso}$ of the thin film transistor and the liquid crystal capacitance $C_{LC}$, and that the liquid-crystal capacitance $C_{LC}$ shows the characteristic shown in FIG. 42 depending on the voltage applied to the liquid-crystal.

$$dV_s = \frac{C_{gs} \times V_g}{C_{add} \times C_{LC}(V_{EP}) + C_{gso}} \quad \text{(Equation 1)}$$

According to the embodiment, since it is possible to make the combined capacitance characteristic $(C_{gsp}+C_{gsn})$ nearly proportional to $C_{LC}$, the field through voltage can be kept constant independent of image information, and degradation in the display image, such as the residual image, is eliminated.

Especially when the combined capacitance characteristic $(C_{gsp}+C_{gsn})$ is set as to satisfy the following equation, the residual image does not appear.

$$C_{gsp} + C_{gsn} = \frac{C_{gso}}{C_{add}} \times C_{LC}(V_{EP}) \quad \text{(Equation 2)}$$

And the field through voltage $dV_s$ becomes always constant as shown in the following equation.

$$dV_s = \frac{C_{gso}}{C_{add}} \times V_g \quad \text{(Equation 3)}$$

Figure 44:
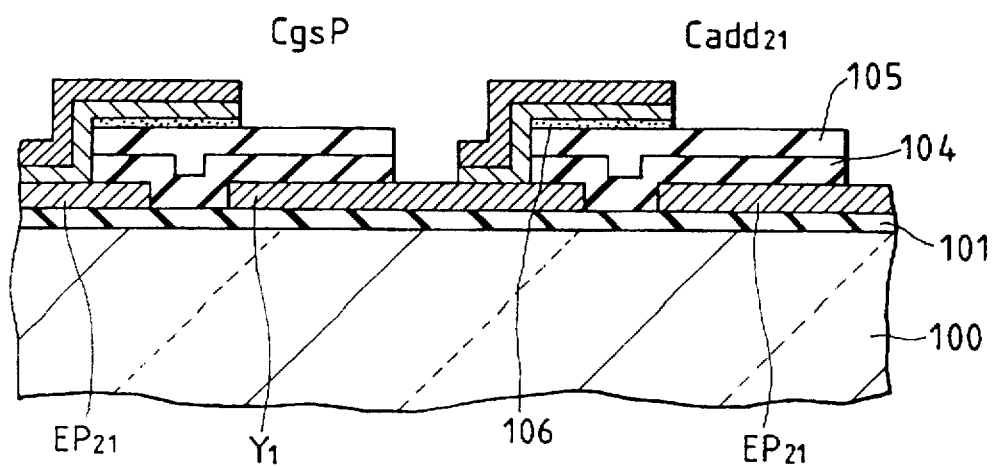
FIG. 44 is a cross-sectional view being taken on the plane of the line XXXXIV—XXXXIV in FIG. 43.
Figure 43:
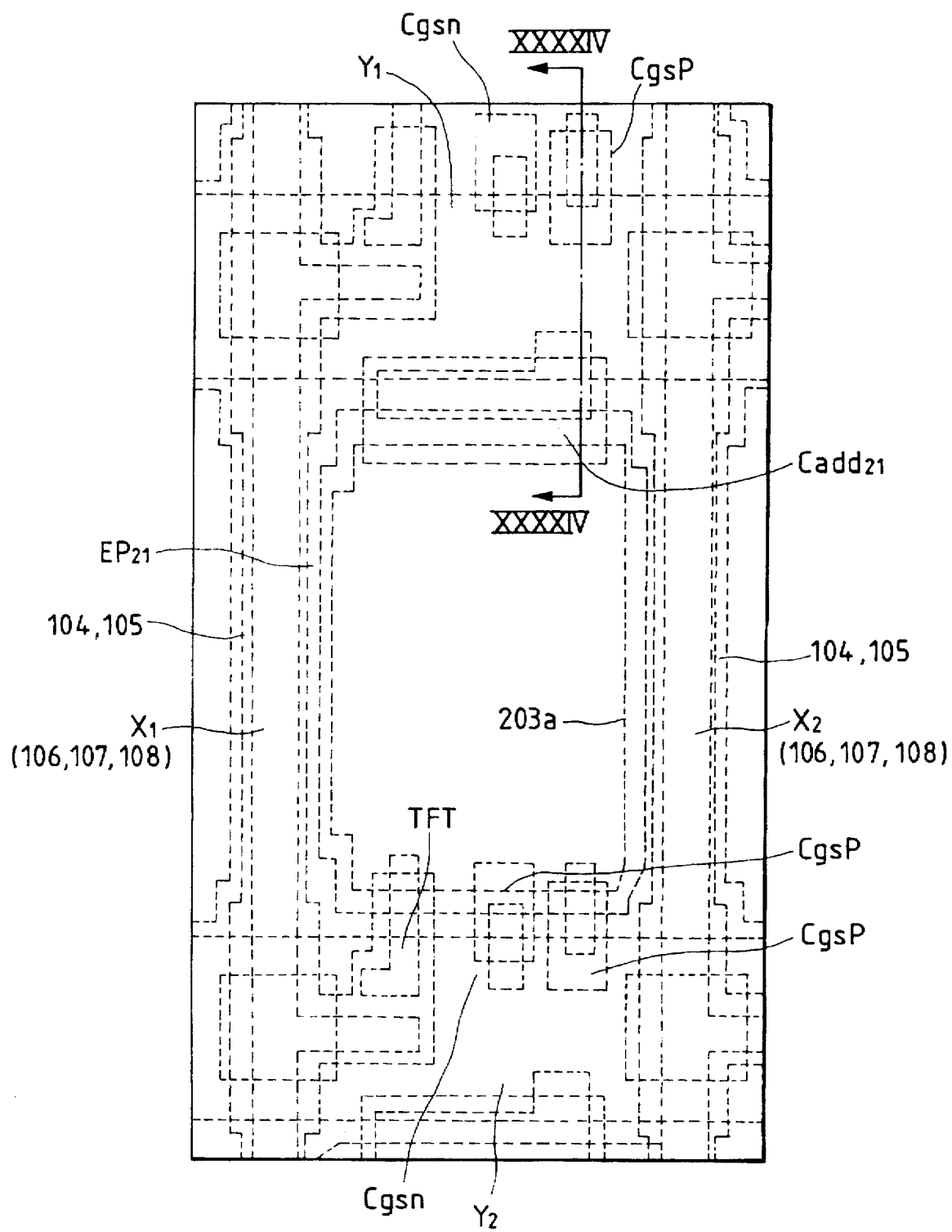
FIG. 43 is a schematic plan view showing an active matrix array used in the liquid-crystal display device shown in FIG. 41.

FIG. 43 is a schematic plan view showing an active matrix array used in the liquid-crystal display device shown in FIG. 41. FIG. 44 is a cross-sectional view being taken on the plane of the line XXXXIV—XXXXIV in FIG. 43. FIG. 43 show the active matrix array in FIG. 30 added with the P-type variable capacitance element $C_{gsp}$ and the N-type variable capacitance element $C_{gsn}$. Among these variable capacitance elements, the P-type variable capacitance element $C_{gsp}$ has the insulating film 104 and the i-type semiconductor layer 105 as the dielectric material, and the n⁺-type semiconductor 106 connected to the pixel electrode EP21 and the scanning signal bus-line $Y_1$ as a pair of electrodes. The N-type variable capacitance element $C_{gsn}$ has the insulating film 104 and the i-type semiconductor layer 105 as the dielectric material, and the n⁺-type semiconductor 106 connected to the scanning signal bus-line $Y_1$ and the pixel electrode EP21. This element has the same structure as $C_{add}$. By constructing both elements, the characteristic shown in FIG. 42 can be obtained. The characteristics of both variable capacitance elements can be adjusted by controlling the thickness and the dielectric constant of the insulating film shown in FIG. 44 or by controlling the over lapping area of the electrodes sandwiching the i-type semiconductor layer 105 and the insulating film 104.

Having described typical embodiments according to the present invention, it is to be understood that the present invention is not limited to the specific embodiments, and modification is, of course, possible In Embodiments 5 to 7, since the capacitance connected to the gate line can be decreased during writing-in, it is possible to make display screen large and resolution high. Further, since the undesirable effects of the parasitic capacitance can be decreased, the quality of display can be improved.

What is claim is:

1. A liquid crystal display device comprising:
a substrate;
a plurality of scanning signal bus-lines formed on the substrate and extending in a first direction,
a plurality of image signal bus-lines formed on the substrate and extending in a second direction intersecting with the scanning signal bus-lines,
thin film transistors located adjacent intersecting points of the scanning signal bus-lines and the image signal bus-lines, wherein gate electrodes of the thin film transistors are connected to the scanning bus-lines, drain electrodes of the thin film transistors are connected to the image signal bus-lines, and source electrodes of the thin film transistors are connected to pixel electrodes to drive a liquid crystal provided in said display, wherein:
patterns of a semiconductor layer are formed over said substrate along said image signal bus-lines,
said image signal bus-lines are formed of a transparent conductive film, a first conductive film, and an impurity containing semiconductor layer,
patterns of said transparent conductive film, said first conductive film, and said impurity containing layer of said image signal bus-lines extend up to said drain electrodes, and
patterns of said semiconductor layer along said image signal bus-lines extend up to said source electrodes.

2. A liquid crystal display device comprising:
a substrate;
a plurality of scanning signal bus-lines formed on the substrate,
a plurality of image signal bus-lines formed on the substrate so as to intersect with the scanning signal bus-lines,
thin film transistors located adjacent intersecting points of the scanning signal bus-lines and the image signal bus-lines, wherein gate electrodes of the thin film transistors are connected to the scanning bus-lines, drain electrodes of the thin film transistors are connected to the image signal bus-lines, and source electrodes of the thin film transistors are connected to pixel electrodes to drive a liquid crystal provided in said display, wherein:
patterns of a semiconductor layer are formed over said substrate along said image signal bus-lines,
said image signal bus-lines comprise a transparent conductive film, a silicide film, and an impurity containing semiconductor layer,
patterns of said transparent conductive film, said silicide film, and said impurity containing layer of said image signal bus-lines extend up to said drain electrodes, and
patterns of said semiconductor layer along said image signal bus-lines extend up to said source electrodes.

3. A liquid crystal display device comprising:
a substrate,
a plurality of scanning signal bus-lines formed on the substrate,
a plurality of image signal bus-lines formed on the substrate so as to intersect with the scanning signal bus-lines,
thin film transistors located adjacent intersecting points of the scanning signal bus-lines and the image signal bus-lines, wherein gate electrodes of the thin film transistors are connected to the scanning bus-lines, drain electrodes of the thin film transistors are connected to the image signal bus-lines, and source electrodes of the thin film transistors are connected to pixel electrodes to drive a liquid crystal provided in said display, wherein:
patterns of a semiconductor layer and an insulator layer are formed over said substrate along said image signal bus-lines,
said image signal bus-lines are formed of a transparent conductive film, a first conductive layer or a silicide film, an impurity containing semiconductor layer, and a conductive layer,
patterns of said transparent conductive film, said first conductive layer or said silicide film, and said impurity containing semiconductor layer extend up to said drain electrodes,
patterns of said semiconductor layer and said insulator layer extend up to said source electrodes, and
island shape patterns of said conductive layer are formed between the adjacent scanning signal bus-lines, wherein said transparent conductive film of said image signal bus-lines and said conductive layer sandwich at least said insulator layer and said semiconductor layer, and are electrically connected to each other.

4. A liquid crystal display device according to claim 1, 2 or 3, wherein said first conductive film or said silicide film is located between said impurity containing semiconductor layer and said transparent conductive layer.

5. A liquid crystal display device according to claim 4, wherein an inclining angle of pattern edge surfaces of said semiconductor layer is not larger than that of pattern edge surfaces of said insulator layer.

6. A liquid crystal display device according to claim 1, 2 or 3, wherein each of said pixel electrodes is formed of a transparent conductive film, said transparent conductive film being formed of a same layer as of said transparent conductive film of said image signal bus-lines, and patterns of said pixel electrodes extend up to said source electrodes.

7. A liquid crystal display device according to claim 1, 2 or 3, wherein said first conductive film is formed of Mo, Cr, Ti, Ta, W, or a composite of these, or said silicide film is $MoSi_x$, $CrSi_x$, $TiSi_x$, $TaSi_x$, $WSi_x$, or a composite of these.

8. A liquid crystal display device according to claim 1, 2 or 3, wherein said thin film transistors are arranged in a reverse stagger structure.

9. A liquid crystal display device according to claim 1, 2 or 3, wherein said scanning signal bus-lines are coated with an anodic oxide film.

10. A liquid crystal display device comprising:
a substrate,
a plurality of scanning signal bus-lines formed on the substrate,
a plurality of image signal bus-lines formed on the substrate so as to intersect with the scanning signal bus-lines,
thin film transistors located adjacent intersecting points of the scanning signal bus-lines and the image signal bus-lines, wherein gate electrodes of the thin film transistors are connected to the scanning bus-lines, drain electrodes of the thin film transistors are connected to the image signal bus-lines, and source electrodes of the thin film transistors are connected to pixel electrodes to drive a liquid crystal provided in said display, wherein:

patterns of a semiconductor layer and an insulator layer are formed over said substrate along said image signal bus-lines, said image signal bus-lines are formed of a transparent conductive film, a first conductive layer or a silicide film, an impurity containing semiconductor layer, and a conductive layer, patterns of said transparent conductive film, said first conductive layer or said silicide film, and said impurity containing semiconductor layer extend up to said drain electrodes, patterns of said semiconductor layer and said insulator layer extend up to said source electrodes, and island shape patterns of said conductive layer are formed between the adjacent scanning signal bus-lines, wherein said transparent conductive film of said image signal bus-lines and said conductive layer sandwich at least said insulator layer and said semiconductor layer, and are electrically connected to each other.

11. A method of manufacturing a liquid crystal display device comprising a thin film transistor substrate, wherein the method of manufacturing the thin film transistor substrate comprises:

patterning a conductive film to form scanning signal bus-lines and gate electrodes on the substrate by means of a first photo-treatment process;

successively forming a gate insulating layer, a semiconductor layer, and an impurity containing semiconductor layer on the substrate, the scanning signal bus-lines and the gate electrodes;

successively patterning the impurity containing semiconductor layer, the semiconductor layer, and the gate insulating layer by means of a second photo-treatment process, wherein patterns of the impurity containing semiconductor layer, the semiconductor layer, and the gate insulating layer have substantially an identical pattern;

forming a first metal layer, forming a silicide film by heat-reacting the first metal layer with semiconductor material, and then etching a non-reacted portion of the first metal layer without a mask;

forming a transparent conductive film;

patterning the transparent conductive film to form image signal bus-lines, pixel electrodes, the drain electrodes and the source electrodes by means of a third photo-treatment process, wherein patterns of the transparent conductive film extend from the image signal bus-lines to the drain electrodes, and from the pixel electrodes to the source electrodes, respectively; and etching the silicide film and the impurity containing semiconductor layer with the patterns of the transparent conductive film as a mask wherein the outer edges of the patterns of the silicide film, the impurity containing semiconductor layer, and the transparent conductive layer in the thin film transistors have substantially an identical pattern.

12. A method of manufacturing a liquid crystal display device comprising a thin film transistor substrate, wherein the method of manufacturing the thin film transistor substrate comprises:

patterning a conductive film to form scanning signal bus-lines and gate electrodes on the substrate by means of a first photo-treatment process;

successively forming a gate insulating layer, a semiconductor layer, an impurity containing semiconductor layer, and a first metal layer on the substrate, the scanning signal bus-lines and the gate electrodes;

forming a silicide film by heat-reacting the first metal layer with the impurity containing semiconductor layer;

successively patterning the first metal layer, the silicide film, the impurity containing semiconductor layer, the semiconductor layer, and the gate insulating layer by means of a second photo-treatment process, and then etching a non-reacted portion of the first metal layer without a mask, wherein patterns of the silicide layer, the impurity containing semiconductor layer, the semiconductor layer, and the gate insulating layer have substantially an identical pattern;

forming a transparent conductive film;

patterning the transparent conductive film to form image signal bus-lines, pixel electrodes, the drain electrodes and the source electrodes by means of a third photo-treatment process, wherein patterns of the transparent conductive film extend from the image signal bus-lines to the drain electrodes, and from the pixel electrodes to the source electrodes, respectively; and etching the silicide film and the impurity containing semiconductor layer with the patterns of the transparent conductive film as a mask, wherein the outer edges of the patterns of the silicide film, the impurity containing semiconductor layer, and the transparent layer in the thin film transistors have substantially an identical pattern.

13. A method of manufacturing a liquid crystal display device comprising a thin film transistor substrate, wherein the method of manufacturing the thin film transistor substrate comprises:

patterning a conductive film to form scanning signal bus-lines and gate electrodes on the substrate by means of a first photo-treatment process;

successively forming a gate insulating layer, a semiconductor layer, an impurity containing semiconductor layer, and a first metal layer on the substrate, the scanning signal bus-lines and the gate electrodes;

successively patterning the first metal layer, the impurity containing semiconductor layer, the semiconductor layer, and the gate insulating layer by means of a second photo-treatment process, wherein patterns of the first metal layer, the impurity containing semiconductor layer, the semiconductor layer, and the gate insulating layer have substantially an identical pattern;

forming a transparent conductive film;

patterning the transparent conductive film to form the image signal bus-lines, pixel electrodes, the drain electrodes and the source electrodes by means of a third photo-treatment process, wherein patterns of the transparent conductive film extend from the image signal bus-lines to the drain electrodes, and from the pixel electrodes to the source electrodes, respectively; and etching the first metal layer with the patterns of the transparent conductive film as a mask; and etching the impurity containing semiconductor layer with the patterns of the transparent conductive film as a mask, wherein the outer edges of the patterns of the first metal layer, the impurity containing semiconductor layer, and the transparent conductive layer in the thin film transistors have substantially an identical pattern.

14. A method of manufacturing a liquid crystal display device according to claims 11, 12 or 13, the method further comprising:

dry etching the impurity containing semiconductor layer, the semiconductor layer, and the gate insulating layer, and wet etching the conductive film, the first conductive layer, and the transparent conductive layer.

15. A method of manufacturing a liquid crystal display device according to claims 11, 12 or 13, the method comprising further anodizing upper and end side surfaces of the conductive film after patterning.

16. A method of manufacturing a liquid crystal display device according to claims 11, 12 or 13, the method further comprising:

forming a protecting film and patterning the protecting film by means of a fourth photo-treatment process, wherein the patterns of the protecting film are in an area excluding at least central portions of the pixel electrodes, terminal portions connecting to an external circuit in end portions of the scanning signal bus-lines and terminal portions connecting to an external circuit in end portions of the image signal bus-lines.

17. A method of manufacturing a liquid crystal display device according to claims 11, 12 or 13, the method comprising:

further patterning a conductive film to form island shape patterns between the scanning signal bus-lines by means of a photo-treatment process; and further patterning the transparent conductive film, wherein patterns of the transparent conductive film of the image signal bus-lines are electrically connected to the island shape patterns.

* * * * *